United States Patent
Xu et al.

(10) Patent No.: US 12,347,354 B2
(45) Date of Patent: *Jul. 1, 2025

(54) SHIFT REGISTER UNIT, METHOD FOR DRIVING THE SAME, DRIVING CIRCUIT AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Yingsong Xu, Beijing (CN); Zhenhua Zhang, Beijing (CN); Qian Ma, Beijing (CN); Xilei Cao, Beijing (CN); Changlong Yuan, Beijing (CN); Jingyi Feng, Beijing (CN); Weiyun Huang, Beijing (CN); Benlian Wang, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 0 days.

This patent is subject to a terminal disclaimer.

(21) Appl. No.: 18/423,236

(22) Filed: Jan. 25, 2024

(65) Prior Publication Data

US 2024/0161673 A1    May 16, 2024

Related U.S. Application Data

(63) Continuation of application No. 17/598,790, filed as application No. PCT/CN2020/123206 on Oct. 23, 2020, now Pat. No. 11,922,845.

(51) Int. Cl.
  *G09G 3/20* (2006.01)
  *G11C 19/28* (2006.01)

(52) U.S. Cl.
  CPC .......... *G09G 3/20* (2013.01); *G11C 19/28* (2013.01); *G09G 2310/0286* (2013.01); *G09G 2310/06* (2013.01)

(58) Field of Classification Search
  CPC .......... G09G 3/20; G09G 2310/0286; G09G 2310/06; G11C 19/28
  See application file for complete search history.

(56) References Cited

U.S. PATENT DOCUMENTS 10,650,733 B2    5/2020    Zhai
11,069,281 B2    7/2021    Feng et al.
(Continued)

FOREIGN PATENT DOCUMENTS

CN    101364392 A    2/2009
CN    104318904 A    1/2015
(Continued)

OTHER PUBLICATIONS

U.S. Appl. No. 17/598,790 non-final office action dated Apr. 7, 2023.
(Continued)

*Primary Examiner* — Towfiq Elahi
(74) *Attorney, Agent, or Firm* — IPro, PLLC

(57) ABSTRACT

The present disclosure provides a shift register unit, a driving method, a driving circuit and a display device. The shift register unit includes a first node potential adjustment circuit, a first tank circuit, a second node control circuit, a second tank circuit, a third node control circuit, a first node control circuit, and an output circuit; the first node potential adjustment circuit changes the potential of the first node according to the adjustment clock signal under the control of the potential of the first node; the first tank circuit is used to maintain the potential of the first node; the third node control circuit controls the potential of the third isolation node and (Continued)

the potential of the fourth node; the second node control circuit controls the potential of the second isolation node.

19 Claims, 25 Drawing Sheets

(56) References Cited

U.S. PATENT DOCUMENTS

| | | |
|---|---|---|
| 2009/0040203 A1 | 2/2009 | Kim et al. |
| 2012/0294411 A1 | 11/2012 | Duan |
| 2016/0329015 A1 | 11/2016 | Ji et al. |
| 2018/0130407 A1* | 5/2018 | Zhai ............... G11C 19/28 |
| 2020/0265877 A1 | 8/2020 | Zheng |
| 2020/0388201 A1 | 12/2020 | Wang et al. |
| 2021/0193007 A1 | 6/2021 | Cheng et al. |
| 2022/0343841 A1 | 10/2022 | Shang et al. |

FOREIGN PATENT DOCUMENTS

| | | |
|---|---|---|
| CN | 110164352 A | 8/2019 |
| CN | 110176204 A | 8/2019 |
| CN | 110689848 A | 1/2020 |
| CN | 110956919 A | 4/2020 |
| CN | 111243650 A | 6/2020 |
| CN | 111508433 A | 8/2020 |
| CN | 111768733 A | 10/2020 |
| KR | 20090005591 A | 1/2009 |

OTHER PUBLICATIONS

U.S. Appl. No. 17/598,790 notice of allowance dated Oct. 27, 2023.
U.S. Appl. No. 17/598,790 notice of allowance dated Nov. 6, 2023.
PCT/CN2020/123206 international search report.
PCT/CN2020/123206 written opinion.

* cited by examiner

SHIFT REGISTER UNIT, METHOD FOR DRIVING THE SAME, DRIVING CIRCUIT AND DISPLAY DEVICE

CROSS-REFERENCE TO RELATED APPLICATION

This application is a continuation of a U.S. patent application Ser. No. 17/598,790 filed on Sep. 27, 2021, which is the U.S. national phase of PCT Application No. PCT/CN2020/123206 filed on Oct. 23, 2020, which is incorporated herein by reference in its entirety.

TECHNICAL FIELD

The present disclosure relates to the field of display technology, in particular to a shift register unit, a driving method, a driving circuit and a display device.

BACKGROUND

The related shift register unit cannot provide both the gate driving signal and the light emitting control signal, and cannot conveniently provide the waveform of the specific pixel operation. In addition, the related shift register unit cannot enable the first output transistor in the output circuit to be turned on fully, so that the output waveform of the driving voltage signal terminal has loss due to the threshold voltage of the first output transistor.

SUMMARY

In a first aspect, the present disclosure provides in some embodiments a shift register unit, including a first node potential adjustment circuit, a first tank circuit, a second node control circuit, a second tank circuit, a third node control circuit, a first node control circuit and an output circuit, wherein the first node control circuit is electrically connected to an input terminal, a first clock signal terminal, a first isolation node, a fourth node, and a first voltage terminal, respectively, is configured to control to write an input signal provided by the input terminal to the first isolation node under the control of a first clock signal provided by the first clock signal terminal, and control to write a first voltage signal provided by the first voltage terminal to the first isolation node under the control of a potential of the fourth node; the first node potential adjustment circuit is respectively electrically connected to an adjustment clock signal terminal and a first node, and is configured to change a potential of the first node according to an adjustment clock signal provided by the adjustment clock signal terminal under the control of the potential of the first node; the first tank circuit is electrically connected to the first node, and is configured to maintain the potential of the first node; the third node control circuit is electrically connected to the first clock signal terminal, a second clock signal terminal, the first isolation node, a third isolation node, the fourth node, the first voltage terminal, and a second voltage terminal, respectively, is configured to control a potential of the third isolation node and the potential of the fourth node under the control of the first clock signal, the second clock signal and a potential of the first isolation node; the second node control circuit is electrically connected to the first isolation node, the first voltage terminal, a second isolation node, a control clock signal terminal, and a third node, respectively, is configured to control a potential of the second isolation node under the control of a potential of the third node and a control clock signal provided by the control clock signal terminal, and control to write the first voltage signal provided by the first voltage terminal to the second isolation node under the control of the potential of the first isolation node; the second tank circuit is configured to maintain a potential of the second node; the output circuit is electrically connected to the first node, the second voltage terminal, a driving voltage signal terminal, and a third voltage terminal, respectively, and is configured to control to write the second voltage signal provided by the second voltage terminal to a driving voltage signal output terminal under the control of the potential of the first node, and configured to write a third voltage signal provided by the third voltage terminal into the driving voltage signal terminal under the control of the potential of the second node; and the first isolated node and the first node are the same node; or, the first isolated node and the first node are different nodes.

Optionally, when the first isolation node and the first node are different nodes, the first isolation node and the first node are electrically connected through a first isolation circuit; a control terminal of the first isolation circuit is electrically connected to the control voltage terminal, and the first isolation circuit is used to control to connect the first isolation node and the first node under the control of the control voltage signal provided by the control voltage terminal.

Optionally, the first isolation circuit may include a first isolation transistor; a control electrode of the first isolation transistor is electrically connected to the control voltage terminal, a first electrode of the first isolation transistor is electrically connected to the first isolation node, and a second electrode of the first isolation transistor is electrically connected to the first node.

Optionally, the second isolation node and the second node are the same node; or, the second isolation node and the second node are electrically connected through a second circuit, a control terminal of the second isolation circuit is electrically connected to the control voltage terminal, and the second isolation circuit is used to control to connect the second isolation node and the second node under the control of the control voltage signal provided by the control voltage terminal.

Optionally, the second isolation circuit comprises a second isolation transistor; a control electrode of the second isolation transistor is electrically connected to the control voltage terminal, a first electrode of the second isolation transistor is electrically connected to the second isolation node, and a second electrode of the second isolation transistor is electrically connected to the second node.

Optionally, the third isolation node and the third node are the same node; or, the third isolation node and the third node are electrically connected through a third isolation circuit, a control terminal of the third isolation circuit is electrically connected to the control voltage terminal, and the third isolation circuit is used to control to connect the third isolation node and the third node under the control of the control voltage signal provided by the control voltage terminal.

Optionally, the third isolation circuit may include a third isolation transistor, a control electrode of the third isolation transistor is electrically connected to the control voltage terminal, a first electrode of the third isolation transistor is electrically connected to the third isolation node, and a second electrode of the third isolation transistor is electrically connected to the third node.

Optionally, the control clock signal terminal is the second clock signal terminal; or the driving voltage signal terminal is a light emitting control signal terminal, and the control clock signal terminal is the first clock signal terminal.

Optionally, the adjustment clock signal provided by the adjustment clock signal terminal is the second clock signal, or the adjustment clock signal is a clock signal that is inverted in phase from the first clock signal.

Optionally, the driving voltage signal terminal is a gate driving signal output terminal, the third voltage terminal is an output clock signal terminal; an output clock signal provided by the output clock signal terminal is a clock signal that is inverted in phase from the second clock signal; or the driving voltage signal terminal is a light emitting control signal terminal, and the third voltage terminal is the first voltage terminal.

Optionally, the first node potential adjustment circuit includes an adjustment transistor and an adjustment capacitor, wherein a control electrode of the adjustment transistor is electrically connected to the first isolation node, a first electrode of the adjustment transistor is electrically connected to the adjustment clock signal terminal, and a second electrode of the adjustment transistor is electrically connected to a first end of the adjustment capacitor, a second end of the adjustment capacitor is electrically connected to the first isolation node.

Optionally, the second node control circuit is further electrically connected to the first clock signal terminal, and is configured to control the potential of the second isolation node under the control of the first clock signal.

Optionally, the second node control circuit includes a first control transistor, a control capacitor, a second control transistor, and a third control transistor, wherein, a first end of the control capacitor is electrically connected to the third node, and a second end of the control capacitor is electrically connected to a fifth node, a control electrode of the first control transistor is electrically connected to the third node, a first electrode of the first control transistor is electrically connected to the fifth node, and a second electrode of the first control transistor is electrically connected to the control clock signal terminal; a control electrode of the second control transistor is electrically connected to the second clock signal terminal, a first electrode of the second control transistor is electrically connected to the fifth node, and a second electrode of the second control transistor is electrically connected to the second isolation node; a control electrode of the third control transistor is electrically connected to the first node, a first electrode of the third control transistor is electrically connected to the first voltage terminal, and a second electrode of the third control transistor is electrically connected to the second isolation node.

Optionally, the second node control circuit includes a first control transistor, a control capacitor, a second control transistor, a third control transistor, and a node control transistor, a first end of the control capacitor is electrically connected to the third node, and a second end of the control capacitor is electrically connected to a fifth node; a control electrode of the first control transistor is electrically connected to the third node, a first electrode of the first control transistor is electrically connected to the fifth node, and a second electrode of the first control transistor is electrically connected to the control clock signal terminal; a control electrode of the second control transistor is electrically connected to the second clock signal terminal, a first electrode of the second control transistor is electrically connected to the fifth node, and a second electrode of the second control transistor is electrically connected to the second isolation node; a control electrode of the third control transistor is electrically connected to the first node, and a first electrode of the third control transistor is electrically connected to the first voltage terminal; a control electrode of the node control transistor is electrically connected to the first clock signal terminal, a first electrode of the node control transistor is electrically connected to the second electrode of the third control transistor, and a second electrode of the node control transistor is electrically connected to the second node.

Optionally, the second node control circuit may include a first control transistor, a control capacitor, a second control transistor, and a third control transistor, a first end of the control capacitor is electrically connected to the third node; a control electrode of the first control transistor is electrically connected to the third node, a first electrode of the first control transistor is electrically connected to a second end of the control capacitor, and a second electrode of the first control transistor is electrically connected to the second clock signal terminal; a control electrode of the second control transistor is electrically connected to the second clock signal terminal, a first electrode of the second control transistor is electrically connected to the second isolation node; a control electrode of the third control transistor is electrically connected to the first isolation node, a first electrode of the third control transistor is electrically connected to the first voltage terminal, and a second electrode of the third control transistor is electrically connected to the second isolation node.

Optionally, the third node control circuit includes a fourth control transistor, a fifth control transistor, and a sixth control transistor, a control electrode of the fourth control transistor is electrically connected to the first clock signal terminal, a first electrode of the fourth control transistor is electrically connected to the second voltage terminal, and a second electrode of the fourth control transistor is electrically connected to the third isolation node; a control electrode of the fifth control transistor is electrically connected to the first isolation node, a first electrode of the fifth control transistor is electrically connected to the first voltage terminal, and a second electrode of the fifth control transistor is electrically connected to the fourth node, a control electrode of the sixth control transistor is electrically connected to the second clock signal terminal, a first electrode of the sixth control transistor is electrically connected to the fourth node, and a second electrode of the sixth control transistor is electrically connected to the third isolation node.

Optionally, the shift register unit further includes a third isolation transistor; the third isolation node is the third node; the second electrode of the fourth control transistor is electrically connected to the third node through the third isolation transistor; a control electrode of the third isolation transistor is electrically connected to the control voltage terminal, a first electrode of the third isolation transistor is electrically connected to the second electrode of the fourth control transistor, and a second electrode of the third isolation transistor is electrically connected to the third node.

Optionally, the driving voltage signal terminal is a light emitting control signal terminal, and the third voltage terminal is the first voltage terminal; the third node control circuit includes a fourth control transistor, a fifth control transistor, and a sixth control transistor, a control electrode of the fourth control transistor is electrically connected to the second clock signal terminal, a first electrode of the fourth control transistor is electrically connected to the second voltage terminal, and a second electrode of the fourth control transistor is electrically connected to the third isolation node; a control electrode of the fifth control transistor is electrically connected to the first isolation node, a first electrode of the fifth control transistor is electrically connected to the first voltage terminal, and a second electrode of the fifth control transistor is electrically connected to the fourth node; a control electrode of the sixth control transistor is electrically connected to the first clock signal terminal, a first electrode of the sixth control transistor is electrically connected to the fourth node, and a second electrode of the sixth control transistor is electrically connected to the third isolation node.

Optionally, the shift register unit further includes a third isolation transistor; wherein the third isolation node is the third node; the second electrode of the fourth control transistor is electrically connected to the third node through the third isolation transistor; a control electrode of the third isolation transistor is electrically connected to the control voltage terminal, a first electrode of the third isolation transistor is electrically connected to the second electrode of the fourth control transistor, and a second electrode of the third isolation transistor is electrically connected to the third node.

Optionally, the first node control circuit includes a seventh control transistor and an eighth control transistor, a control electrode of the seventh control transistor is electrically connected to the first clock signal terminal, a first electrode of the seventh control transistor is electrically connected to the input terminal, and a second electrode of the seventh control transistor is electrically connected to the first isolation node; a control electrode of the eighth control transistor is electrically connected to the fourth node, a first electrode of the eighth control transistor is electrically connected to the first isolation node, and a second electrode of the eighth control transistor is electrically connected to the first voltage terminal.

Optionally, the output circuit includes a first output transistor and a second output transistor; a control electrode of the first output transistor is electrically connected to the first node, a first electrode of the first output transistor is electrically connected to the second voltage terminal, and a second electrode of the first output transistor is electrically connected to the driving voltage signal terminal; a control electrode of the second output transistor is electrically connected to the second node, a first electrode of the second output transistor is electrically connected to the driving voltage signal terminal, and a second electrode of the second output transistor is electrically connected to the third voltage terminal.

Optionally, the first tank circuit includes a first storage capacitor, and the second tank circuit includes a second storage capacitor; a first end of the first storage capacitor is electrically connected to the first node, and a second end of the first storage capacitor is electrically connected to the second voltage end; a first end of the second storage capacitor is electrically connected to the second node, and a second end of the second storage capacitor is electrically connected to the third voltage end, the driving voltage signal terminal is a gate driving signal output terminal, and the third voltage terminal is an output clock signal terminal; an output clock signal provided by the output clock signal terminal is a clock signal that is inverted from the second clock signal; or the driving voltage signal terminal is a light emitting control signal terminal, and the third voltage terminal is the first voltage terminal.

In a second aspect, a driving method applied to the shift register unit and includes: controlling, by the first node control circuit, to write the input signal to the first isolation node under the control of the first clock signal, write the first voltage signal to the first isolation node under the control of the potential of the fourth node; changing, by the first node potential adjustment circuit, the potential of the first node according to the adjustment clock signal under the control of the potential of the first node; maintaining, by a the first tank circuit, the potential of the first node; controlling, by the third node control circuit, the potential of the third isolation node and the potential of the fourth node under the control of the first clock signal, the second clock signal, and the potential of the first isolation node; controlling, by the second node control circuit, the potential of the second isolation node under the control of the potential of the third node and the control clock signal, and controlling to write the first voltage signal to the second isolation node under the control of the potential of the first isolation node; maintaining, by the second tank circuit, the potential of the second node; writing, by the output circuit, the second voltage signal to the driving voltage signal output terminal under the control of the potential of the first node, and writing the third voltage signal to the driving voltage signal terminal under the control of the potential of the second node.

In a third aspect, a driving circuit includes a plurality of stages of the shift register units.

Optionally, the drive circuit is a gate driving circuit, the driving voltage signal terminal is a gate driving signal output terminal, the third voltage terminal is an output clock signal terminal; the output clock signal provided by the output clock signal terminal is a clock signal which is inverted in phase from the second clock signal.

Optionally, the driving circuit is a light-emitting control signal generating circuit; the driving voltage signal terminal is a light-emitting control signal terminal, and the third voltage terminal is the first voltage terminal.

In a fourth aspect, a display device includes the above driving circuit.

DETAILED DESCRIPTION

Figure 1:
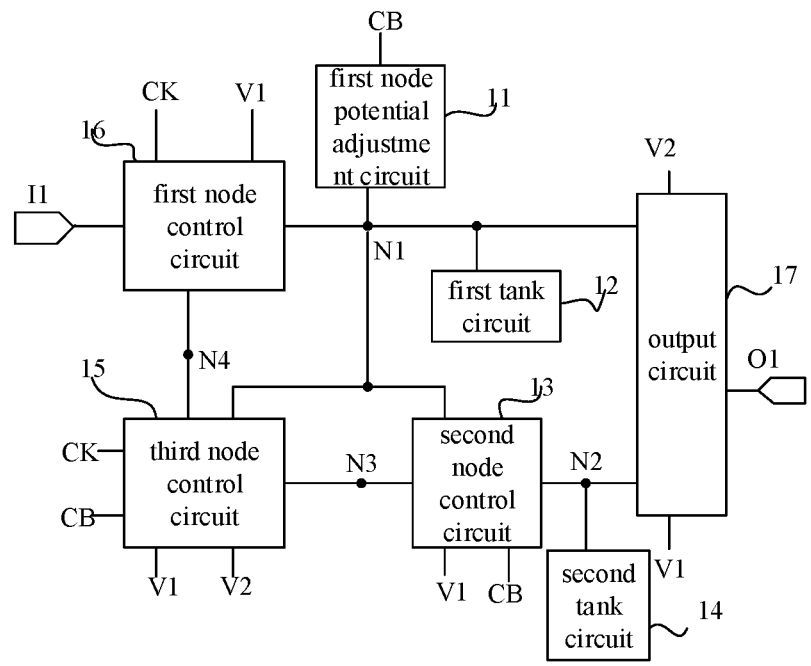
FIG. 1 is a structural diagram of a shift register unit according to at least one embodiment of the present disclosure.

The technical solutions in the embodiments of the present disclosure will be clearly and completely described below in conjunction with the accompanying drawings in the embodiments of the present disclosure. Obviously, the described embodiments are only a part of the embodiments of the present disclosure, rather than all the embodiments. Based on the embodiments in the present disclosure, all other embodiments obtained by those of ordinary skill in the art without creative work shall fall within the protection scope of the present disclosure.

The transistors used in all the embodiments of the present disclosure may be triodes, thin film transistors or field effect transistors or other devices with the same characteristics. In the embodiments of the present disclosure, in order to distinguish the two electrodes of the transistor other than the control electrode, one of the electrodes is called the first electrode, and the other electrode is called the second electrode.

In actual operation, when the transistor is a triode, the control electrode can be a base, the first electrode can be a collector, and the second electrode can be an emitter; or, the control electrode can be a base, the first electrode may be an emitter, and the second electrode may be a collector.

In actual operation, when the transistor is a thin film transistor or a field effect transistor, the control electrode may be a gate electrode, the first electrode may be a drain electrode, and the second electrode may be a source electrode; or the control electrode may be a gate electrode, the first electrode may be a source electrode, and the second electrode may be a drain electrode.

The shift register unit according to at least one embodiment of the present disclosure includes a first node potential adjustment circuit, a first tank circuit, a second node control circuit, a second tank circuit, a third node control circuit, and a first node control circuit and an output circuit.

The first node control circuit is electrically connected to an input terminal, a first clock signal terminal, a first isolation node, a fourth node, and a first voltage terminal, respectively, is configured to control to write an input signal provided by the input terminal to the first isolation node under the control of a first clock signal provided by the first clock signal terminal, and control to write the first voltage signal provided by the first voltage terminal to the first isolation node under the control of a potential of the fourth node.

The first node potential adjustment circuit is respectively electrically connected to an adjustment clock signal terminal and a first node, and is configured to change a potential of the first node according to an adjustment clock signal provided by the adjustment clock signal terminal under the control of the potential of the first node.

The first tank circuit is electrically connected to the first node, and is configured to maintain the potential of the first node.

The third node control circuit is electrically connected to a first clock signal terminal, a second clock signal terminal, a first isolation node, a third isolation node, a fourth node, a first voltage terminal, and a second voltage terminal, respectively, is configured to control a potential of the third isolation node and the potential of the fourth node under the control of the first clock signal, the second clock signal and the potential of the first isolation node.

The second node control circuit is electrically connected to the first isolation node, the first voltage terminal, the second isolation node, the control clock signal terminal, and the third node, respectively, is configured to control the potential of the second isolation node under the control of the potential of the third node and the control clock signal provided by the control clock signal terminal, and control to write the first voltage signal provided by the first voltage terminal to the second isolation node under the control of the potential of the first isolation node.

The second tank circuit is used to maintain the potential of the second node.

The output circuit is electrically connected to the first node, the second voltage terminal, the driving voltage signal terminal, and the third voltage terminal, respectively, and is configured to control to write the second voltage signal provided by the second voltage terminal to a driving voltage signal output terminal under the control of the potential of the first node, and configured to write the third voltage signal provided by the third voltage terminal into the driving voltage signal terminal under the control of the potential of the second node.

The first isolated node and the first node are the same node; or, the first isolated node and the first node are different nodes.

The shift register unit described in at least one embodiment of the present disclosure can provide both a gate driving signal and a light emitting control signal so as to provide a waveform for the operation of a specific pixel; when the shift register unit provides the light emitting control signal, the third voltage terminal may be a first voltage terminal; when the shift register unit provides a gate driving signal, the third voltage terminal may be an output clock signal terminal; the output clock signal provided by the output clock signal terminal is a clock signal that is inverse in phase to the second clock signal. In addition, when the shift register unit according to at least one embodiment of the present disclosure is in operation, the first node potential adjustment circuit is electrically connected to the adjustment clock signal terminal and the first node, and is used to change the potential of the first node according to the adjustment clock signal provided by the adjustment clock signal terminal under the control of the potential of the first node, so that when the first output transistor in the output circuit needs to be turned on, the potential of the first node can reduce to a sufficiently low voltage so that the first output transistor is fully turned on to avoid the problem of the output waveform of the driving voltage signal terminal being affected by the threshold voltage loss of the first output transistor; and the shift register unit described in at least one embodiment of the present disclosure can realize a narrow frame design.

In at least one embodiment of the present disclosure, the first voltage terminal may be a high voltage terminal, and the second voltage terminal may be a low voltage terminal, but it is not limited to this.

The shift register unit described in at least one embodiment of the present disclosure can generate a light emitting control signal or a gate driving signal, but cannot generate the light emitting control signal and the gate driving signal at the same time; when it is necessary to provide both light emitting control signal and gate driving signal, it is necessary to use two shift register units described in at least one embodiment of the present disclosure.

Optionally, when the first isolation node and the first node are different nodes, the first isolation node and the first node are electrically connected through a first isolation circuit;

The control terminal of the first isolation circuit is electrically connected to the control voltage terminal, and the first isolation circuit is used to control to connect the first isolation node and the first node under the control of the control voltage signal provided by the control voltage terminal.

In at least one embodiment of the present disclosure, the first isolated node and the first node may be the same node; or the first isolation node may be electrically connected to the first node through the first isolation circuit, so that when the potential of the first node is pulled too low, the threshold voltage of the transistor whose source electrode or drain electrode are electrically connected to the first node drifts or performance is degraded, so that when the transistor is to be turned on again, it cannot be incompletely turned on, so as to avoid affecting the performance of the shift register unit.

In a specific implementation, the first isolation circuit may include a first isolation transistor; a control electrode of the first isolation transistor is electrically connected to the control voltage terminal, a first electrode of the first isolation transistor is electrically connected to the first isolation node, and a second electrode of the first isolation transistor is electrically connected to the first node.

Optionally, the second isolation node and the second node are the same node; or, the second isolation node and the second node are electrically connected through a second circuit.

The control terminal of the second isolation circuit is electrically connected to the control voltage terminal, and the second isolation circuit is used to control to connect the second isolation node and the second node under the control of the control voltage signal provided by the control voltage terminal.

In at least one embodiment of the present disclosure, the second isolated node and the second node may be the same node; or the second isolation node may be electrically connected to the second node through a second isolation circuit, so that when the potential of the second node is pulled too low, the threshold voltage of the transistor whose source electrode or drain electrode are electrically connected to the second node drifts or performance is degraded, so that when the transistor is to be turned on again, it is turned on incompletely, so as to avoid affecting the performance of the shift register unit.

In specific implementation, the third isolation circuit may include a third isolation transistor; a control electrode of the third isolation transistor is electrically connected to the control voltage terminal, a first electrode of the third isolation transistor is electrically connected to the third isolation node, and a second electrode of the third isolation transistor is electrically connected to the third node.

Optionally, the third isolation node and the third node are the same node; or, the third isolation node and the third node are electrically connected through a third isolation circuit.

The control terminal of the third isolation circuit is electrically connected to the control voltage terminal, and the third isolation circuit is used to control the third isolation node and the third node under the control of the control voltage signal provided by the control voltage terminal.

In at least one embodiment of the present disclosure, the third isolated node and the third node may be the same node; or the third isolation node may be electrically connected to the third node through the third isolation circuit, so that when the potential of the third node is pulled too low, the threshold voltage of the transistor whose source electrode or drain electrode is electrically connected to the third node drifts or the performance is degraded, so that when the transistor is to be turned on, it is turned on incompletely, so as to avoid affecting the performance of the shift register unit.

In specific implementation, the third isolation circuit may include a third isolation transistor. A control electrode of the third isolation transistor is electrically connected to the control voltage terminal, a first electrode of the third isolation transistor is electrically connected to the third isolation node, and a second electrode of the third isolation transistor is electrically connected to the third node.

Optionally, the control clock signal terminal may be a second clock signal terminal; or the driving voltage signal terminal is a light emitting control signal terminal, and the control clock signal terminal may be a first clock signal terminal.

In specific implementation, the adjustment clock signal provided by the adjustment clock signal terminal is the second clock signal, or the adjustment clock signal is a clock signal that is inverted in phase from the first clock signal.

In at least one embodiment of the present disclosure, the driving voltage signal terminal is a gate driving signal output terminal, the third voltage terminal is an output clock signal terminal; the output clock signal provided by the output clock signal terminal is a clock signal that is inverted in phase from the second clock signal; or the driving voltage signal terminal is a light emitting control signal terminal, and the third voltage terminal is a first voltage terminal.

As shown in FIG. 1, the shift register unit according to at least one embodiment of the present disclosure includes a first node potential adjustment circuit 11, a first tank circuit 12, a second node control circuit 13, a second tank circuit 14, a third node control circuit 15, the first node control circuit 16, and the output circuit 17.

The first node control circuit 16 is electrically connected to the input terminal I1, the first clock signal terminal CK, the first node N1, the fourth node N4, and the first voltage terminal V1, respectively, and is configured to write the input signal provided by the input terminal I1 to the first node N1 under the control of the first clock signal provided by the first clock signal terminal CK, and control to write the first voltage signal provided by the first voltage terminal V1 to the first node N1 under the control of the potential of the fourth node N4.

The first node potential adjustment circuit 11 is electrically connected to the second clock signal terminal CB and the first node N1, respectively, is configured to change the potential of the first node N1 according to the second clock signal provided by the second clock signal terminal CB under the control of the potential of the first node N1.

The first tank circuit 12 is electrically connected to the first node N1, and is used to maintain the potential of the first node N1.

The third node control circuit 15 is respectively connected to the first clock signal terminal CK, the second clock signal terminal CB, the first node N1, the third node N3, the fourth node N4, the first voltage terminal V1 and the second voltage terminal V2, is configured to control the potentials of the third node N3 and the potential of the fourth node N4 under the control of potentials of the first clock signal, the second clock signal and the potential of the first node N1.

The second node control circuit 13 is electrically connected to the first node N1, the first voltage terminal V1, the second node N2, the second clock signal terminal CB, and the third node N3, respectively, is configured to control the potential of the second node N2 under the control of the potential of the third node N3 and the second clock signal, and control to write the first voltage signal provided by the first voltage terminal V1 to the second node N2 under the control of the potential of the first node N1.

The second tank circuit 14 is electrically connected to the second node N2, and is used to maintain the potential of the second node N2.

The output circuit 17 is electrically connected to the first node N1, the second voltage terminal V2, the driving voltage signal terminal O1, and the first voltage terminal V1, respectively, is used to write the second voltage signal provided by the second voltage terminal V2 to the driving voltage signal output terminal O1 under the control of the potential of the first node N1, and is used to write the first voltage signal provided by the first voltage terminal V1 to the driving voltage signal terminal under the control of the potential of the second node N2.

In the shift register unit shown in FIG. 1, the first isolation node and the first node are the same node, the second isolation node and the second node are the same node, and the third isolation node and the third node are the same node, but not limited to this.

In the shift register unit shown in FIG. 1, the third voltage terminal is the first voltage terminal, the shift register unit shown in FIG. 1 is used to generate light-emitting control signals, and the shift register unit shown in FIG. 1 is the shift register unit in the light emitting control signal generating circuit.

In the shift register unit shown in FIG. 1, the control clock signal terminal is the second clock signal terminal, and the adjustment clock signal terminal is the second clock signal terminal.

In specific implementation, when the shift register unit is the shift register unit in the light emitting control generating circuit, the second node control circuit may be further electrically connected to the first clock signal terminal, and is also used to control the potential of the second isolation node under the control of the first clock signal.

Figure 2:
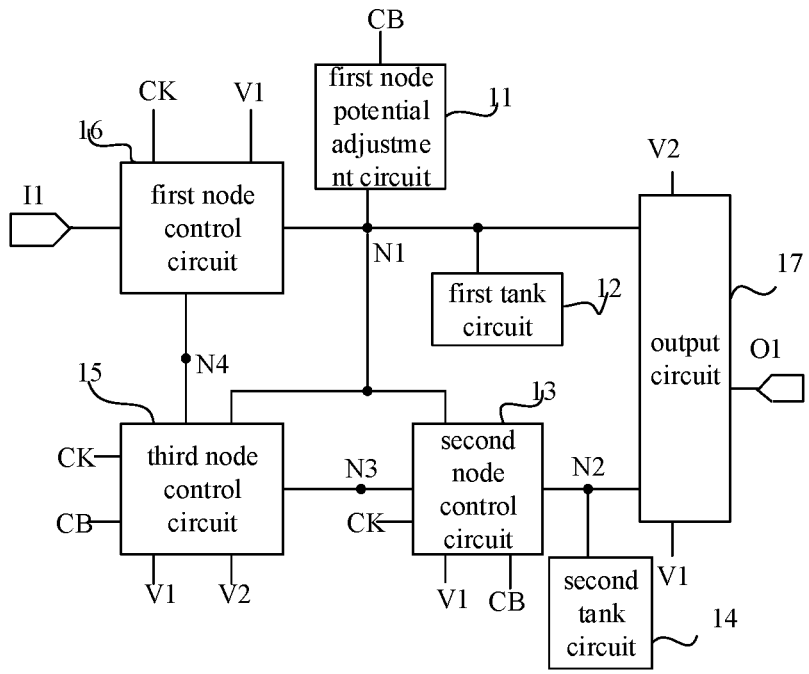
FIG. 2 is a structural diagram of a shift register unit according to at least one embodiment of the present disclosure.

As shown in FIG. 2, on the basis of the embodiment of the shift register unit shown in FIG. 1, the second node control circuit 13 is also electrically connected to the first clock signal terminal CK, and is also used to control the potential of the second node N2 is controlled under the control of the first clock signal terminal CK.

Figure 3:
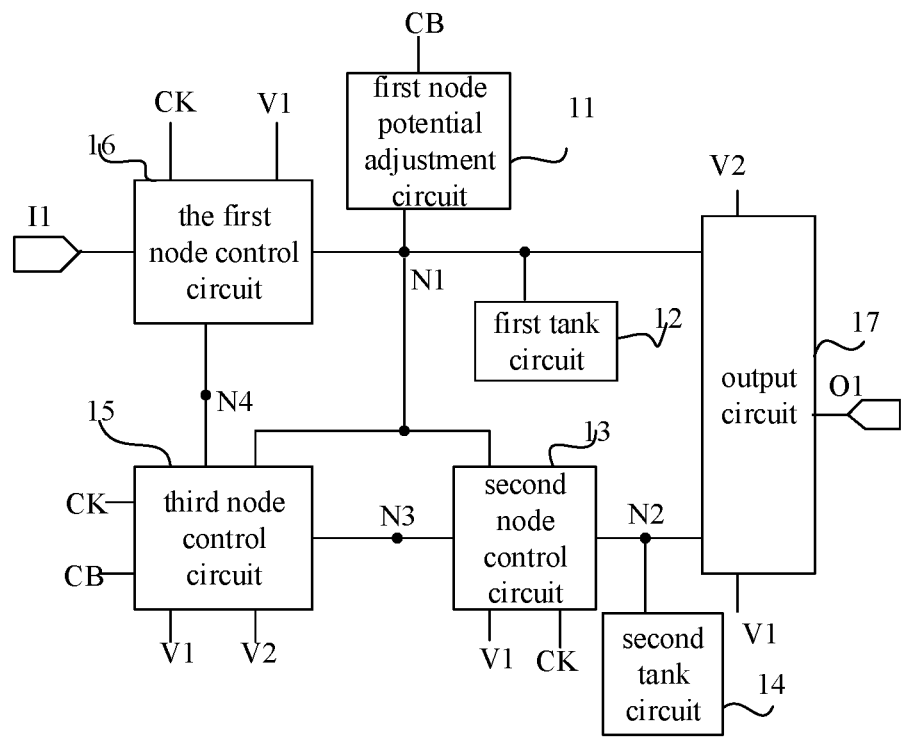
FIG. 3 is a structural diagram of a shift register unit according to at least one embodiment of the present disclosure.

As shown in FIG. 3, the shift register unit shown in FIG. 3 is different from the shift register unit shown in FIG. 1 in that: the control clock signal terminal is the first clock signal terminal CK.

The second node control circuit 13 is electrically connected to the first node N1, the first voltage terminal V1, the second node N2, the first clock signal terminal CK, and the third node N3, respectively, and is used to control the potential of the second node N2 under the control of the potential of the third node N3 and the first clock signal, and control to write the first voltage signal provided by the first voltage terminal V1 to the second node N2 under the control of the potential of the first node N1.

Figure 4:
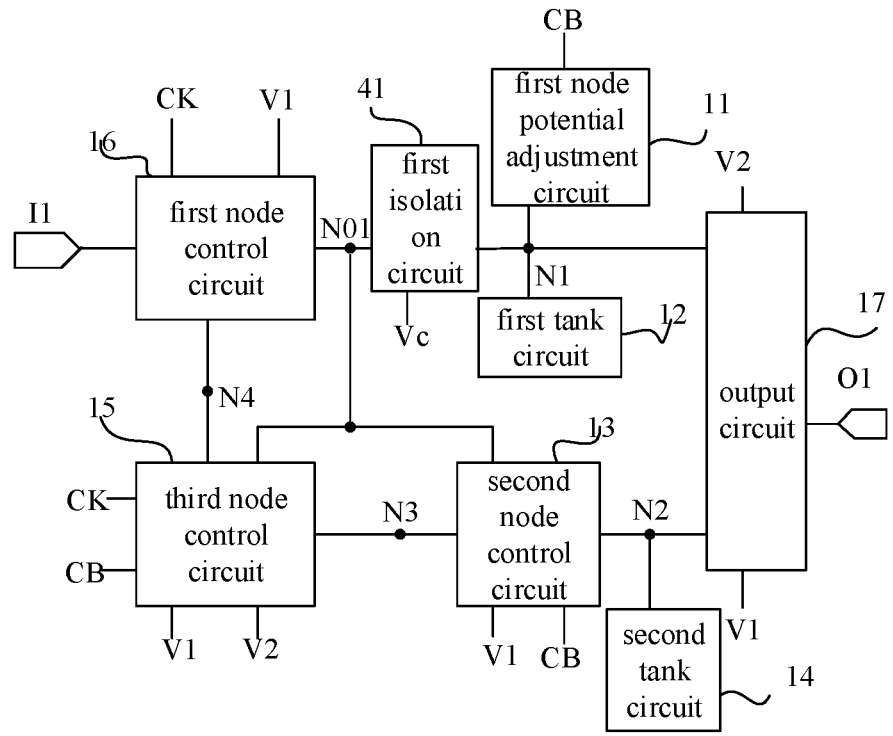
FIG. 4 is a structural diagram of a shift register unit according to at least one embodiment of the present disclosure.

As shown in FIG. 4, the difference from the embodiment of the shift register unit shown in FIG. 1 is that the first node N1 and the first isolation node are not the same node.

The shift register unit further includes a first isolation circuit 41; the first node N1 is electrically connected to the first isolation node N01 through the first isolation circuit 41.

The control terminal of the first isolation circuit 41 is electrically connected to the control voltage terminal V0.

Figure 5:
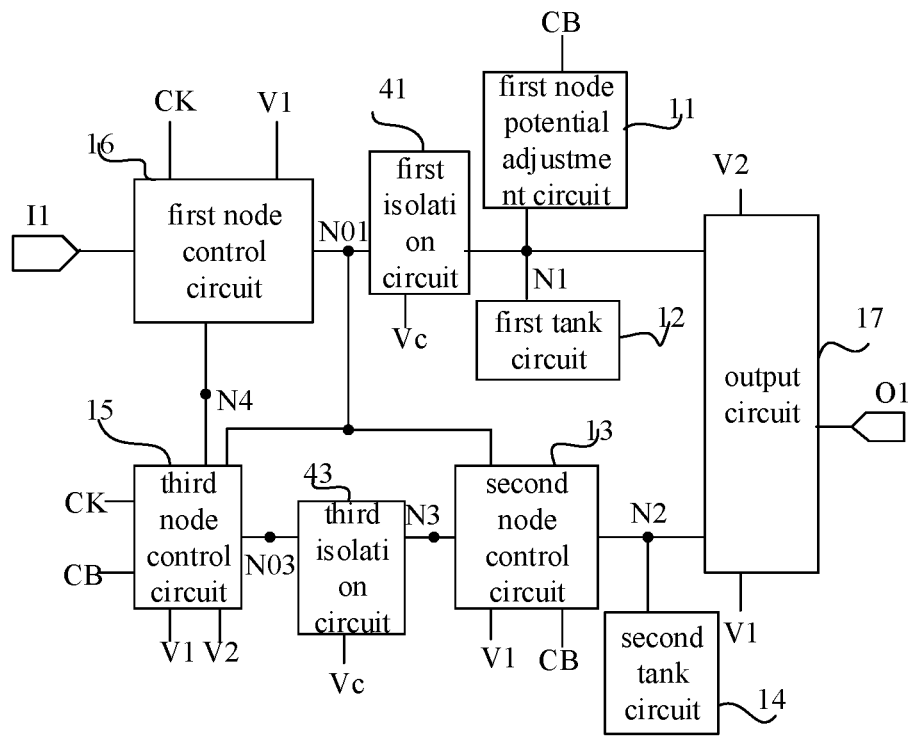
FIG. 5 is a structural diagram of a shift register unit according to at least one embodiment of the present disclosure.

As shown in FIG. 5, the difference from the embodiment of the shift register unit shown in FIG. 1 is as follows.

The first node N1 and the first isolation node are not the same node, and the third node N3 and the third isolation node are not the same node;

At least one embodiment of the shift register unit further includes a first isolation circuit 41 and a third isolation circuit 43; the first node N1 is electrically connected to the first isolation node N01 through the first isolation circuit 41; and the third node N3 is electrically connected to the third isolation node N03 through the third isolation circuit 43.

The control terminal of the first isolation circuit 41 is electrically connected to the control voltage terminal V0, and the control terminal of the third isolation circuit 43 is electrically connected to the control voltage terminal V0.

In specific implementation, when the first isolation transistor included in the first isolation circuit 41 is a p-type transistor and the third isolation transistor included in the third isolation circuit 43 is a p-type transistor, the control voltage terminal may be a low voltage terminal When the first isolation transistor included in the first isolation circuit 41 is an n-type transistor and the third isolation transistor included in the third isolation circuit 43 is an n-type transistor, the control voltage terminal may be a high voltage terminal; but not limited to this.

Figure 6:
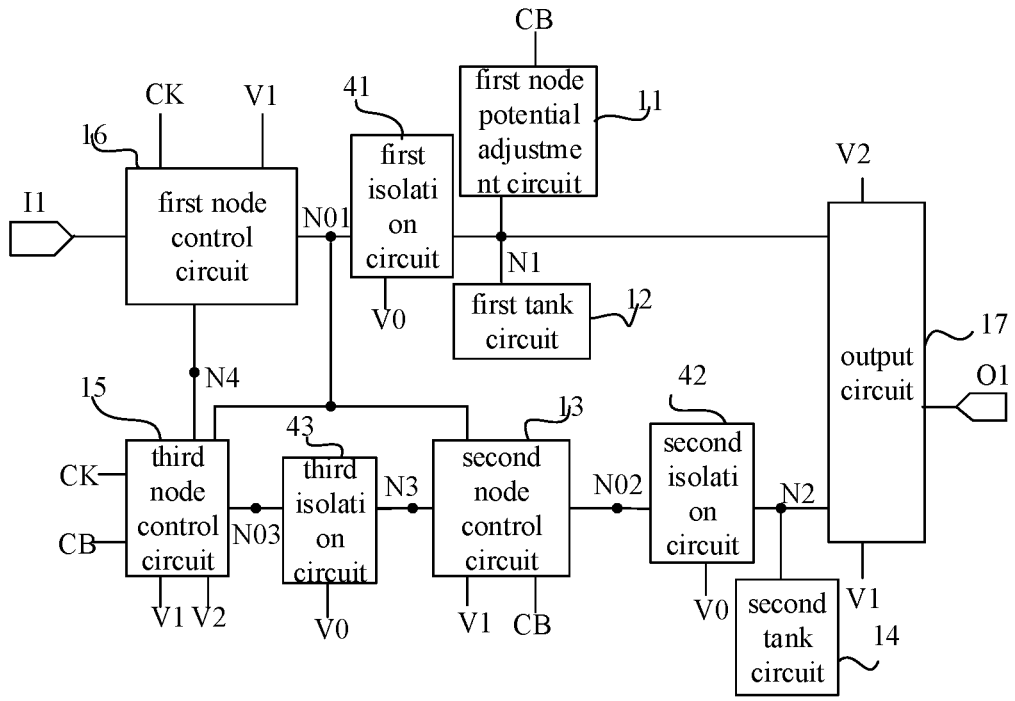
FIG. 6 is a structural diagram of a shift register unit according to at least one embodiment of the present disclosure.

As shown in FIG. 6, the difference from the embodiment of the shift register unit shown in FIG. 5 is as follows.

At least one embodiment of the shift register unit further includes a second isolation circuit 42.

The second isolation node N02 is electrically connected to the second node N2 through the second isolation circuit 42.

The control terminal of the second isolation circuit 42 is electrically connected to the control voltage terminal V0.

In specific implementation, when the second isolation transistor included in the second isolation circuit 42 is a p-type transistor, the control voltage terminal may be a low voltage terminal;

When the second isolation transistor included in the second isolation circuit 41 is an n-type transistor, the control voltage terminal may be a high voltage terminal; but not limited to this.

Figure 7:
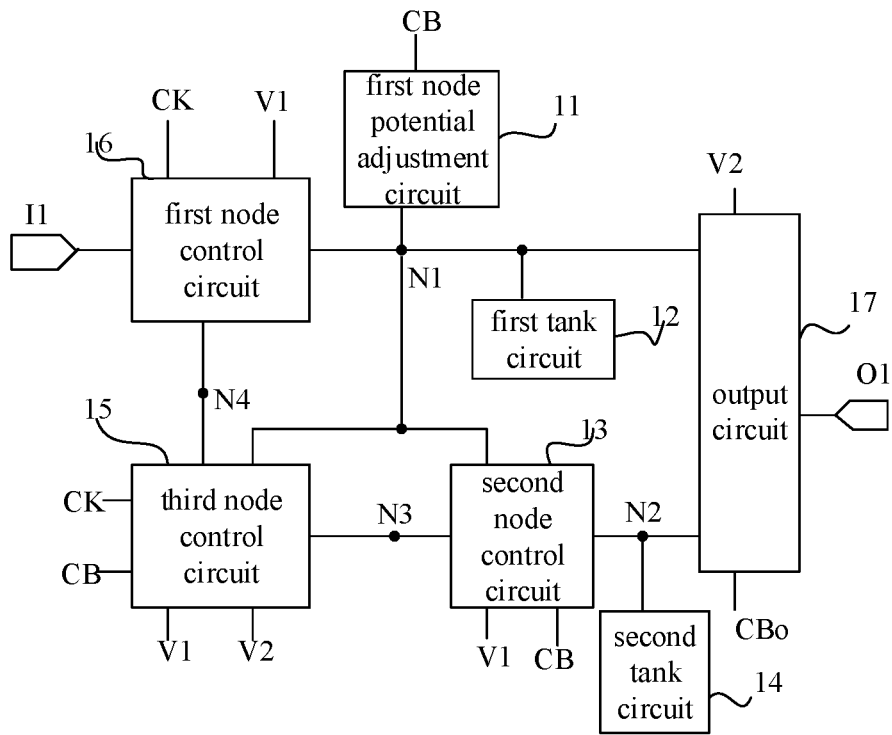
FIG. 7 is a structural diagram of a shift register unit according to at least one embodiment of the present disclosure.

As shown in FIG. 7, the shift register unit according to at least one embodiment of the present disclosure includes a first node potential adjustment circuit 11, a first tank circuit 12, a second node control circuit 13, a second tank circuit 14, and a third node control circuit 15, a first node control circuit 16, and an output circuit 17.

The first node control circuit 16 is electrically connected to the input terminal I1, the first clock signal terminal CK, the first node N1, the fourth node N4, and the first voltage terminal V1, respectively, and is used to control to write the input signal provided by the input terminal I1 to the first node N1 under the control of the first clock signal provided by the first clock signal terminal CK and control to write the first voltage signal provided by the first voltage terminal V1 to the first node N1 under the control of the potential of the fourth node N4.

The first node potential adjustment circuit 11 is electrically connected to the second clock signal terminal CB and the first node N1, respectively, is configured to change the potential of the first node N1 according to the second clock signal provided by the second clock signal terminal CB under the control of the potential of the first node N1.

The first tank circuit 12 is electrically connected to the first node N1, and is used to maintain the potential of the first node N1.

The third node control circuit 15 is respectively connected to the first clock signal terminal CK, the second clock signal terminal CB, the first node N1, the third node N3, the fourth node N4, the first voltage terminal V1 and the second voltage terminal V2, is configured to control the potential of the third node N3 and the potential of the fourth node N4 under the control of the first clock signal, the second clock signal and the potential of the first node N1.

The second node control circuit 13 is electrically connected to the first node N1, the first voltage terminal V1, the second node N2, the second clock signal terminal CB, and the third node N3, respectively, is configured to control the potential of the second node N2 under the control of the potential of the third node N3 and the second clock signal, is configured to control to write the first voltage signal provided by the first voltage terminal V1 to the second node N2 under the control of the potential of the first node N1.

The second tank circuit 14 is electrically connected to the second node N2, and configured to maintain the potential of the second node N2.

The output circuit 17 is electrically connected to the first node N1, the second voltage terminal V2, the driving voltage signal terminal O1, and the output clock signal terminal CBo, respectively, is configured to write the second voltage signal provided by the second voltage terminal V2 to the driving voltage signal output terminal O1 under the control of the potential of the first node N1, and is used to write the output clock signal provided by the output clock signal terminal CBo into the driving voltage signal terminal O1 under the control of the potential of the second node N2.

In the shift register unit shown in FIG. 7, the first isolation node and the first node are the same node, the second isolation node and the second node are the same node, and the third isolation node and the third node are the same node, but not limited to this.

In the shift register unit shown in FIG. 7, the control clock signal terminal is the second clock signal terminal, and the adjustment clock signal terminal is the second clock signal terminal.

In the shift register unit shown in FIG. 7, the shift register unit is used to provide a gate driving signal, the shift register unit is a shift register unit in the gate driving circuit, and the third voltage terminal is an output clock signal terminal; the output clock signal provided by the output clock signal terminal is a clock signal that is inverted in phase from the second clock signal.

Figure 8:
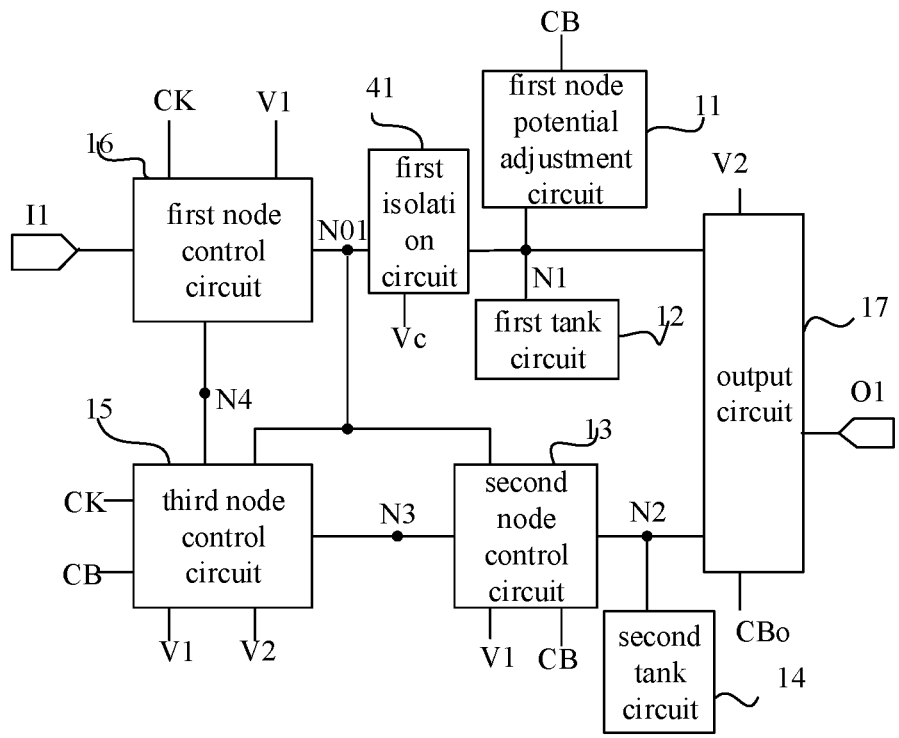
FIG. 8 is a structural diagram of a shift register unit according to at least one embodiment of the present disclosure.

As shown in FIG. 8, the difference from the embodiment of the shift register unit shown in FIG. 7 is that the first node N1 and the first isolation node are not the same node.

At least one embodiment of the shift register unit further includes a first isolation circuit 41; the first node N1 is electrically connected to the first isolation node N01 through the first isolation circuit 41.

Figure 9:
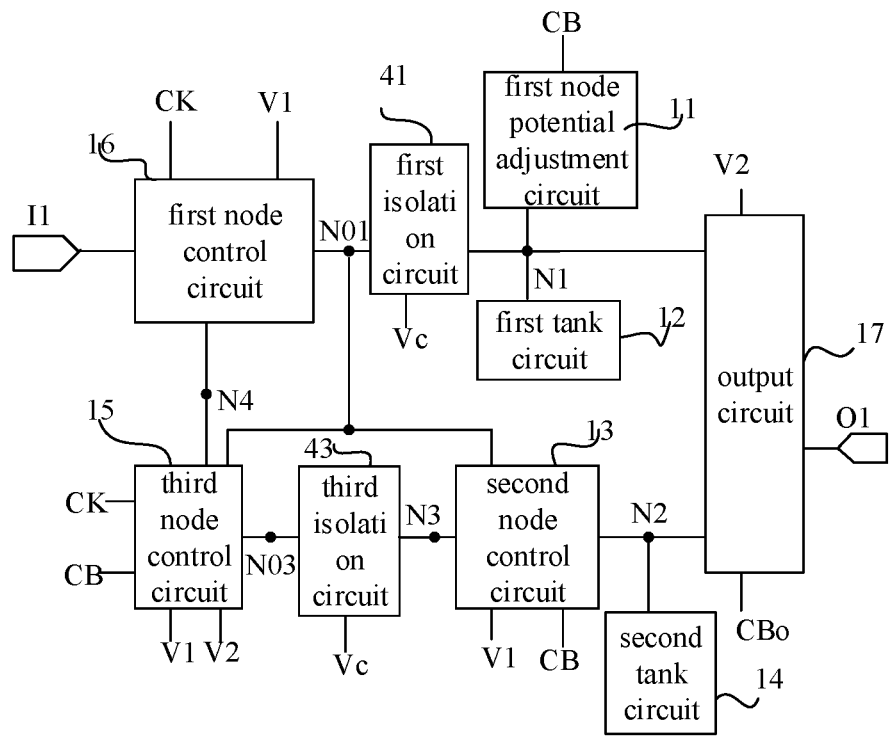
FIG. 9 is a structural diagram of a shift register unit according to at least one embodiment of the present disclosure.

As shown in FIG. 9, the difference from the embodiment of the shift register unit shown in FIG. 7 is as follows.

The first node N1 and the first isolated node are not the same node, and the third node N3 and the third isolated node are not the same node.

At least one embodiment of the shift register unit further includes a first isolation circuit 41 and a third isolation circuit 43; the first node N1 is electrically connected to the first isolation node N01 through the first isolation circuit 41; and the third node N3 is electrically connected to the third isolation node N03 through the third isolation circuit 43.

The control terminal of the first isolation circuit 41 is electrically connected to the control voltage terminal V0, and the control terminal of the third isolation circuit 43 is electrically connected to the control voltage terminal V0.

In specific implementation, when the first isolation transistor included in the first isolation circuit 41 is a p-type transistor and the third isolation transistor included in the third isolation circuit 43 is a p-type transistor, the control voltage terminal may be a low voltage terminal When the first isolation transistor included in the first isolation circuit 41 is an n-type transistor and the third isolation transistor included in the third isolation circuit 43 is an n-type transistor, the control voltage terminal may be a high voltage terminal, but not limited to this.

Figure 10:
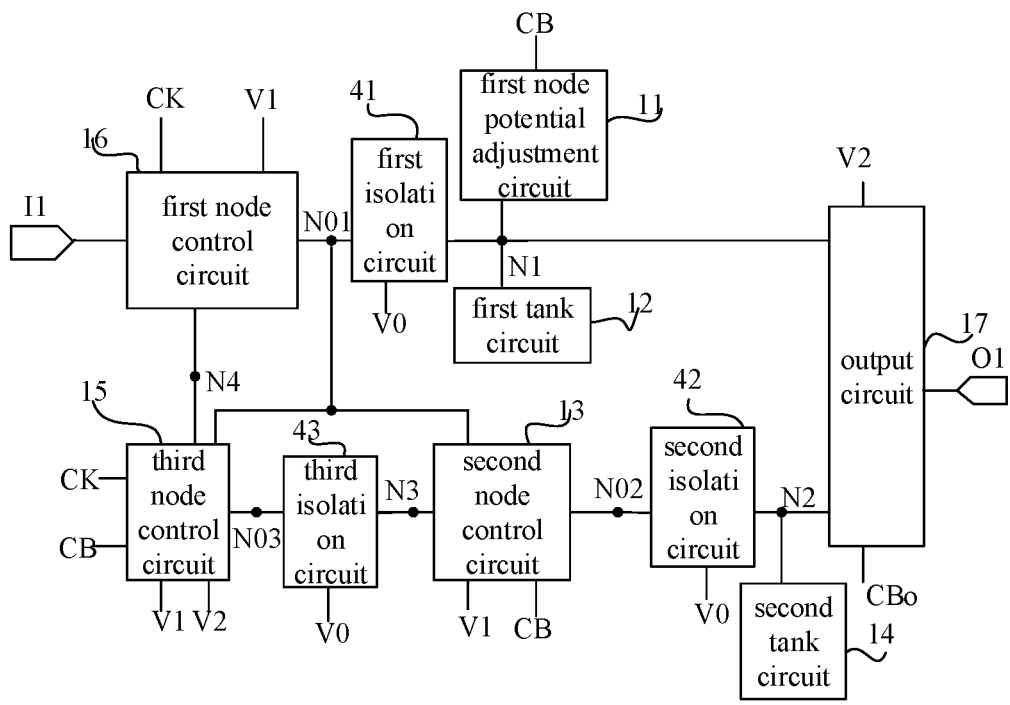
FIG. 10 is a structural diagram of a shift register unit according to at least one embodiment of the present disclosure.

As shown in FIG. 10, the difference from the embodiment of the shift register unit shown in FIG. 9 is as follows.

At least one embodiment of the shift register unit further includes a second isolation circuit 42.

The second isolation node N02 is electrically connected to the second node N2 through the second isolation circuit 42.

The control electrode of the second isolation circuit 42 is electrically connected to the control voltage terminal V0.

In specific implementation, when the second isolation transistor included in the second isolation circuit 42 is a p-type transistor, the control voltage terminal may be a low voltage terminal.

Figure 11:
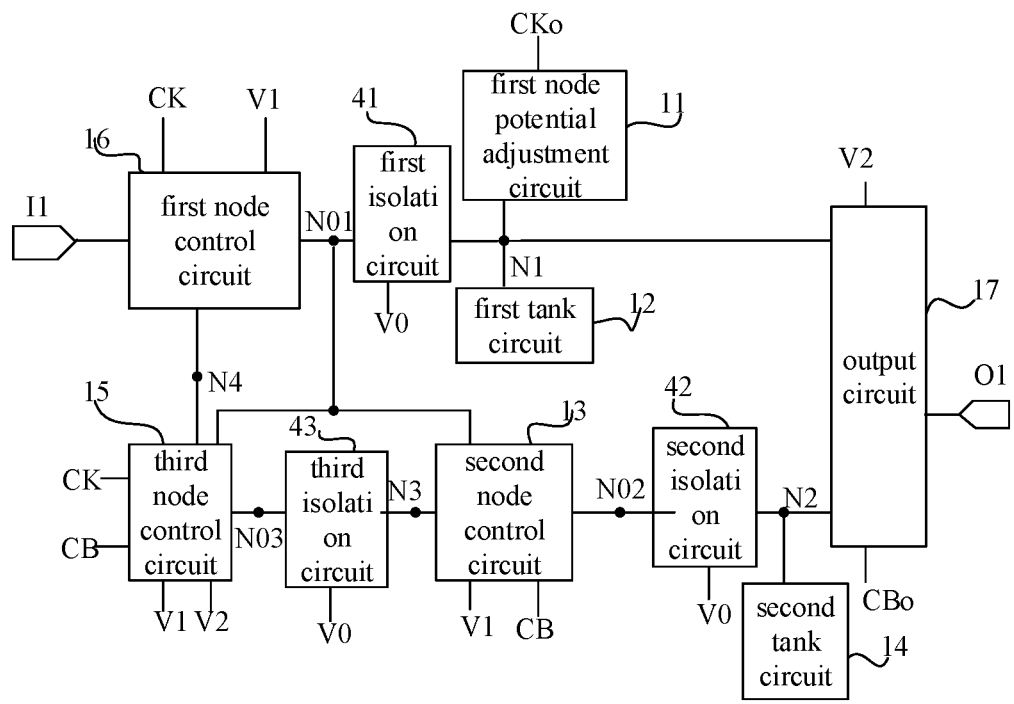
FIG. 11 is a structural diagram of a shift register unit according to an embodiment of the present disclosure.

When the second isolation transistor included in the second isolation circuit 41 is an n-type transistor, the control voltage terminal may be a high voltage terminal;

As shown in FIG. 11, the difference from the embodiment of the shift register unit shown in FIG. 10 is that the adjustment clock signal terminal is not the second clock signal terminal CB, but the third clock signal terminal CKo.

The first node potential adjustment circuit 11 is electrically connected to the third clock signal terminal CKo and the first node N1, respectively, is configured to change the potential of the first node N1 according to the third clock signal provided by the third clock signal terminal CKo for under the control of the potential of the first node N1.

The third clock signal is inverted in phase from the first clock signal.

In at least one embodiment of the present disclosure, the first node potential adjustment circuit may include an adjustment transistor and an adjustment capacitor, wherein a control electrode of the adjustment transistor is electrically connected to the first isolation node, a first electrode of the adjustment transistor is electrically connected to the adjustment clock signal terminal, and a second electrode of the adjustment transistor is electrically connected to a first end of the adjustment capacitor.

A second end of the adjustment capacitor is electrically connected to the first isolation node.

Optionally, the second node control circuit may include a first control transistor, a control capacitor, a second control transistor, and a third control transistor, wherein, a first end of the control capacitor is electrically connected to the third node, and a second end of the control capacitor is electrically connected to the fifth node.

A control electrode of the first control transistor is electrically connected to the third node, a first electrode of the first control transistor is electrically connected to the fifth node, and a second electrode of the first control transistor is electrically connected to the control clock signal terminal;

A control electrode of the second control transistor is electrically connected to the second clock signal terminal, a first electrode of the second control transistor is electrically connected to the fifth node, and a second electrode of the second control transistor is electrically connected to the second isolation node;

A control electrode of the third control transistor is electrically connected to the first node, a first electrode of the third control transistor is electrically connected to the first voltage terminal, and a second electrode of the third control transistor is electrically connected to the second isolation node.

Optionally, the second node control circuit includes a first control transistor, a control capacitor, a second control transistor, and a third control transistor, wherein, a first end of the control capacitor is electrically connected to the third node;

A control electrode of the first control transistor is electrically connected to the third node, a first electrode of the first control transistor is electrically connected to the second end of the control capacitor, and a second electrode of the first control transistor is electrically connected to the second clock signal terminal; a control electrode of the second control transistor is electrically connected to the control clock signal terminal, and a first electrode of the second control transistor is electrically connected to the second isolation node;

A control electrode of the third control transistor is electrically connected to the first isolation node, a first electrode of the third control transistor is electrically connected to the first voltage terminal, and a second electrode of the third control transistor is electrically connected to the second isolation node.

In specific implementation, the second node control circuit is also electrically connected to the first clock signal terminal, and is also used to control the potential of the second isolation node under the control of the first clock signal.

Optionally, the shift register unit is a shift register unit in the light emitting control signal generation circuit; the second node control circuit includes a first control transistor, a control capacitor, a second control transistor, a third control transistor, and a node control transistor.

A first end of the control capacitor is electrically connected to the third node, and a second end of the control capacitor is electrically connected to the fifth node;

A control electrode of the first control transistor is electrically connected to the third node, a first electrode of the first control transistor is electrically connected to the fifth node, and a second electrode of the first control transistor is electrically connected to the second clock signal terminal;

A control electrode of the second control transistor is electrically connected to the second clock signal terminal, a first electrode of the second control transistor is electrically connected to the fifth node, and a second electrode of the second control transistor is electrically connected to the second isolation node;

A control electrode of the third control transistor is electrically connected to the first node, and a first electrode of the third control transistor is electrically connected to the first voltage terminal;

A control electrode of the node control transistor is electrically connected to the first clock signal terminal, a first electrode of the node control transistor is electrically connected to the second electrode of the third control transistor, and a second electrode of the node control transistor is electrically connected to the second node.

In specific implementation, the third node control circuit includes a fourth control transistor, a fifth control transistor, and a sixth control transistor, wherein, A control electrode of the fourth control transistor is electrically connected to the first clock signal terminal, a first electrode of the fourth control transistor is electrically connected to the second voltage terminal, and a second electrode of the fourth control transistor is electrically connected to the third isolation node;

A control electrode of the fifth control transistor is electrically connected to the first isolation node, a first electrode of the fifth control transistor is electrically connected to the first voltage terminal, and a second electrode of the fifth control transistor is electrically connected to the fourth node.

A control electrode of the sixth control transistor is electrically connected to the second clock signal terminal, a first electrode of the sixth control transistor is electrically connected to the fourth node, and a second electrode of the sixth control transistor is electrically connected to the third isolation node.

In at least one embodiment of the present disclosure, the shift register unit may further include a third isolation transistor; the third isolation node is a third node;

A second electrode of the fourth control transistor is electrically connected to the third node through the third isolation transistor;

A control electrode of the third isolation transistor is electrically connected to the control voltage terminal, a first electrode of the third isolation transistor is electrically connected to the second electrode of the fourth control transistor, and a second electrode of the third isolation transistor is electrically connected to the third node.

Optionally, the driving voltage signal terminal is a light emitting control signal terminal, and the third voltage terminal is a first voltage terminal;

The third node control circuit includes a fourth control transistor, a fifth control transistor, and a sixth control transistor, wherein, A control electrode of the fourth control transistor is electrically connected to the second clock signal terminal, a first electrode of the fourth control transistor is electrically connected to the second voltage terminal, and a second electrode of the fourth control transistor is electrically connected to the third isolation node.

A control electrode of the fifth control transistor is electrically connected to the first isolation node, a first electrode of the fifth control transistor is electrically connected to the first voltage terminal, and a second electrode of the fifth control transistor is electrically connected to the fourth node.

A control electrode of the sixth control transistor is electrically connected to the first clock signal terminal, a first electrode of the sixth control transistor is electrically connected to the fourth node, and a second electrode of the sixth control transistor is electrically connected to the third isolation node.

In at least one embodiment of the present disclosure, the shift register unit may further include a third isolation transistor; the third isolation node is a third node;

A second electrode of the fourth control transistor is electrically connected to the third node through the third isolation transistor;

A control electrode of the third isolation transistor is electrically connected to the control voltage terminal, a first electrode of the third isolation transistor is electrically connected to the second electrode of the fourth control transistor, and a second electrode of the third isolation transistor is electrically connected to the third node.

Optionally, the first node control circuit includes a seventh control transistor and an eighth control transistor, wherein, A control electrode of the seventh control transistor is electrically connected to the first clock signal terminal, a first electrode of the seventh control transistor is electrically connected to the input terminal, and a second electrode of the seventh control transistor is electrically connected to the first isolation node;

A control electrode of the eighth control transistor is electrically connected to the fourth node, a first electrode of the eighth control transistor is electrically connected to the first isolation node, and a second electrode of the eighth control transistor is electrically connected to the first voltage terminal.

Optionally, the output circuit includes a first output transistor and a second output transistor;

A control electrode of the first output transistor is electrically connected to the first node, a first electrode of the first output transistor is electrically connected to the second voltage terminal, and a second electrode of the first output transistor is electrically connected to the driving voltage signal terminal;

A control electrode of the second output transistor is electrically connected to the second node, a first electrode of the second output transistor is electrically connected to the driving voltage signal terminal, and a second electrode of the second output transistor is electrically connected to the third voltage terminal.

In a specific implementation, the first tank circuit may include a first storage capacitor, and the second tank circuit may include a second storage capacitor;

A first end of the first storage capacitor is electrically connected to the first node, and a second end of the first storage capacitor is electrically connected to a second voltage end;

A first end of the second storage capacitor is electrically connected to the second node, and a second end of the second storage capacitor is electrically connected to the third voltage end.

Figure 12:
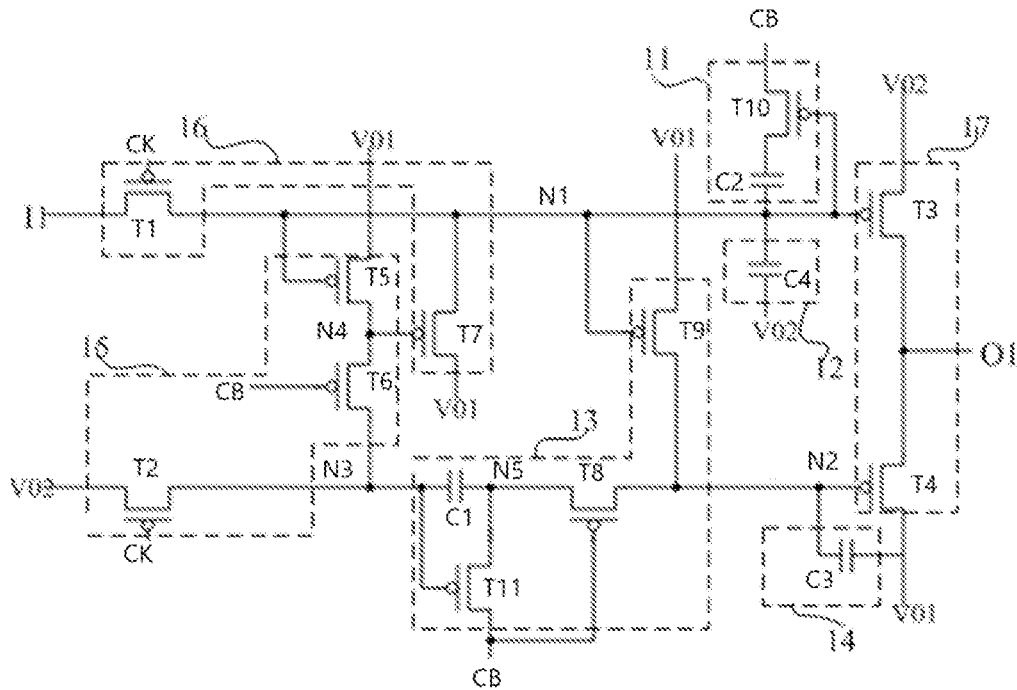
FIG. 12 is a circuit diagram of the shift register unit according to the first embodiment of the present disclosure.

As shown in FIG. 12, on the basis of the embodiment of the shift register unit described in FIG. 1, in the first embodiment of the shift register unit described in the present disclosure, the first node potential adjustment circuit 11 includes an adjustment transistor T10 and an adjustment capacitor C2.

The gate electrode of the adjustment transistor T10 is electrically connected to the first node N1, the source electrode of the adjustment transistor T10 is electrically connected to the second clock signal terminal CB, and the drain electrode of the adjustment transistor T10 is electrically connected to the first terminal of the adjustment capacitor C2.

The second end of the adjustment capacitor C2 is electrically connected to the first node N1;

The second node control circuit 13 includes a first control transistor T11, a control capacitor C1, a second control transistor T8, and a third control transistor T9, wherein, The first end of the control capacitor C1 is electrically connected to the third node N3, and the second end of the control capacitor C1 is electrically connected to the fifth node N5;

The gate electrode of the first control transistor T11 is electrically connected to the third node N3, the drain electrode of the first control transistor T11 is electrically connected to the fifth node N5, and the source electrode of the first control transistor T11 is electrically connected to the second clock signal terminal CB;

The gate electrode of the second control transistor T8 is electrically connected to the second clock signal terminal CB, the source electrode of the second control transistor T8 is electrically connected to the fifth node N5, and the drain electrode of the second control transistor T8 is electrically connected to the second node N2;

The gate electrode of the third control transistor T9 is electrically connected to the first node N1, the source electrode of the third control transistor T9 is electrically connected to the high voltage terminal V01, and the drain electrode of the third control transistor T9 is electrically connected to the second node N2.

The third node control circuit 15 includes a fourth control transistor T2, a fifth control transistor T5, and a sixth control transistor T6, wherein, The gate electrode of the fourth control transistor T2 is electrically connected to the first clock signal terminal CK, the source electrode of the fourth control transistor T2 is electrically connected to the low voltage terminal V02, and the drain electrode of the fourth control transistor T2 is electrically connected to the third node N3;

The gate electrode of the fifth control transistor T5 is electrically connected to the first node N1, the source electrode of the fifth control transistor T5 is electrically connected to the high voltage terminal V01, and the drain electrode of the fifth control transistor T5 is electrically connected to the fourth node N4;

The gate electrode of the sixth control transistor T6 is electrically connected to the second clock signal terminal CB, the source electrode of the sixth control transistor T6 is electrically connected to the fourth node N4, and the drain electrode of the sixth control transistor T6 is electrically connected to the third node N3;

The first node control circuit 16 includes a seventh control transistor T1 and an eighth control transistor T7, wherein, The gate electrode of the seventh control transistor T1 is electrically connected to the first clock signal terminal CK, the source electrode of the seventh control transistor T1 is electrically connected to the input terminal I1, and the drain electrode of the seventh control transistor T1 is electrically connected to the first node N1;

The gate electrode of the eighth control transistor T7 is electrically connected to the fourth node N4, the drain electrode of the eighth control transistor T7 is electrically connected to the first node N1, and the source electrode of the eighth control transistor T7 is electrically connected to the high voltage terminal V01;

The output circuit 17 includes a first output transistor T3 and a second output transistor T4;

The gate electrode of the first output transistor T3 is electrically connected to the first node N1, the source electrode of the first output transistor T3 is electrically connected to the low voltage terminal V02, and the drain electrode of the first output transistor T3 is electrically connected to the driving voltage signal terminal O1;

The gate electrode of the second output transistor T4 is electrically connected to the second node N2, the drain electrode of the second output transistor T4 is electrically connected to the driving voltage signal terminal O1, and the source electrode of the second output transistor T4 is electrically connected to the high voltage terminal V01;

The first tank circuit 12 includes a first storage capacitor C4, and the second tank circuit 14 includes a second storage capacitor C3;

The first end of the first storage capacitor C4 is electrically connected to the first node N1, and the second end of the first storage capacitor C4 is electrically connected to the low voltage terminal V02;

The first end of the second storage capacitor C3 is electrically connected to the second node N2, and the second end of the second storage capacitor C3 is electrically connected to the high voltage terminal V01.

In at least one embodiment of the present disclosure, the high voltage terminal may provide a high voltage signal, and the low voltage terminal may provide a low voltage signal.

The first embodiment of the shift register unit described in the present disclosure is the shift register unit in the light emitting control signal generating circuit, which is used to generate the light emitting control signal.

In the first embodiment of the shift register unit described in the present disclosure, all the transistors are p-type thin film transistors, but not limited to this.

In at least one embodiment of the present disclosure, when the shift register unit is used to generate the light emitting control signal, the shift register unit may only use two clock signals, but it is not limited to this.

When the shift register unit described in the present disclosure is in operation, because C2 and C4 can make the second clock signal provided by CB jump from a high voltage signal to a low voltage signal, the potential of N1 becomes not very low, which can improve the drift of the threshold voltage of T1.

Figure 13:
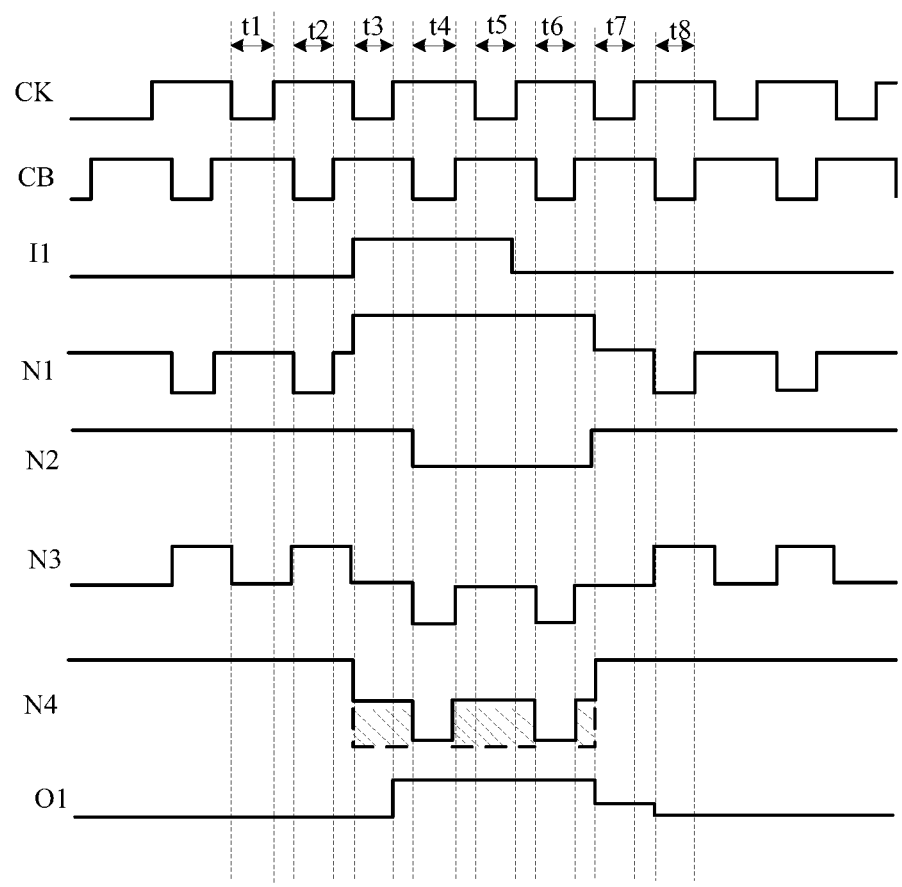
FIG. 13 is a working timing diagram of the shift register unit according to the first embodiment of the present disclosure.

As shown in FIG. 13, when the shift register unit of the first embodiment of the present disclosure is in operation, the display period includes a first time period t1, a second time period t2, a third time period t3, a fourth time period t4, a fifth time period t5, a sixth time period t6, a seventh time period t7 and an eighth time period t8.

Figure 14A:
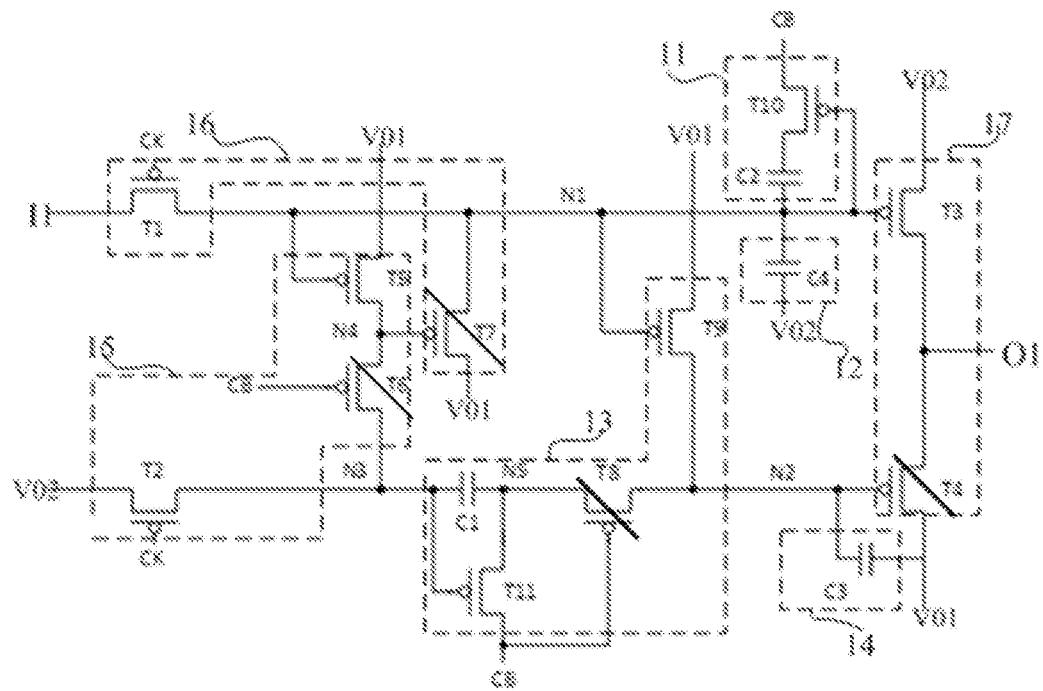
FIG. 14A is a schematic diagram of a circuit state in the first time period t1 of the shift register unit according to the first embodiment of the present disclosure.
Figure 14B:
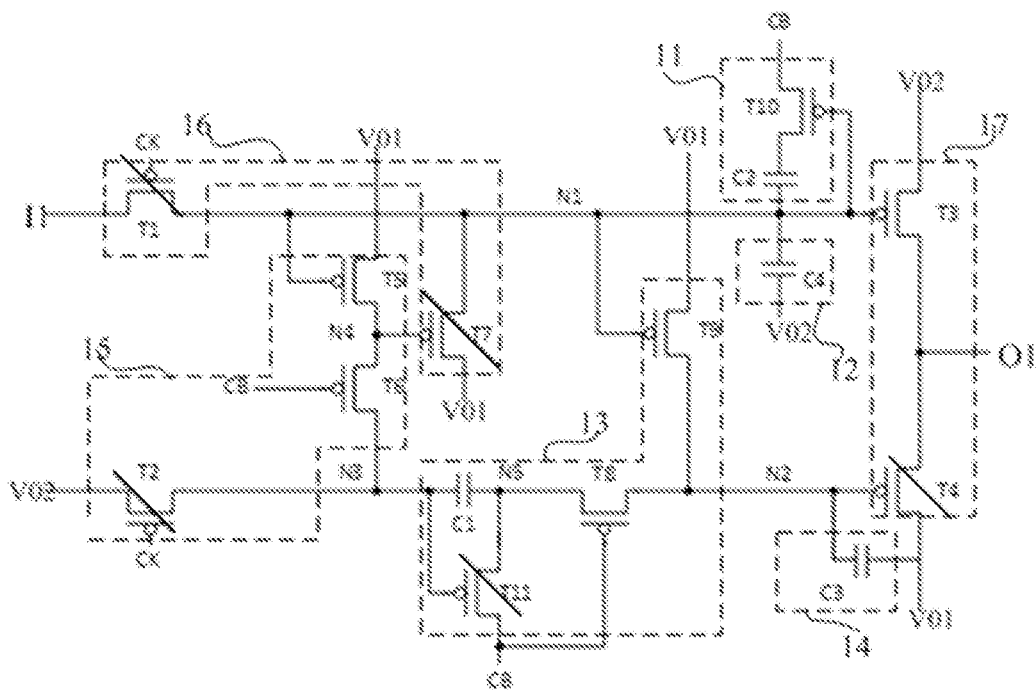
FIG. 14B is a schematic diagram of a circuit state in the second time period t2 of the shift register unit according to the first embodiment of the present disclosure.
Figure 14C:
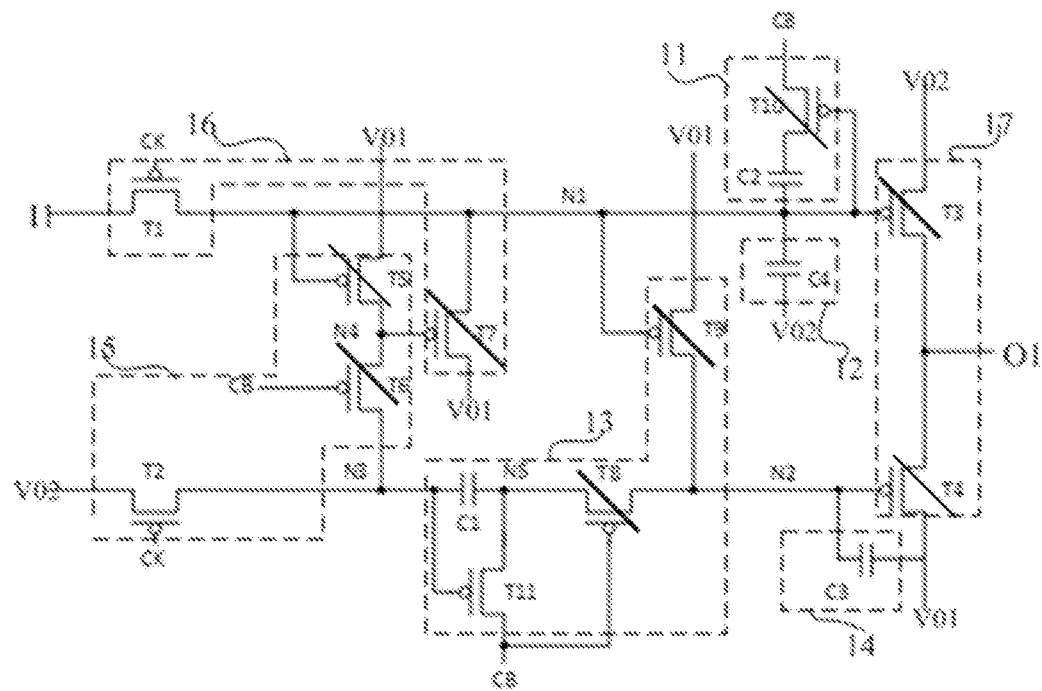
FIG. 14C is a schematic diagram of a circuit state in the third time period t3 of the shift register unit according to the first embodiment of the present disclosure.
Figure 14D:
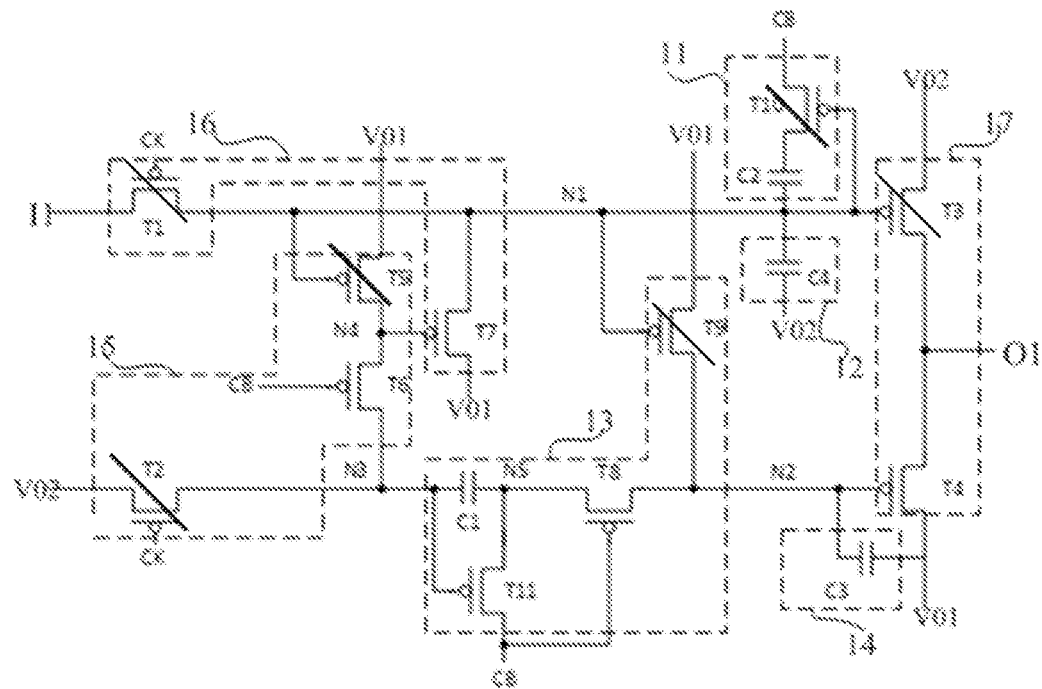
FIG. 14D is a schematic diagram of a circuit state in the fourth time period t4 of the shift register unit according to the first embodiment of the present disclosure.
Figure 14E:
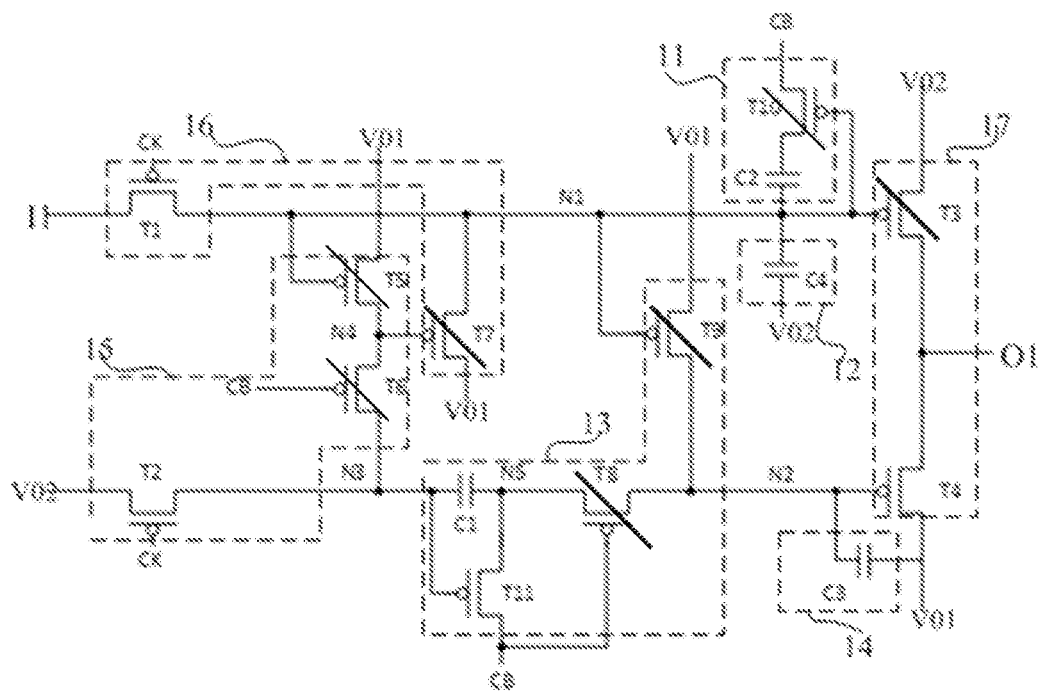
FIG. 14E is a schematic diagram of a circuit state in the fifth time period t5 of the shift register unit according to the first embodiment of the present disclosure.
Figure 14F:
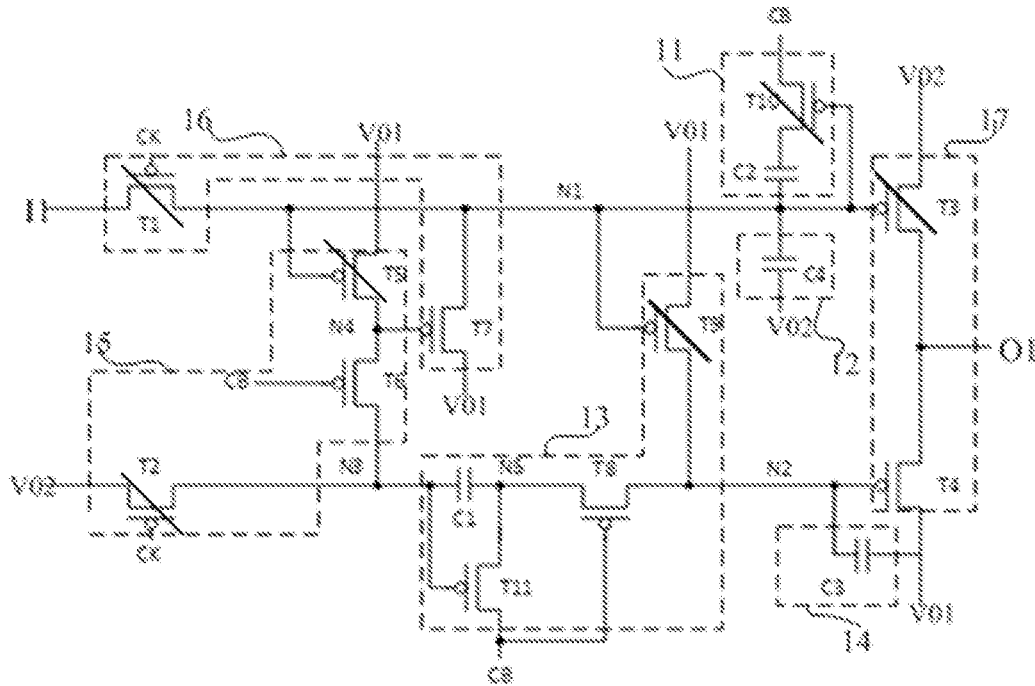
FIG. 14F is a schematic diagram of a circuit state in the sixth time period t6 of the shift register unit according to the first embodiment of the present disclosure.
Figure 14G:
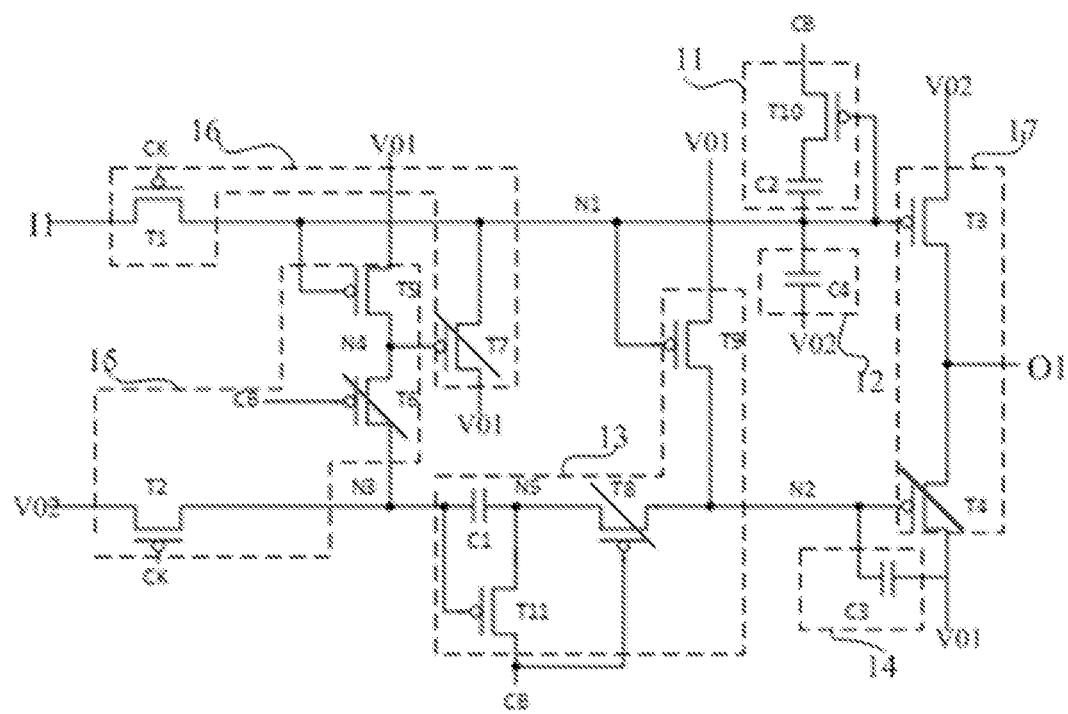
FIG. 14G is a schematic diagram of a circuit state in the seventh time period t7 of the shift register unit according to the first embodiment of the present disclosure.
Figure 14H:
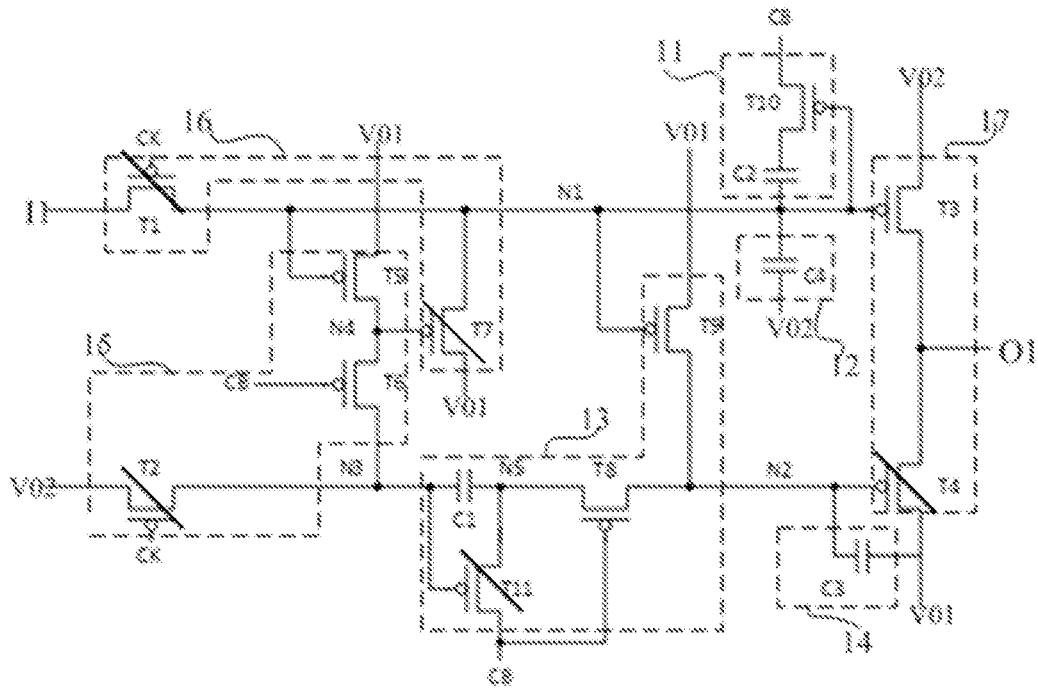
FIG. 14H is a schematic diagram of a circuit state in the eighth time period t8 of the shift register unit according to the first embodiment of the present disclosure.

In the first time period t1, CK provides a low voltage signal, CB provides a high voltage signal (the potential of the high voltage signal provided by CB is VH), I1 provides a low voltage signal, as shown in FIG. 14A, T6 is turned off, T8 is turned off, and T1 is turned on, the potential of N1 is a low voltage, the potential of N2 is a high voltage, T2 is turned on, the potential of N3 is a low voltage, the potential of N4 is maintained at a high voltage, T4 is turned off, T3 is turned on, and O1 outputs a low voltage; the potential of N1 will not drop low enough, so the low voltage output by O1 has a threshold voltage loss. The voltage value of the voltage signal output by O1 is VL-Vth, where Vth is the threshold voltage of T3; VL is the voltage value of the low voltage signal provided by V02;

In the first time period t1, the potential of N1 is VL, the potential of N2 is VH, the potential of N3 is VL, the potential of N4 is VH, and the potential of N5 is VH;

In the second time period t2, CK provides a high voltage signal, CB provides a low voltage signal (the voltage value of the low voltage signal provided by CB is VL), and I1 provides a low voltage signal. As shown in FIG. 14B, T1 is turned off and T2 is turned off, because the second clock signal provided by CB is reduced from the high voltage signal in t1 to a low voltage signal, the potential of N1 is correspondingly reduced, so that the potential of N1 is a low voltage. At this time, the potential of N1 is (VL−VH)C2z/(C2z+C4z)+VL; where VH is the voltage value of the high voltage signal, VL is the voltage value of the low voltage signal, C2z is the capacitance value of C2, C4z is the capacitance value of C4; T5 and T6 are turned on, and the high voltage signal V01 is written into N3, T11 is turned off, T8 and T9 are turned on, so that the potential of N2 is a high voltage, and since the potential of the second clock signal provided by CB is reduced from a high voltage to a low voltage, thereby further reducing the potential of N1, T3 is fully turned on, O1 outputs a low voltage, and the voltage value of the voltage signal output by O1 is VL;

In the second time period t2, the potential of N2 is VH, the potential of N3 is VH, the potential of N4 is VH, and the potential of N5 is VH;

In the third time period t3, CK provides a low voltage signal, CB provides a high voltage signal (the potential of the high voltage signal provided by CB is VH), and I1 provides a high voltage signal. As shown in FIG. 14C, T1 is turned on to write the high voltage signal provided by I1 into N1, T5 is turned off, T6 is turned off, N4 is floating, T2 is turned on, the potential of N3 is low voltage, and T11 is turned on, so that the potential of N5 is high voltage, T8 is turned off, T9 is turned off, T10 is turned off, T3 is turned off, and T4 is turned off. Due to the parasitic capacitance of the circuit, the signal output by O1 maintains the state in the previous period, O1 outputs a low voltage, and the voltage value of the voltage signal output by O1 is VL;

In the third time period t3, the potential of N1 is VH, the potential of N2 is maintained at the potential in the previous period, the potential of N2 is VH, the potential of N3 is VL, the potential of N4 is unknown, and the potential of N5 is VH;

In the fourth time period t4, CK provides a high voltage signal, CB provides a low voltage signal (the voltage value of the low voltage signal provided by CB is VL), and I1 provides a high voltage signal. As shown in FIG. 14D, T1 is turned off, and T2 is turned off, T9 is turned off, T11 is turned on, the low-voltage signal provided by CB is written into C1 to further reduce the potential of N3 to VL+VL−VH, and T8 is turned on. C3 is charged by the low voltage signal provided by CB through T8 which is turned on, so as to ensure that the potential of N2 is a low voltage; T6 is turned on, N4 is a low voltage, T7 is turned on, T10 is turned off, N1 is a high voltage, T3 is turned off, T4 is turned on, and O1 outputs a high voltage;

In the fourth time period t4, the potential of N1 is VH, the potential of N2 is VL, the potential of N4 is approximately equal to VL, and the potential of N5 is VL;

In a time period between the fourth time period t4 and the fifth time period t5, CK provides a high voltage signal, CB provides a high voltage signal, T1 is turned off, T2 is turned off, T6 is turned off, and the potential of N1 is maintained at a high voltage by C4, the potential of N2 is maintained at a low voltage by C3, N4 is floating, the potential of N3 is at a low voltage, and O1 maintains to output a high voltage;

In the fifth time period t5, CK provides a low voltage signal, CB provides a high voltage signal, and I1 provides a high voltage signal. As shown in FIG. 14E, T1 and T2 are turned on, the potential of N1 is high voltage, T8 is turned off, and T9 is turned off, the potential of N2 is maintained at a low voltage, the potential of N3 is at a low voltage, N4 is floating, T3 is turned off, T4 is turned on, and O1 outputs a high voltage;

In the fifth time period t5, the potential of N1 is VH, the potential of N2 is VL, the potential of N3 is VL, the potential of N4 is unknown, and the potential of N5 is VH;

In the sixth time period t6, CK provides a high voltage signal, CB provides a low voltage signal, T1 and T2 are turned off, and the potential of N1 is maintained at a high voltage. As shown in FIG. 14F, T6 is turned on, T11 is turned on, and the low voltage signal provided by CB is written into C1 to further reduce the potential of N3 to VL+VL−VH, and T8 is turned on. C3 is charged by the low-voltage signal provided by CB through T8 which is turned on to ensure that the potential of N2 is to be a low voltage; T6 is turned on, and the potential of N4 is low voltage, T7 is turned on, T3 is turned off, T4 is turned on, O1 outputs a high voltage;

In the sixth time period t6, the potential of N1 is VH, the potential of N2 is VL, the potential of N3 is 2VL−VH, the potential of N4 is VL, and the potential of N5 is VL;

In the seventh time period t7, CK provides a low voltage signal, CB provides a high voltage signal, and I1 provides a low voltage signal. As shown in FIG. 14G, both T1 and T2 are turned on, the potential of N1 is low voltage, T10 is turned on, and T9 is turned on, T8 is turned off, and the potential of N2 is a high voltage. At this time, since the potential of N1 is not low enough, the voltage value of the voltage signal output by O1 is VL-Vth, where Vth is the threshold voltage of T3;

In the seventh time period t7, the potential of N1 is VL, the potential of N2 is VH, the potential of N3 is approximately equal to VL, the potential of N4 is VH, and the potential of N5 is VH;

In the eighth time period t8, CK provides a high voltage signal, CB provides a low voltage signal, and I1 provides a low voltage signal. As shown in FIG. 14H, T1 and T2 are turned off, and T10 is turned on. The second clock signal provided by CB is changed from the high-voltage signal in a previous period to a low-voltage signal, and the potential of N1 is pulled to a lower level so that T3 can be fully turned on; T9 is turned on, T11 is turned off, and the potential of N2 is a high voltage. Since T8 is turned on, the potential of N3 is high voltage, T5 and T6 are turned on, the potential of N4 is high voltage, T3 is turned on, T4 is turned off, and the voltage value of the voltage signal output by O1 is VL;

In the eighth time period t8, the potential of N1 is VL, the potential of N2 is VH, the potential of N3 is VH, the potential of N4 is VH, and the potential of N5 is VH.

In at least one embodiment of the present disclosure, since the value of Vth is small, the difference between VL and VL-Vth cannot be distinguished in the corresponding timing diagram.

Moreover, in at least one embodiment of the present disclosure, the high voltage value of each clock signal may be VH, and the low voltage value of each clock signal may be VL, but is not limited to this.

Figure 15:
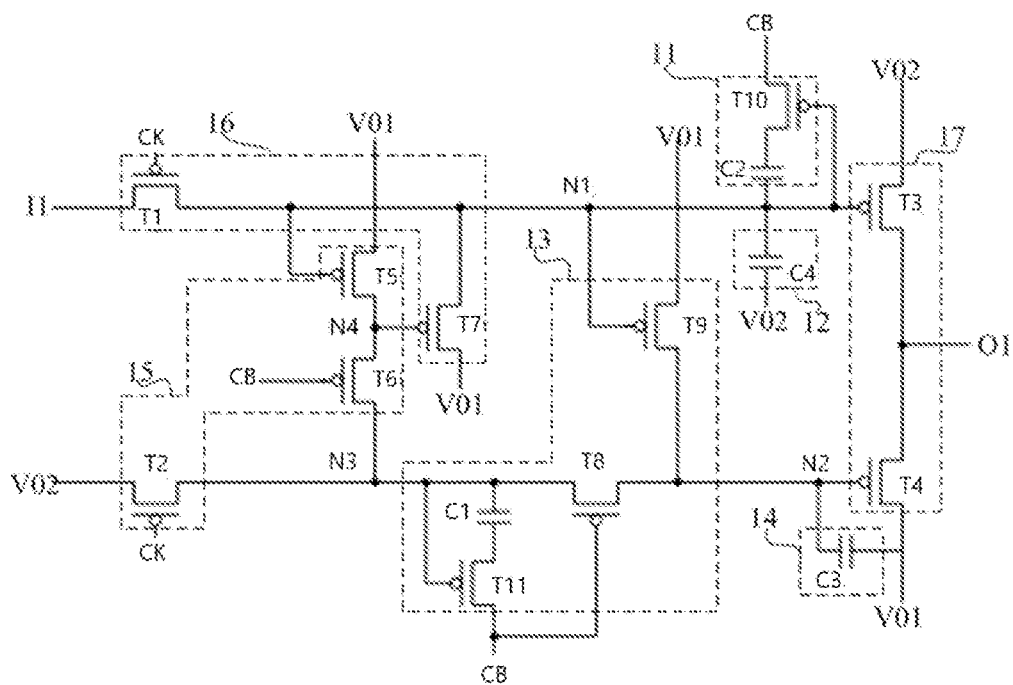
FIG. 15 is a circuit diagram of the shift register unit according to the second embodiment of the present disclosure.

As shown in FIG. 15, the difference between the second embodiment of the shift register unit described in the present disclosure and the first embodiment of the shift register unit described in the present disclosure is as follows: the position of C1.

In the second embodiment of the shift register unit, the first end of C1 is electrically connected to the third node N3, the second end of C1 is electrically connected to the drain electrode of T11, and N3 is directly electrically connected to the source electrode of T8.

The working timing diagram of the shift register unit of the second embodiment shown in FIG. 15 may also be as shown in FIG. 13, but is not limited to this.

Figure 16:
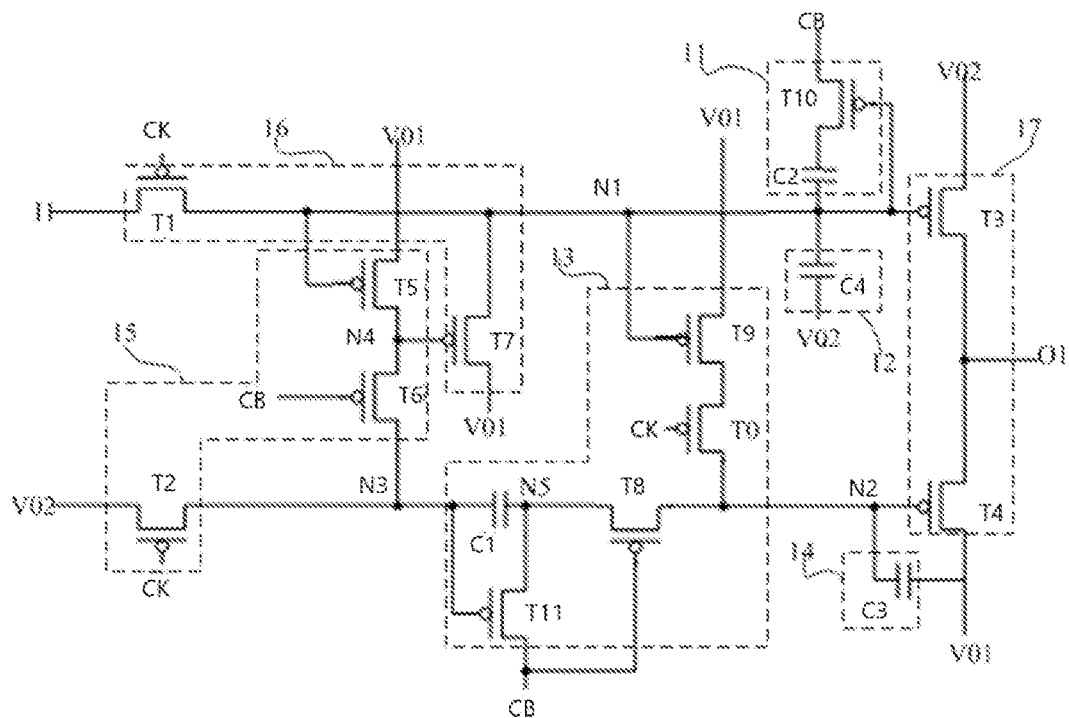
FIG. 16 is a circuit diagram of the shift register unit according to the third embodiment of the present disclosure.

The working process of the shift register unit of the second embodiment of the present disclosure as shown in FIG. 15 is substantially the same as the working process of the shift register unit of the first embodiment, the difference lies that, when T11 is turned on, the potential of N3 is controlled according to the second clock signal provided by CB, and there is no process of charging C3 through the second clock signal;

Specifically, when the shift register unit shown in FIG. 15 of the second embodiment of the present disclosure is in operation, in the fourth time period t4, when T11 is turned on, the potential jump at point N3 is realized according to the second clock signal provided by CB, the jump value is (VL−VH+VL), because in the previous time period (that is, the third time period t3), the potential of N2 is VH, so the potential of the second clock signal provided by CB is changed from the high level to the low level, and the voltage value is distributed according to the ratio of the capacitance value;

In the fourth time period t4, T8 is turned on, the potential of N3 is equal to the potential of N2, and the potential of N2 is equal to $[(2VL-VH) \times C1z + VH \times C3z]/(C1z+C3z)$, where $C1z$ is the capacitance value of C1, $C3z$ is the capacitance value of C3. As shown in FIG. 16, on the basis of the shift register unit described in FIG. 2, in the third embodiment of the shift register unit described in the present disclosure, the first node potential adjustment circuit 11 includes an adjustment transistor T10 and an adjustment capacitor C2.

The gate electrode of the adjustment transistor T10 is electrically connected to the first node N1, the source electrode of the adjustment transistor T10 is electrically connected to the second clock signal terminal CB, and the drain electrode of the adjustment transistor T10 is electrically connected to the first end of the adjustment capacitor C2.

The second end of the adjustment capacitor C2 is electrically connected to the first node N1;

The second node control circuit 13 includes a first control transistor T11, a control capacitor C1, a second control transistor T8, a node control transistor TO, and a third control transistor T9, wherein, The first end of the control capacitor C1 is electrically connected to the third node N3, and the second end of the control capacitor C1 is electrically connected to the fifth node N5;

The gate electrode of the first control transistor T11 is electrically connected to the third node N3, the drain electrode of the first control transistor T11 is electrically connected to the fifth node N5, and the source electrode of the first control transistor T11 is electrically connected to the second clock signal terminal CB;

The gate electrode of the second control transistor T8 is electrically connected to the second clock signal terminal CB, the source electrode of the second control transistor T8 is electrically connected to the fifth node N5, and the drain electrode of the second control transistor T8 is electrically connected to the second node N2;

The gate electrode of the third control transistor T9 is electrically connected to the first node N1, and the source electrode of the third control transistor T9 is electrically connected to the high voltage terminal V01;

The gate electrode of the node control transistor TO is electrically connected to the first clock signal terminal CK, the source electrode of the node control transistor TO is electrically connected to the drain electrode of the third control transistor T9, and the drain electrode of the node control transistor TO is electrically connected to the second node N2;

The third node control circuit 15 includes a fourth control transistor T2, a fifth control transistor T5, and a sixth control transistor T6, wherein, The gate electrode of the fourth control transistor T2 is electrically connected to the first clock signal terminal CK, the source electrode of the fourth control transistor T2 is electrically connected to the low voltage terminal V02, and the drain electrode of the fourth control transistor T2 is electrically connected to the third node N3;

The gate electrode of the fifth control transistor T5 is electrically connected to the first node N1, the source electrode of the fifth control transistor T5 is electrically connected to the high voltage terminal V01, and the drain electrode of the fifth control transistor T5 is electrically connected to the fourth node N4;

The gate electrode of the sixth control transistor T6 is electrically connected to the second clock signal terminal CB, the source electrode of the sixth control transistor T6 is electrically connected to the fourth node N4, and the drain electrode of the sixth control transistor T6 is electrically connected to the third node N3;

The first node control circuit 16 includes a seventh control transistor T1 and an eighth control transistor T7, wherein, The gate electrode of the seventh control transistor T1 is electrically connected to the first clock signal terminal CK, the source electrode of the seventh control transistor T1 is electrically connected to the input terminal I1, and the drain electrode of the seventh control transistor T1 is electrically connected to the first node N1;

The gate electrode of the eighth control transistor T7 is electrically connected to the fourth node N4, the drain electrode of the eighth control transistor T7 is electrically connected to the first node N1, and the source electrode of the eighth control transistor T7 is electrically connected to the high voltage terminal V01;

The output circuit 17 includes a first output transistor T3 and a second output transistor T4;

The gate electrode of the first output transistor T3 is electrically connected to the first node N1, the source electrode of the first output transistor T3 is electrically connected to the low voltage terminal V02, and the drain electrode of the first output transistor T3 is electrically connected to the driving voltage signal terminal O1;

The gate electrode of the second output transistor T4 is electrically connected to the second node N2, the drain electrode of the second output transistor T4 is electrically connected to the driving voltage signal terminal O1, and the source electrode of the second output transistor T4 is electrically connected to the high voltage terminal V01;

The first tank circuit 12 includes a first storage capacitor C4, and the second tank circuit 14 includes a second storage capacitor C3;

The first end of the first storage capacitor C4 is electrically connected to the first node N1, and the second end of the first storage capacitor C4 is electrically connected to the low voltage terminal V02;

The first end of the second storage capacitor C3 is electrically connected to the second node N2, and the second end of the second storage capacitor C3 is electrically connected to the high voltage terminal V01.

In at least one embodiment of the present disclosure, the high voltage terminal may provide a high voltage signal, and the low voltage terminal may provide a low voltage signal.

The third embodiment of the shift register unit described in the present disclosure is a shift register unit in a light emitting control signal generating circuit, which is used to generate a light emitting control signal.

In the third embodiment of the shift register unit described in the present disclosure, all the transistors are p-type thin film transistors, but it is not limited thereto.

The difference between the third embodiment of the shift register unit described in the present disclosure and the first embodiment described in the present disclosure is that a node control transistor T0 is added.

Figure 17:
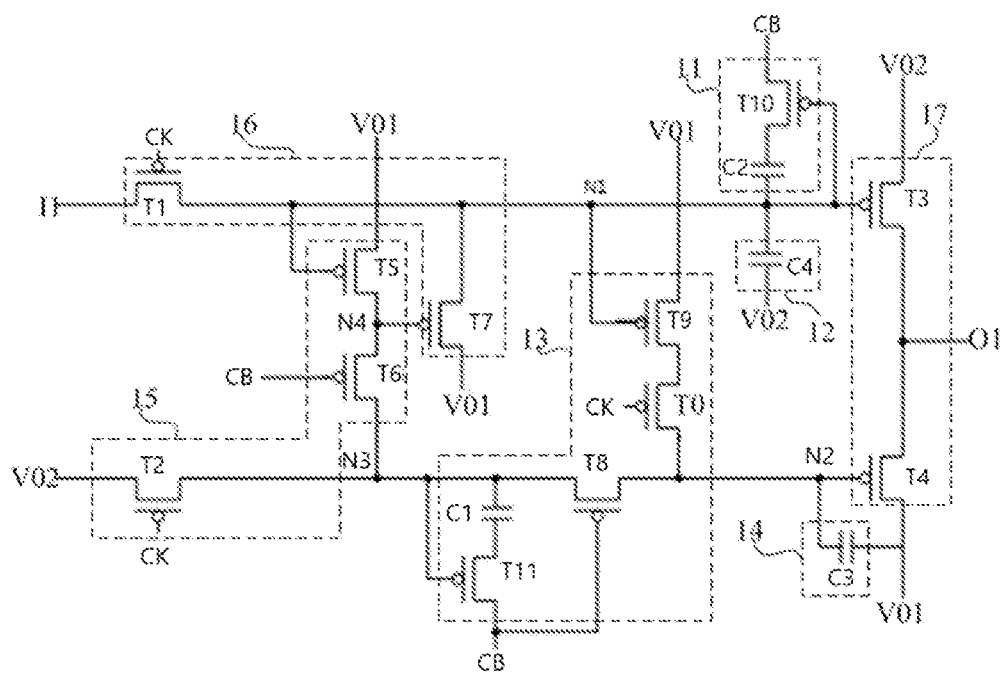
FIG. 17 is a circuit diagram of the shift register unit according to the fourth embodiment of the present disclosure.

When the shift register unit described in the third embodiment of the present disclosure is in operation, CK provides a low voltage signal in the first time period t1, the third time period t3, the fifth time period t5, and the seventh time period t7, and T0 is turned on;

In the second time period t2, the fourth time period t4, the sixth time period t6, and the eighth time period t8, CK provides a high voltage signal, and T0 is turned off;

In the first time period t1, the potential of N1 is at a low voltage, T0 is turned on, and T9 is turned on, then T0 being turned on will not affect the potential of N2;

In the second time period t2, the potential of N1 is a low voltage, T9 is turned on, and T0 is turned off, but since T8 is turned on and the potential of N3 is a high voltage, the potential of N2 can be maintained at a high voltage;

In the third time period t3, the potential of N1 is a high voltage, T0 is turned on, and T9 is turned off, then T0 being turned on will not affect the potential of N2;

In the fourth time period t4, the potential of N1 is high voltage, T9 is turned off, and T0 is turned off;

In the fifth time period t5, the potential of N1 is a high voltage, T0 is turned on, and T9 is turned off, then T0 being turned on will not affect the potential of N2;

In the sixth time period t6, the potential of N1 is a high voltage, T9 is turned off, and T0 is turned off;

In the seventh time period t7, the potential of N1 is a low voltage, T9 is turned on, and T0 is turned on;

In the eighth time period t8, the potential of N1 is a low voltage, T9 is turned on, and T0 is turned off, but since T8 is turned on and the potential of N3 is a high voltage, the potential of N2 can be maintained at a high voltage. As shown in FIG. 17, the difference between the fourth embodiment of the shift register unit described in the present disclosure and the third embodiment of the shift register unit described in the present disclosure is as follows: the position of C1;

As shown in FIG. 17, the drain electrode of T2 and the drain electrode of T6 are directly electrically connected to N3, one end of C1 is electrically connected to N3, and the other end of C1 is electrically connected to T11.

Figure 18:
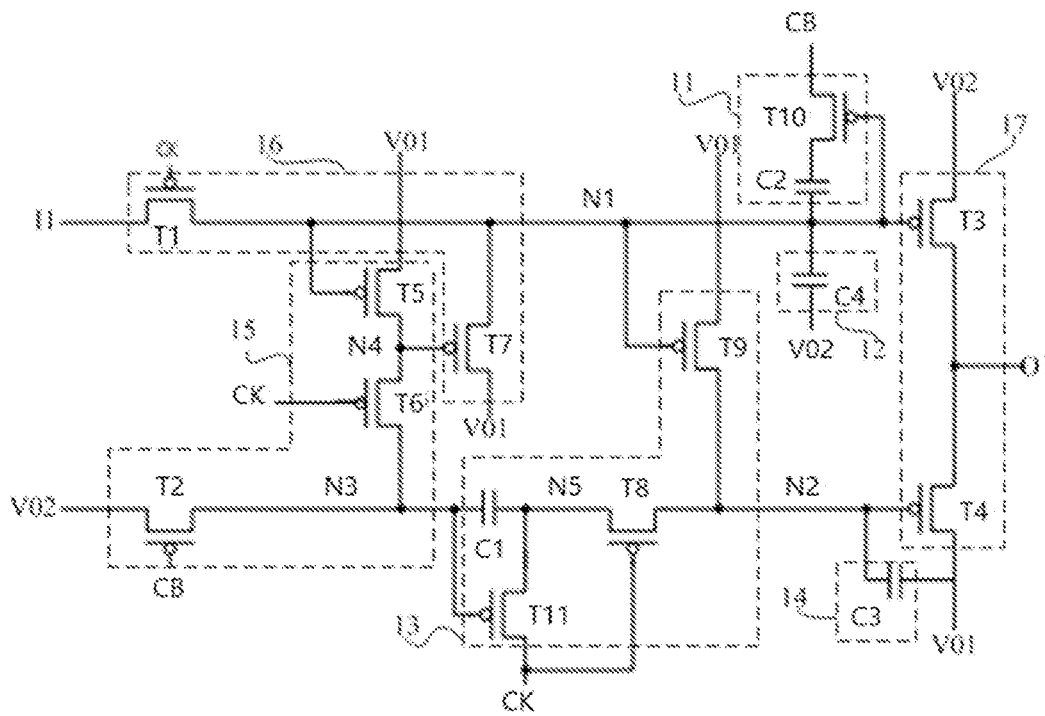
FIG. 18 is a circuit diagram of the shift register unit according to the fifth embodiment of the present disclosure.

As shown in FIG. 18, on the basis of the embodiment of the shift register unit described in FIG. 3, in the fifth embodiment of the shift register unit described in the present disclosure, the first node potential adjustment circuit 11 includes an adjustment transistor T10 and an adjustment capacitor C2.

The gate electrode of the adjustment transistor T10 is electrically connected to the first node N1, the source electrode of the adjustment transistor T10 is electrically connected to the second clock signal terminal CB, and the drain electrode of the adjustment transistor T10 is electrically connected to the first end of the adjustment capacitor C1;

The second end of the adjustment capacitor C1 is electrically connected to the first node N1;

The second node control circuit 13 includes a first control transistor T11, a control capacitor C1, a second control transistor T8, and a third control transistor T9, wherein, The first end of the control capacitor C1 is electrically connected to the third node N3, and the second end of the control capacitor C1 is electrically connected to the fifth node N5;

The gate electrode of the first control transistor T11 is electrically connected to the third node N3, the drain electrode of the first control transistor T11 is electrically connected to the fifth node N5, and the source electrode of the first control transistor T11 is electrically connected to the first clock signal terminal CK;

The gate electrode of the second control transistor T8 is electrically connected to the second clock signal terminal CB, the source electrode of the second control transistor T8 is electrically connected to the fifth node N5, and the drain electrode of the second control transistor T8 is electrically connected to the second node N2;

The gate electrode of the third control transistor T9 is electrically connected to the first node N1, the source electrode of the third control transistor T9 is electrically connected to the high voltage terminal V01, and the drain electrode of the third control transistor T9 is electrically connected to the second node N2;

The third node control circuit 15 includes a fourth control transistor T2, a fifth control transistor T5, and a sixth control transistor T6, wherein, The gate electrode of the fourth control transistor T2 is electrically connected to the second clock signal terminal CB, the source electrode of the fourth control transistor T2 is electrically connected to the low voltage terminal V02, and the drain electrode of the fourth control transistor T2 is electrically connected to the third node N3;

The gate electrode of the fifth control transistor T5 is electrically connected to the first node N1, the source electrode of the fifth control transistor T5 is electrically connected to the high voltage terminal V01, and the drain electrode of the fifth control transistor T5 is electrically connected to the fourth node N4;

The gate electrode of the sixth control transistor T6 is electrically connected to the first clock signal terminal CK, the source electrode of the sixth control transistor T6 is electrically connected to the fourth node N4, and the drain electrode of the sixth control transistor T6 is electrically connected to the third node N3;

The first node control circuit 16 includes a seventh control transistor T1 and an eighth control transistor T7, wherein, The gate electrode of the seventh control transistor T1 is electrically connected to the first clock signal terminal CK, the source electrode of the seventh control transistor T1 is electrically connected to the input terminal I1, and the drain electrode of the seventh control transistor T1 is electrically connected to the first node N1;

The gate electrode of the eighth control transistor T7 is electrically connected to the fourth node N4, the drain electrode of the eighth control transistor T7 is electrically connected to the first node N1, and the source electrode of the eighth control transistor T7 is electrically connected to the high voltage terminal V01;

The output circuit 17 includes a first output transistor T3 and a second output transistor T4;

The gate electrode of the first output transistor T3 is electrically connected to the first node N1, the source electrode of the first output transistor T3 is electrically connected to the low voltage terminal V02, and the drain electrode of the first output transistor T3 is electrically connected to the driving voltage signal terminal O1;

The gate electrode of the second output transistor T4 is electrically connected to the second node N2, the drain electrode of the second output transistor T4 is electrically connected to the driving voltage signal terminal O1, and the source electrode of the second output transistor T4 is electrically connected to the high voltage terminal V01;

The first tank circuit 12 includes a first storage capacitor C4, and the second tank circuit 14 includes a second storage capacitor C3;

The first end of the first storage capacitor C4 is electrically connected to the first node N1, and the second end of the first storage capacitor C4 is electrically connected to the low voltage terminal V02;

The first end of the second storage capacitor C3 is electrically connected to the second node N2, and the second end of the second storage capacitor C3 is electrically connected to the high voltage terminal V01.

In at least one embodiment of the present disclosure, the high voltage terminal may provide a high voltage signal, and the low voltage terminal may provide a low voltage signal.

The fifth embodiment of the shift register unit described in the present disclosure is a shift register unit in a light emitting control signal generating circuit, which is used to generate a light emitting control signal.

In the fifth embodiment of the shift register unit described in the present disclosure, all the transistors are p-type thin film transistors, but not limited to this.

The difference between the fifth embodiment of the shift register unit described in the present disclosure and the first embodiment of the shift register unit described in the present disclosure is as follows: the gate electrode of T2 is electrically connected to CB, and the gate electrode of T6 is electrically connected to CK, the source electrode of T11 is electrically connected to CK.

Figure 19:
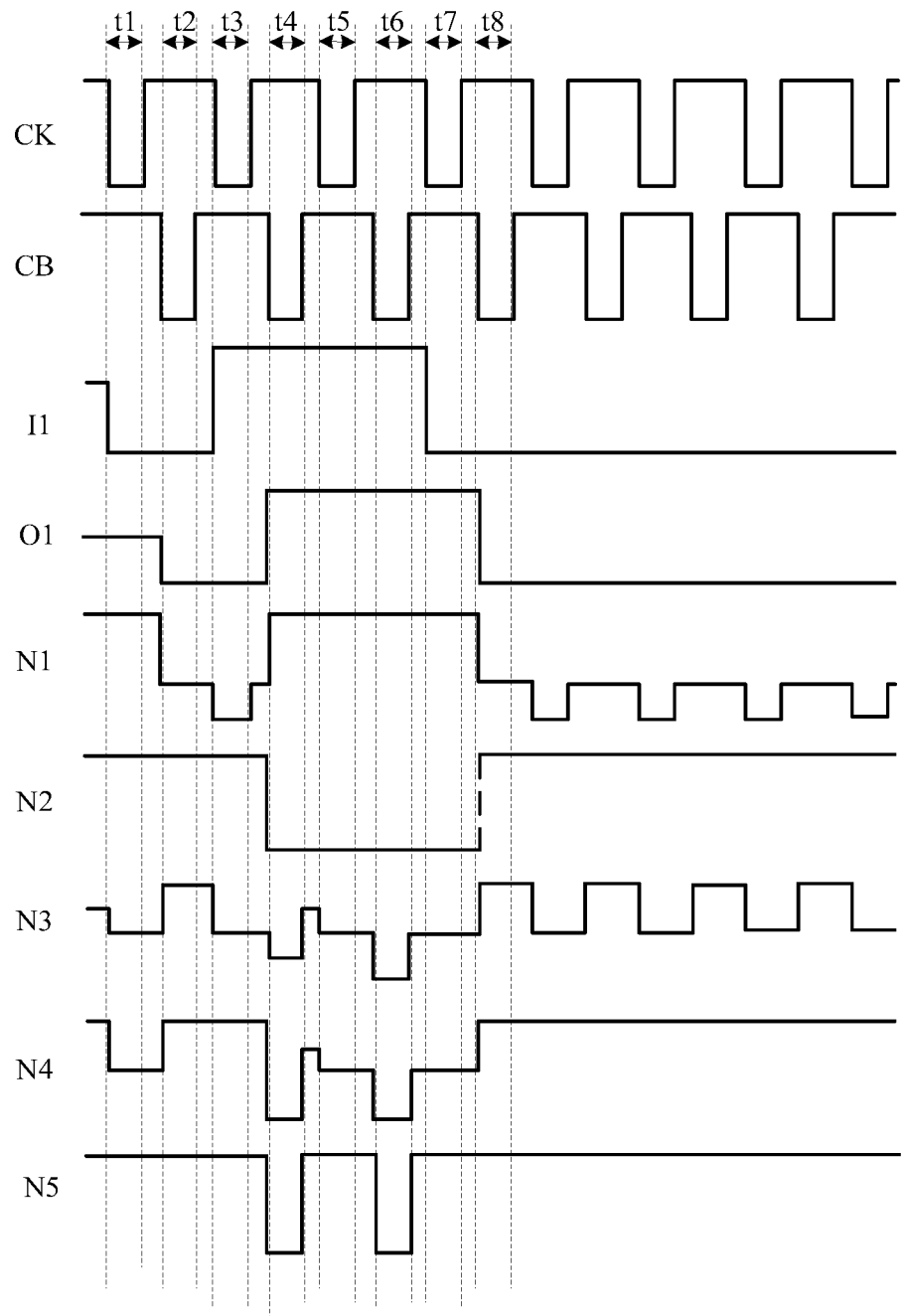
FIG. 19 is a first working timing diagram of the shift register unit according to the fifth embodiment of the present disclosure.

As shown in FIG. 19, in the first case, when the fifth embodiment of the shift register unit described in the present disclosure is working, In the first time period t1, CK provides a low voltage signal, CB provides a high voltage signal, I1 provides a low voltage signal, T1 is turned off, T2 is turned on, and T6 is turned off, the potential of N3 is a low voltage, and the potential of N1 is maintained at a high voltage, T11 is turned on, T8 is turned off, the potential of N2 is maintained at a high voltage, O1 continues to output the voltage signal of the previous time period; since T5 and T6 are turned off, N4 is floating at this time;

In the second time period t2, CK provides a high voltage signal, CB provides a low voltage signal, I1 provides a low voltage signal, T1 is turned on, T2 is turned off, the potential of N1 is low voltage, T9 is turned on, T5 is turned on, T6 is turned on, the potential of N3 is a high voltage, and T8 is turned off, the potential of N2 is a high voltage, T11 is turned off, T10 is turned on, T3 is turned on, T4 is turned off, O1 outputs a low voltage; T5 is turned on, T6 is turned on, and the potential of N4 is a high voltage;

In the third time period t3, CK provides a low voltage signal, CB provides a high voltage signal, I1 provides a high voltage signal, T1 is turned off, T2 is turned on, the potential of N3 is a low voltage, and T10 is turned on. The voltage signal provided by CK is changed from a high voltage signal of the previous time period to a low voltage signal, the potential of N1 is further pulled down, so that T3 can be fully turned on and O1 outputs a low voltage; T11 is turned on, T8 is turned off, T9 is turned on, and the potential of N2 is a high voltage; T5 is turned on, T6 is turned off, and the potential of N4 is a high voltage; at this time, since T3 is completely turned on, the voltage value of the voltage signal output by O1 is VL;

In the fourth time period t4, CK provides a high voltage signal, CB provides a low voltage signal, I1 provides a high voltage signal, T1 is turned on, T2 is turned off, the potential of N1 is high voltage, T5 is turned off, T9 is turned off, T10 is turned off, T3 is turned off, T6 is turned on, T11 is turned on, the second clock signal provided by CB changes from a high voltage signal in the previous period to a low voltage signal, the potential of N3 is further pulled down, the potential of N4 is also a low voltage, T8 is turned on, and the potential of N2 is low voltage, T4 is turned on, T3 is turned off, and O1 provides a high voltage;

In the fifth time period t5, CK provides a low voltage signal, CB provides a high voltage signal, I1 provides a high voltage signal, T2 is turned on, T1 is turned off, the potential of N3 is a low voltage, T6 is turned off, and the potential of N1 is maintained at a high voltage, T5 is turned off, N4 is floating, T8 is turned off, the potential of N2 is maintained at a low voltage, T3 is turned off, T4 is turned on, O1 outputs a high voltage;

In the sixth time period t6, CK provides a high voltage signal, CB provides a low voltage signal, I1 provides a high voltage signal, T1 is turned off, T2 is turned on, the potential of N1 is a high voltage, T9 is turned off, T5 is turned off, T6 is turned on, and T11 is turned on. Since the second clock signal provided by CB jumps from a high voltage signal in the previous period to a low voltage signal, the potential of N3 is further pulled down, the potential of N4 is also a low voltage, T8 is turned on, and the potential of N2 is a low voltage, T4 is turned on, T3 is turned off, O1 provides a high voltage;

In the seventh time period t7, CK provides a low voltage signal, CB provides a high voltage signal, I1 provides a low voltage signal, T1 is turned off, T2 is turned on, the potential of N3 is a low voltage, T6 is turned off, and the potential of N1 is maintained at a high voltage, T11 is turned on, T8 is turned off, T9 is turned off, the potential of N2 is maintained at a high voltage, and O1 continues to output a high voltage;

In the eighth time period t8, CK provides a high voltage signal, CB provides a low voltage signal, I1 provides a low voltage signal, T1 is turned on, T2 is turned off, the potential of N1 is a low voltage, T5 and T6 are turned on, and the potentials of N4 and N3 are high voltages, T8 is turned on, T9 is turned on, the potential of N2 is a high voltage, T3 is turned on, T4 is turned off, and O1 outputs a low voltage.

As shown in FIG. 19, the pulse width of the input signal is the same as the pulse width of the light-emitting control signal output by O1, and O1 can be used as the input end of the adjacent next-stage of shift register unit, but it is not limited to this.

Figure 20:
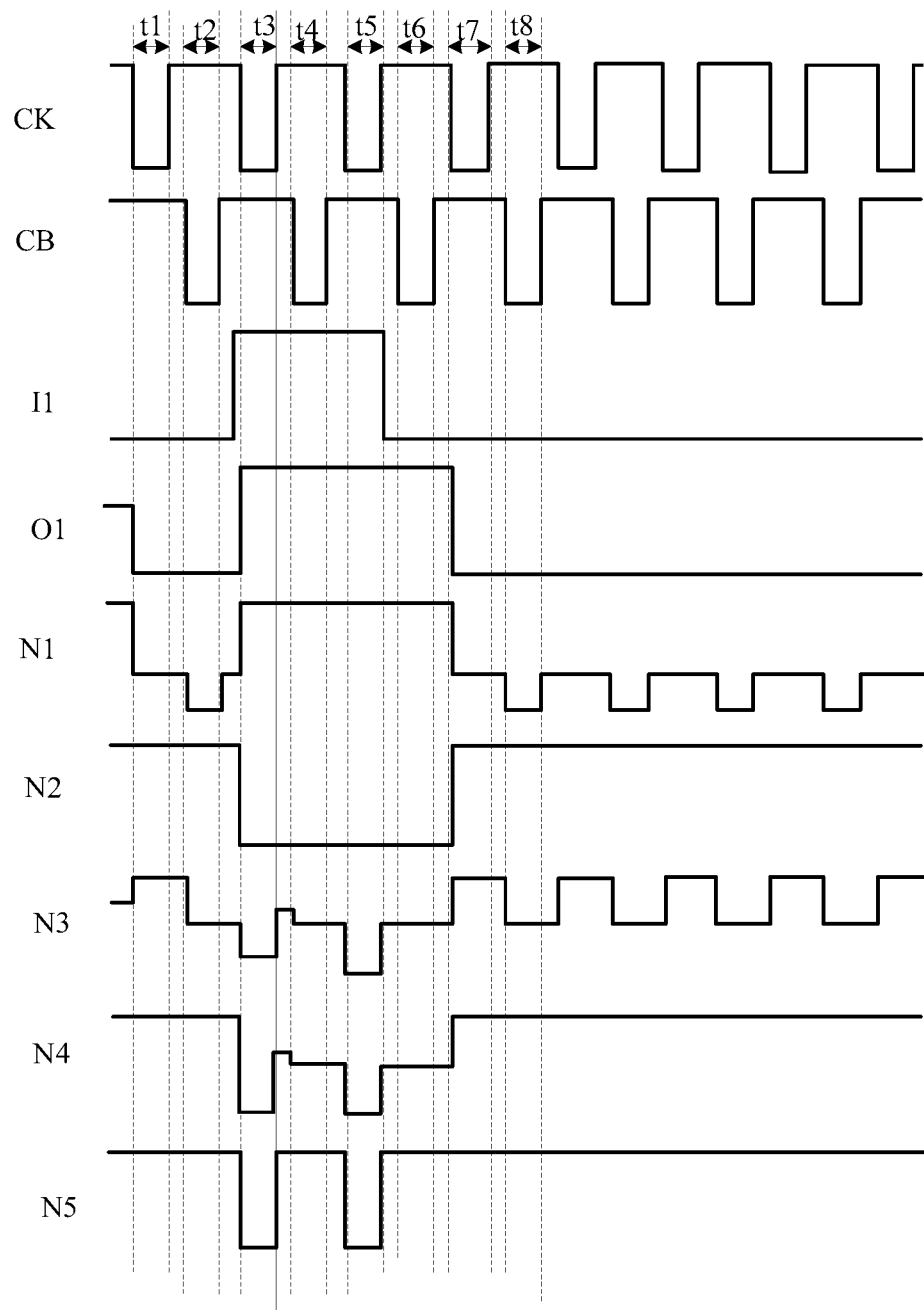
FIG. 20 is a second working timing diagram of the shift register unit according to the fifth embodiment of the present disclosure.

As shown in FIG. 20, in the second case, when the shift register unit described in the fifth embodiment of the present disclosure is working, In the first time period t1, CK provides a low voltage signal, CB provides a high voltage signal, I1 provides a low voltage signal, T1 is turned off, T2 is turned on, and T6 is turned off, the potential of N3 is a low voltage, and the potential of N1 is maintained at a high voltage, T11 is turned on, T8 is turned off, the potential of N2 is maintained at a high voltage, O1 continues to output the voltage signal of the previous period; because T5 and T6 are turned off, N4 is floating at this time;

In the second time period t2, CK provides a high voltage signal, CB provides a low voltage signal, I1 provides a low voltage signal, T1 is turned on, T2 is turned off, the potential of N1 is low voltage, T9 is turned on, T5 is turned on, T6 is turned on, and the potential of N3 is a high voltage, T8 is turned off, the potential of N2 is high voltage, T11 is turned off, T10 is turned on, T3 is tuned on, T4 is tuned off, O1 outputs a low voltage; T5 is turned on, T6 is turned on, and the potential of N4 is a high voltage;

In the third time period t3, CK provides a low voltage signal, CB provides a high voltage signal, I1 provides a high voltage signal, T1 is turned off, T2 is turned on, the potential of N3 is a low voltage, and T10 is turned on. The voltage signal provided by CK is changed from the high voltage in the previous time period to a low voltage signal, the potential of N1 is further pulled down, so that T3 can be fully turned on and O1 outputs a low voltage; T11 is turned on, T8 is turned off, T9 is turned on, and the potential of N2 is a high voltage; T5 is turned on, T6 is turned off, and the potential of N4 is a high voltage; at this time, since N1 is completely turned on, the voltage value of the voltage signal output by O1 is VL;

In the fourth time period t4, CK provides a high voltage signal, CB provides a low voltage signal, I1 provides a high voltage signal, T1 is turned on, T2 is turned off, the potential of N1 is a high voltage, T5 is turned off, T9 is turned off, T10 is turned off, T3 is turned off, T6 is turned on, T11 is turned on, the second clock signal provided by CB jumps from the high voltage signal of the previous period to a low voltage signal, the potential of N3 is further pulled down, the potential of N4 is also a low voltage, T8 is turned on, and the potential of N2 is a low voltage, T4 is turned on, T3 is turned off, and O1 provides a high voltage;

In the fifth time period t5, CK provides a low voltage signal, CB provides a high voltage signal, I1 provides a high voltage signal, T2 is turned on, T1 is turned off, the potential of N3 is a low voltage, T6 is turned off, and the potential of N1 is maintained at a high voltage, T5 is turned off, N4 is floating, T8 is turned off, the potential of N2 is maintained at a low voltage, T3 is turned off, T4 is turned on, O1 outputs a high voltage;

In the sixth time period t6, CK provides a high voltage signal, CB provides a low voltage signal, I1 provides a low voltage signal, T1 is turned off, T2 is turned on, the potential of N1 is a high voltage, T9 is turned off, T5 is turned off, T6 is turned on, and T11 is turned on. Since the second clock signal provided by CB jumps from a high voltage signal in the previous time period to a low voltage signal, the potential of N3 is further pulled down, the potential of N4 is also a low voltage, T8 is turned on, and the potential of N2 is a low voltage, T4 is turned on, T3 is turned off, O1 provides a high voltage;

In the seventh time period t7, CK provides a low voltage signal, CB provides a high voltage signal, I1 provides a low voltage signal, T1 is turned off, T2 is turned on, the potential of N3 is a low voltage, T6 is turned off, and the potential of N1 is maintained at a high voltage, T11 is turned on, T8 is turned off, T9 is turned off, the potential of N2 is maintained at a high voltage, and O1 continues to output a high voltage;

In the eighth time period t8, CK provides a high voltage signal, CB provides a low voltage signal, I1 provides a low voltage signal, T1 is turned on, T2 is turned off, the potential of N1 is a low voltage, T5 and T6 are turned on, and the potentials of N4 and N3 are a high voltage, T8 is turned on, T9 is turned on, the potential of N2 is a high voltage, T3 is turned on, T4 is turned off, O1 outputs a low voltage.

As shown in FIG. 20, the pulse width of the input signal is different from the pulse width of the light-emitting control signal output by O1, but it is not limited to this.

Figure 21:
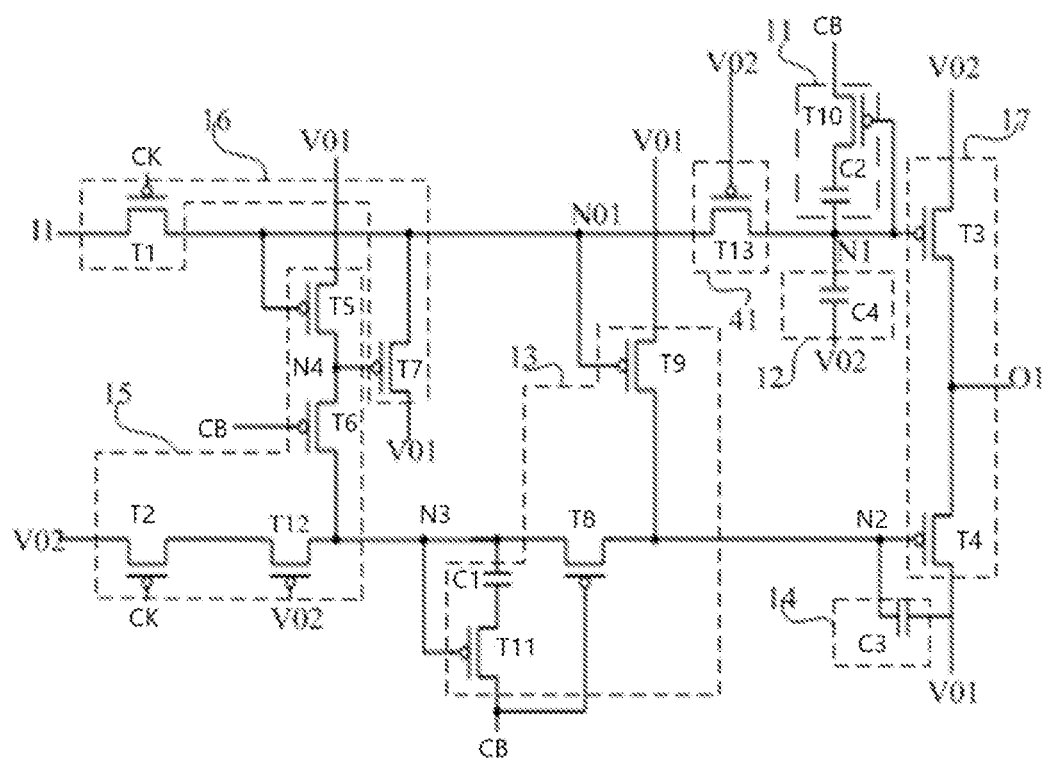
FIG. 21 is a circuit diagram of the shift register unit according to the sixth embodiment of the present disclosure.

As shown in FIG. 21, on the basis of the embodiment of the shift register unit described in FIG. 4, in the sixth embodiment of the shift register unit described in the present disclosure, the first isolation circuit 41 includes a first isolation transistor T13.

The gate electrode of T13 is connected to the low voltage terminal V02, the source electrode of T13 is electrically connected to N01, and the drain electrode of T13 is electrically connected to N1;

The first node potential adjustment circuit 11 includes an adjustment transistor T10 and an adjustment capacitor C2, wherein, The gate electrode of the adjustment transistor T10 is electrically connected to the first node N1, the source electrode of the adjustment transistor T10 is electrically connected to the second clock signal terminal CB, and the drain electrode of the adjustment transistor T10 is electrically connected to the first terminal of the adjustment capacitor C2.

The second end of the adjustment capacitor C2 is electrically connected to the first node N1;

The second node control circuit 13 includes a first control transistor T11, a control capacitor C1, a second control transistor T8, and a third control transistor T9, wherein, The first end of the control capacitor C1 is electrically connected to the third node N3, and the second end of the control capacitor C1 is electrically connected to the fifth node N5;

The gate electrode of the first control transistor T11 is electrically connected to the third node N3, the drain electrode of the first control transistor T11 is electrically connected to the fifth node N5, and the source electrode of the first control transistor T11 is electrically connected to the second clock signal terminal CB;

The gate electrode of the second control transistor T8 is electrically connected to the second clock signal terminal CB, the source electrode of the second control transistor T8 is electrically connected to the fifth node N5, and the drain electrode of the second control transistor T8 is electrically connected to the second node N2;

The gate electrode of the third control transistor T9 is electrically connected to the first isolation node N01, the source electrode of the third control transistor T9 is electrically connected to the high voltage terminal V01, and the drain electrode of the third control transistor T9 is electrically connected to the second node N2;

The third node control circuit 15 includes a fourth control transistor T2, a third isolation transistor T12, a fifth control transistor T5, and a sixth control transistor T6, wherein, The gate electrode of the fourth control transistor T2 is electrically connected to the first clock signal terminal CK, and the source electrode of the fourth control transistor T2 is electrically connected to the low voltage terminal V02;

The gate electrode of the third isolation transistor T12 is electrically connected to the low voltage terminal V02, the source electrode of the third isolation transistor T12 is electrically connected to the drain electrode of the fourth control transistor T2, and the drain electrode of the third isolation transistor T12 is electrically connected to the third node N3;

The gate electrode of the fifth control transistor T5 is electrically connected to the first isolation node N01, the source electrode of the fifth control transistor T5 is electrically connected to the high voltage terminal V01, and the drain electrode of the fifth control transistor T5 is electrically connected to the fourth node N4;

The gate electrode of the sixth control transistor T6 is electrically connected to the second clock signal terminal CB, the source electrode of the sixth control transistor T6 is electrically connected to the fourth node N4, and the drain electrode of the sixth control transistor T6 is electrically connected to the third node N3;

The first node control circuit 16 includes a seventh control transistor T1 and an eighth control transistor T7, wherein, The gate electrode of the seventh control transistor T1 is electrically connected to the first clock signal terminal CK, the source electrode of the seventh control transistor T1 is electrically connected to the input terminal I1, and the drain electrode of the seventh control transistor T1 is electrically connected to the first isolation node N01;

The gate electrode of the eighth control transistor T7 is electrically connected to the fourth node N4, the drain electrode of the eighth control transistor T7 is electrically connected to the first isolation node N01, and the source electrode of the eighth control transistor T7 is electrically connected to the high voltage terminal V01;

The output circuit 17 includes a first output transistor T3 and a second output transistor T4;

The gate electrode of the first output transistor T3 is electrically connected to the first node N1, the source electrode of the first output transistor T3 is electrically connected to the low voltage terminal V02, and the drain electrode of the first output transistor T3 is electrically connected to the driving voltage signal terminal O1;

The gate electrode of the second output transistor T4 is electrically connected to the second node N2, the drain electrode of the second output transistor T4 is electrically connected to the driving voltage signal terminal O1, and the source electrode of the second output transistor T4 is electrically connected to the high voltage terminal V01;

The first tank circuit 12 includes a first storage capacitor C4, and the second tank circuit 14 includes a second storage capacitor C3;

The first end of the first storage capacitor C4 is electrically connected to the first node N1, and the second end of the first storage capacitor C4 is electrically connected to the low voltage terminal V02;

The first end of the second storage capacitor C3 is electrically connected to the second node N2, and the second end of the second storage capacitor C3 is electrically connected to the high voltage terminal V01.

In at least one embodiment of the present disclosure, the high voltage terminal may provide a high voltage signal, and the low voltage terminal may provide a low voltage signal.

In at least one embodiment of the present disclosure, the control voltage terminal is a low voltage terminal, but it is not limited to this.

The sixth embodiment of the shift register unit described in the present disclosure is the shift register unit in the light emitting control signal generating circuit, which is used to generate the light emitting control signal.

In the sixth embodiment of the shift register unit described in the present disclosure, all the transistors are p-type thin film transistors, but not limited to this.

The difference between the sixth embodiment of the shift register unit described in this disclosure and the second embodiment of the shift register unit described in this disclosure is that T12 and T13 are added.

Figure 22:
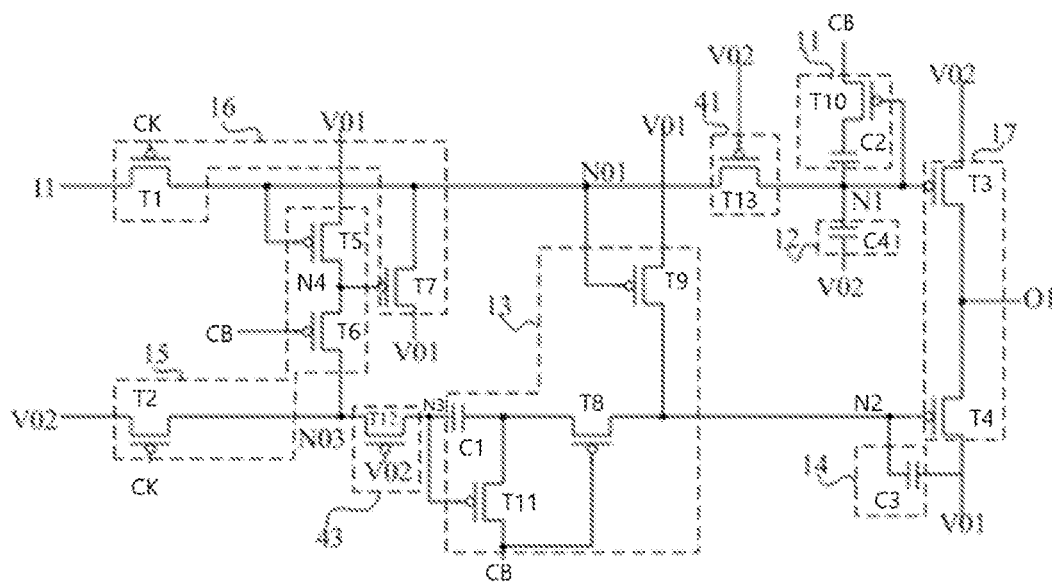
FIG. 22 is a circuit diagram of the shift register unit according to the seventh embodiment of the present disclosure.

In the sixth embodiment of the shift register unit described in the present disclosure, the purpose of adding T13 is to prevent the potential of N1 too low to cause Drain Induced Barrier Lowering (DIBL) of the transistor electrically connected to N1, so that the threshold voltage of the transistor electrically connected to N1 drifts, resulting in the situation that the transistor electrically connected to N1 cannot be normally turned on or off in other working stages;

The purpose of increasing T12 is to prevent the threshold voltage of the transistor electrically connected to the potential of N3 from drifting, resulting in the situation that the transistor electrically connected to N3 cannot be normally turned on or off in other working stages. As shown in FIG. 22, on the basis of the embodiment of the shift register unit described in FIG. 5, in the seventh embodiment of the shift register unit described in the present disclosure, the first isolation circuit 41 includes a first isolation transistor T13, and the third isolation circuit 43 includes a third isolation transistor T12.

The gate electrode of T13 is electrically connected to the low voltage terminal V02, the source electrode of T13 is electrically connected to N01, and the drain electrode of T13 is electrically connected to N1;

The gate electrode of T12 is electrically connected to the low voltage terminal V02, the source electrode of T12 is electrically connected to N03, and the drain electrode of T12 is electrically connected to N3;

The first node potential adjustment circuit 11 includes an adjustment transistor T10 and an adjustment capacitor C2, wherein, The gate electrode of the adjustment transistor T10 is electrically connected to the first node N1, the source electrode of the adjustment transistor T10 is electrically connected to the second clock signal terminal CB, and the drain electrode of the adjustment transistor T10 is electrically connected to the first end of the adjustment capacitor C1;

The second end of the adjustment capacitor C1 is electrically connected to the first node N1;

The second node control circuit 13 includes a first control transistor T11, a control capacitor C1, a second control transistor T8, and a third control transistor T9, wherein, The first end of the control capacitor C1 is electrically connected to the third node N3, and the second end of the control capacitor C1 is electrically connected to the fifth node N5;

The gate electrode of the first control transistor T11 is electrically connected to the third node N3, the drain electrode of the first control transistor T11 is electrically connected to the fifth node N5, and the source electrode of the first control transistor T11 is electrically connected to the second clock signal terminal CB;

The gate electrode of the second control transistor T8 is electrically connected to the second clock signal terminal CB, the source electrode of the second control transistor T8 is electrically connected to the fifth node N5, and the drain electrode of the second control transistor T8 is electrically connected to the second node N2;

The gate electrode of the third control transistor T9 is electrically connected to the first isolation node N01, the source electrode of the third control transistor T9 is electrically connected to the high voltage terminal V01, and the drain electrode of the third control transistor T9 is electrically connected to the second node N2;

The third node control circuit 15 includes a fourth control transistor T2, a fifth control transistor T5, and a sixth control transistor T6, wherein, The gate electrode of the fourth control transistor T2 is electrically connected to the first clock signal terminal CK, the source electrode of the fourth control transistor T2 is electrically connected to the low voltage terminal V02, and the drain electrode of the fourth control transistor T2 is electrically connected to the third node N3;

The gate electrode of the fifth control transistor T5 is electrically connected to the first isolation node N01, the source electrode of the fifth control transistor T5 is electrically connected to the high voltage terminal V01, and the drain electrode of the fifth control transistor T5 is electrically connected to the fourth node N4;

The gate electrode of the sixth control transistor T6 is electrically connected to the second clock signal terminal CB, the source electrode of the sixth control transistor T6 is electrically connected to the fourth node N4, and the drain electrode of the sixth control transistor T6 is electrically connected to the third isolation node N03;

The first node control circuit 16 includes a seventh control transistor T1 and an eighth control transistor T7, wherein, The gate electrode of the seventh control transistor T1 is electrically connected to the first clock signal terminal CK, the source electrode of the seventh control transistor T1 is electrically connected to the input terminal I1, and the drain electrode of the seventh control transistor T1 is electrically connected to the first isolation node N01;

The gate electrode of the eighth control transistor T7 is electrically connected to the fourth node N4, the drain electrode of the eighth control transistor T7 is electrically connected to the first isolation node N1, and the source electrode of the eighth control transistor T7 is electrically connected to the high voltage terminal V01;

The output circuit 17 includes a first output transistor T3 and a second output transistor T4;

The gate electrode of the first output transistor T3 is electrically connected to the first node N1, the source electrode of the first output transistor T3 is electrically connected to the low voltage terminal V02, and the drain electrode of the first output transistor T3 is electrically connected to the driving voltage signal terminal O1;

The gate electrode of the second output transistor T4 is electrically connected to the second node N2, the drain electrode of the second output transistor T4 is electrically connected to the driving voltage signal terminal O1, and the source electrode of the second output transistor T4 is electrically connected to the high voltage terminal V01;

The first tank circuit 12 includes a first storage capacitor C4, and the second tank circuit 14 includes a second storage capacitor C3;

The first end of the first storage capacitor C4 is electrically connected to the first node N1, and the second end of the first storage capacitor C4 is electrically connected to the low voltage terminal V02;

The first end of the second storage capacitor C3 is electrically connected to the second node N2, and the second end of the second storage capacitor C3 is electrically connected to the high voltage terminal V01.

In at least one embodiment of the present disclosure, the high voltage terminal may provide a high voltage signal, and the low voltage terminal may provide a low voltage signal.

The seventh embodiment of the shift register unit described in the present disclosure is the shift register unit in the light emitting control signal generating circuit, which is used to generate the light emitting control signal.

In the seventh embodiment of the shift register unit described in the present disclosure, all the transistors are p-type thin film transistors, but not limited to this.

The difference between the seventh embodiment of the shift register unit described in this disclosure and the first embodiment of the shift register unit described in this disclosure is that T13 and T12 are added.

In the seventh embodiment of the shift register unit described in the present disclosure, the purpose of adding T13 is to prevent the potential of N1 too low to cause Drain Induced Barrier Lowering (DIBL) of the transistor electrically connected to N1, so that the threshold voltage of the transistor electrically connected to N1 is drifted, resulting in the situation that the transistor electrically connected to N1 cannot be normally turned on or off in other working stages;

The purpose of increasing T12 is to prevent the threshold voltage of the transistor electrically connected to the potential of N3 from drifting, resulting in the situation that the transistor electrically connected to N3 cannot be normally turned on or off in other working stages.

Figure 23:
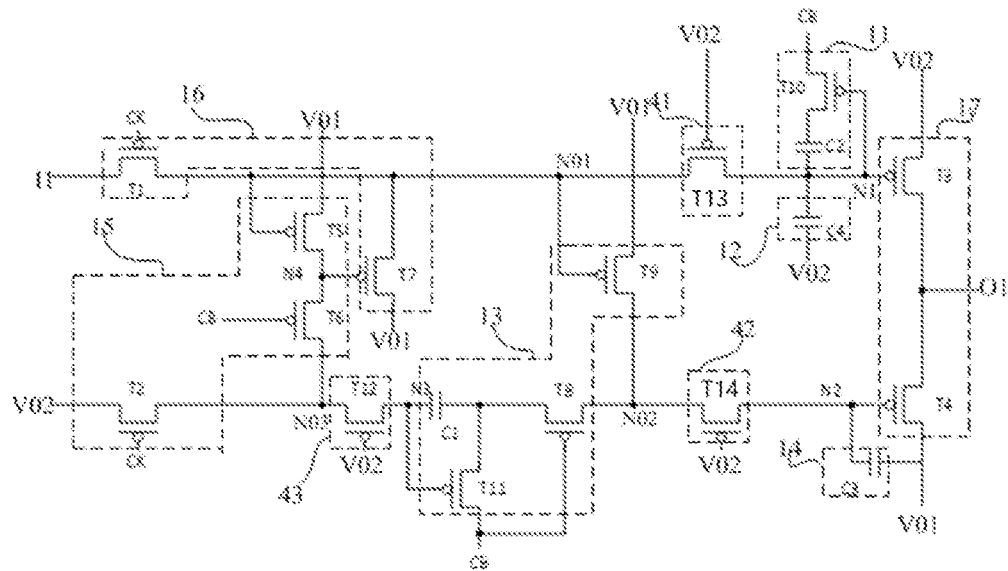
FIG. 23 is a circuit diagram of the shift register unit according to the eighth embodiment of the present disclosure.

As shown in FIG. 23, on the basis of the embodiment of the shift register unit described in FIG. 6, in the eighth embodiment of the shift register unit described in the present disclosure, the first isolation circuit 41 includes a first isolation transistor T13, the third isolation circuit 43 includes a third isolation transistor T12; the second isolation circuit 42 includes a second isolation transistor T14;

The gate electrode of T13 is electrically connected to the low voltage terminal V02, the source electrode of T13 is electrically connected to N01, and the drain electrode of T13 is electrically connected to N1;

The gate electrode of T12 is electrically connected to the low voltage terminal V02, the source electrode of T12 is electrically connected to N03, and the drain electrode of T12 is electrically connected to N3;

The gate electrode of T14 is electrically connected to the low voltage terminal V02, the source electrode of T14 is electrically connected to N02, and the drain electrode of T14 is electrically connected to N2;

The first node potential adjustment circuit 11 includes an adjustment transistor T10 and an adjustment capacitor C2, wherein, The gate electrode of the adjustment transistor T10 is electrically connected to the first node N1, the source electrode of the adjustment transistor T10 is electrically connected to the second clock signal terminal CB, and the drain electrode of the adjustment transistor T10 is electrically connected to the first end of the adjustment capacitor C2;

The second end of the adjustment capacitor C2 is electrically connected to the first node N1;

The second node control circuit 13 includes a first control transistor T11, a control capacitor C1, a second control transistor T8, and a third control transistor T9, wherein, The first end of the control capacitor C1 is electrically connected to the third node N3, and the second end of the control capacitor C1 is electrically connected to the fifth node N5;

The gate electrode of the first control transistor T11 is electrically connected to the third node N3, the drain electrode of the first control transistor T11 is electrically connected to the fifth node N5, and the source electrode of the first control transistor T11 is electrically connected to the second clock signal terminal CB;

The gate electrode of the second control transistor T8 is electrically connected to the second clock signal terminal CB, the source electrode of the second control transistor T8 is electrically connected to the fifth node N5, and the drain electrode of the second control transistor T8 is electrically connected to the second isolation node N02;

The gate electrode of the third control transistor T9 is electrically connected to the first isolation node N01, the source electrode of the third control transistor T9 is electrically connected to the high voltage terminal V01, and the drain electrode of the third control transistor T9 is electrically connected to the second isolation node N02;

The third node control circuit 15 includes a fourth control transistor T2, a fifth control transistor T5, and a sixth control transistor T6, wherein, The gate electrode of the fourth control transistor T2 is electrically connected to the first clock signal terminal CK, the source electrode of the fourth control transistor T2 is electrically connected to the low voltage terminal V02, and the drain electrode of the fourth control transistor T2 is electrically connected to the third node N3;

The gate electrode of the fifth control transistor T5 is electrically connected to the first isolation node N01, the source electrode of the fifth control transistor T5 is electrically connected to the high voltage terminal V01, and the drain electrode of the fifth control transistor T5 is electrically connected to the fourth Node N4;

The gate electrode of the sixth control transistor T6 is electrically connected to the second clock signal terminal CB, the source electrode of the sixth control transistor T6 is electrically connected to the fourth node N4, and the drain electrode of the sixth control transistor T6 is electrically connected to the third isolation node N03;

The first node control circuit 16 includes a seventh control transistor T1 and an eighth control transistor T7, wherein, The gate electrode of the seventh control transistor T1 is electrically connected to the first clock signal terminal CK, the source electrode of the seventh control transistor T1 is electrically connected to the input terminal I1, and the drain electrode of the seventh control transistor T1 is electrically connected to the first isolation node N01;

The gate electrode of the eighth control transistor T7 is electrically connected to the fourth node N4, the drain electrode of the eighth control transistor T7 is electrically connected to the first isolation node N1, and the source electrode of the eighth control transistor T7 is electrically connected to the high voltage terminal V01;

The output circuit 17 includes a first output transistor T3 and a second output transistor T4;

The gate electrode of the first output transistor T3 is electrically connected to the first node N1, the source electrode of the first output transistor T3 is electrically connected to the low voltage terminal V02, and the drain electrode of the first output transistor T3 is electrically connected to the driving voltage signal terminal O1;

The gate electrode of the second output transistor T4 is electrically connected to the second node N2, the drain electrode of the second output transistor T4 is electrically connected to the driving voltage signal terminal O1, and the source electrode of the second output transistor T4 is electrically connected to the high voltage terminal V01;

The first tank circuit 12 includes a first storage capacitor C4, and the second tank circuit 14 includes a second storage capacitor C3;

The first end of the first storage capacitor C4 is electrically connected to the first node N1, and the second end of the first storage capacitor C4 is electrically connected to the low voltage terminal V02;

The first end of the second storage capacitor C3 is electrically connected to the second node N2, and the second end of the second storage capacitor C3 is electrically connected to the high voltage terminal V01.

In at least one embodiment of the present disclosure, the high voltage terminal may provide a high voltage signal, and the low voltage terminal may provide a low voltage signal.

The eighth embodiment of the shift register unit described in the present disclosure is the shift register unit in the light emitting control signal generating circuit, which is used to generate the light emitting control signal.

In the eighth embodiment of the shift register unit described in the present disclosure, all the transistors are p-type thin film transistors, but not limited to this.

The difference between the sixth embodiment of the shift register unit described in this disclosure and the first embodiment of the shift register unit described in this disclosure is that T13, T12, and T14 are added.

In the eighth embodiment of the shift register unit described in the present disclosure, the purpose of adding T13 is to prevent the potential of N1 too low to cause DIBL in the transistor electrically connected to N1, so that the threshold voltage of the transistor electrically connected to N1 is drifted, resulting in the situation that the transistor electrically connected to N1 cannot be normally turned on or off in other working stages;

The purpose of increasing T12 is to prevent the threshold voltage of the transistor electrically connected to the potential of N3 from drifting, resulting in the situation that the transistor electrically connected to N3 cannot be normally turned on or off in other working stages.

Figure 24:
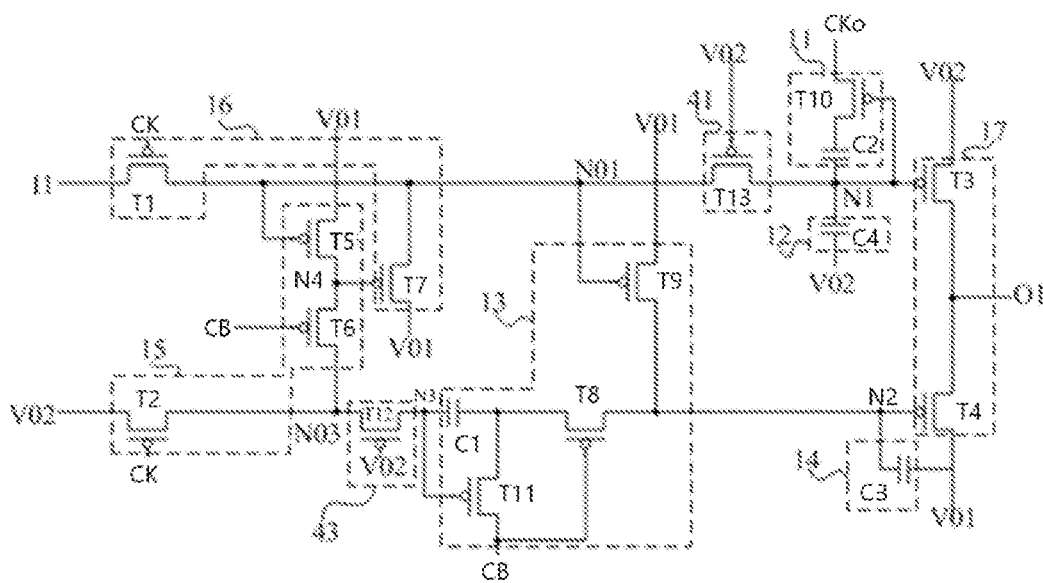
FIG. 24 is a circuit diagram of the shift register unit according to the ninth embodiment of the present disclosure.

The purpose of increasing T14 is to prevent potential of N2 too low to cause DIBL of the transistor electrically connected to N2, so that the threshold voltage of the transistor electrically connected to N2 is drifted, resulting in the situation that the transistor electrically connected to N2 cannot be normally turned on or off in other working stages;

As shown in FIG. 24, the difference between the ninth embodiment of the shift register unit described in the present disclosure and the seventh embodiment of the shift register unit described in the present disclosure is as follows: the source electrode of T10 is connected to the third clock signal terminal CKo.

In at least one embodiment of the present disclosure, the third clock signal provided by CKo is an inverted signal of the second clock signal provided by CK.

Figure 25:
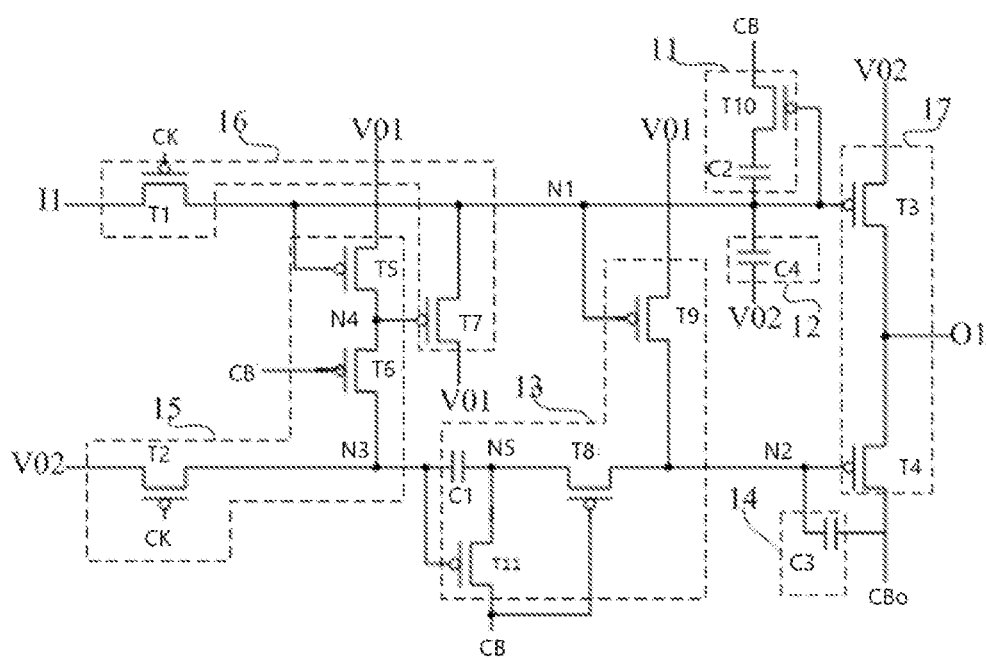
FIG. 25 is a circuit diagram of the shift register unit according to the tenth embodiment of the present disclosure.

As shown in FIG. 25, on the basis of the embodiment of the shift register unit described in FIG. 7, in the tenth embodiment of the shift register unit described in the present disclosure, the first node potential adjustment circuit 11 includes an adjustment transistor T10 and an adjustment capacitor C2, wherein, The gate electrode of the adjustment transistor T10 is electrically connected to the first node N1, the source electrode of the adjustment transistor T10 is electrically connected to the second clock signal terminal CB, and the drain electrode of the adjustment transistor T10 is electrically connected to the first end of the adjustment capacitor C1.

The second end of the adjustment capacitor C1 is electrically connected to the first node N1;

The second node control circuit 13 includes a first control transistor T11, a control capacitor C1, a second control transistor T8, and a third control transistor T9, wherein, The first end of the control capacitor C1 is electrically connected to the third node N3, and the second end of the control capacitor C1 is electrically connected to the fifth node N5;

The gate electrode of the first control transistor T11 is electrically connected to the third node N3, the drain electrode of the first control transistor T11 is electrically connected to the fifth node N5, and the source electrode of the first control transistor T11 is electrically connected to the second clock signal terminal CB;

The gate electrode of the second control transistor T8 is electrically connected to the second clock signal terminal CB, the source electrode of the second control transistor T8 is electrically connected to the fifth node N5, and the drain electrode of the second control transistor T8 is electrically connected to the second node N2;

The gate electrode of the third control transistor T9 is electrically connected to the first node N1, the source electrode of the third control transistor T9 is electrically connected to the high voltage terminal V01, and the drain electrode of the third control transistor T9 is electrically connected to the second node N2;

The third node control circuit 15 includes a fourth control transistor T2, a fifth control transistor T5, and a sixth control transistor T6, wherein, The gate electrode of the fourth control transistor T2 is electrically connected to the first clock signal terminal CK, the source electrode of the fourth control transistor T2 is electrically connected to the low voltage terminal V02, and the drain electrode of the fourth control transistor T2 is electrically connected to the third node N3;

The gate electrode of the fifth control transistor T5 is electrically connected to the first node N1, the source electrode of the fifth control transistor T5 is electrically connected to the high voltage terminal V01, and the drain electrode of the fifth control transistor T5 is electrically connected to the fourth node N4;

The gate electrode of the sixth control transistor T6 is electrically connected to the second clock signal terminal CB, the source electrode of the sixth control transistor T6 is electrically connected to the fourth node N4, and the drain electrode of the sixth control transistor T6 is electrically connected to the third node N3;

The first node control circuit 16 includes a seventh control transistor T1 and an eighth control transistor T7, wherein, The gate electrode of the seventh control transistor T1 is electrically connected to the first clock signal terminal CK, the source electrode of the seventh control transistor T1 is electrically connected to the input terminal I1, and the drain electrode of the seventh control transistor T1 is electrically connected to the first node N1;

The gate electrode of the eighth control transistor T7 is electrically connected to the fourth node N4, the drain electrode of the eighth control transistor T7 is electrically connected to the first node N1, and the source electrode of the eighth control transistor T7 is electrically connected to the high voltage terminal V01;

The output circuit 17 includes a first output transistor T3 and a second output transistor T4;

The gate electrode of the first output transistor T3 is electrically connected to the first node N1, the source electrode of the first output transistor T3 is electrically connected to the low voltage terminal V02, and the drain electrode of the first output transistor T3 is electrically connected to the driving voltage signal terminal O1;

The gate electrode of the second output transistor T4 is electrically connected to the second node N2, the drain electrode of the second output transistor T4 is electrically connected to the driving voltage signal terminal O1, and the source electrode of the second output transistor T4 is electrically connected to the output clock signal terminal CBo;

The first tank circuit 12 includes a first storage capacitor C4, and the second tank circuit 14 includes a second storage capacitor C3;

The first end of the first storage capacitor C4 is electrically connected to the first node N1, and the second end of the first storage capacitor C4 is electrically connected to the low voltage terminal V02;

The first end of the second storage capacitor C3 is electrically connected to the second node N2, and the second end of the second storage capacitor C3 is electrically connected to the output clock signal terminal CBo.

In at least one embodiment of the present disclosure, the high voltage terminal may provide a high voltage signal, and the low voltage terminal may provide a low voltage signal.

The tenth embodiment of the shift register unit described in the present disclosure is a shift register unit in a gate driving circuit, which is used to generate a gate driving signal.

In the tenth embodiment of the shift register unit described in the present disclosure, all the transistors are p-type thin film transistors, but not limited to this.

In at least one embodiment of the present disclosure, the second clock signal provided by the CB is inverted in phases from the output clock signal provided by the CBo, but not limited to this.

In at least one embodiment of the present disclosure, the pulse width of the gate driving signal provided by the shift register unit is smaller than the pulse width of the light emitting control signal provided by the shift register unit, but it is not limited thereto.

Moreover, in at least one embodiment of the present disclosure, when the shift register unit is used to generate a gate driving signal, four clock signals are needed.

Figure 26:
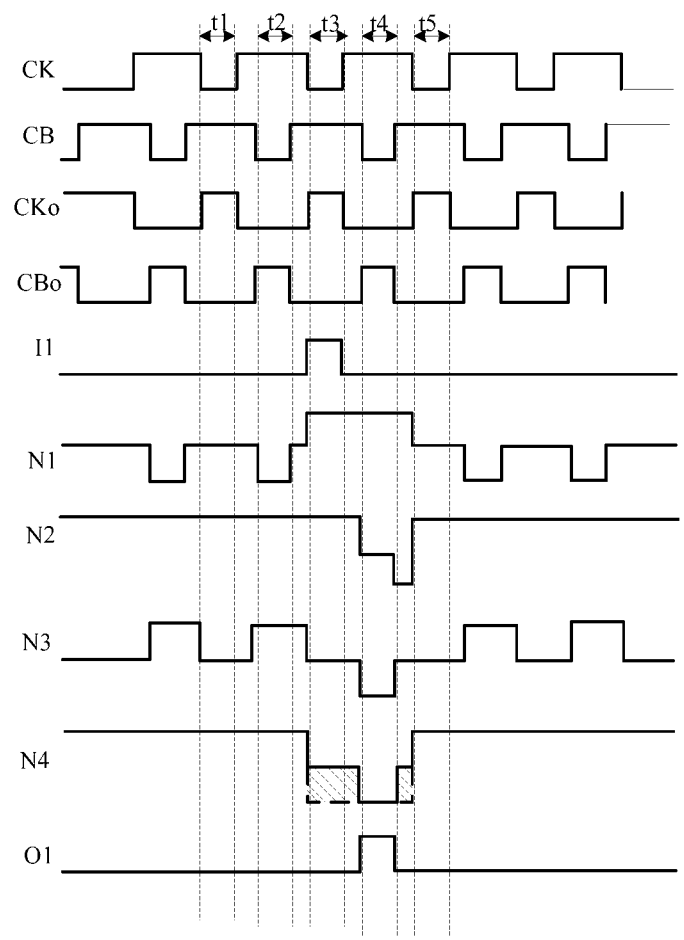
FIG. 26 is a working timing diagram of the shift register unit according to the tenth embodiment of the present disclosure.
Figure 27A:
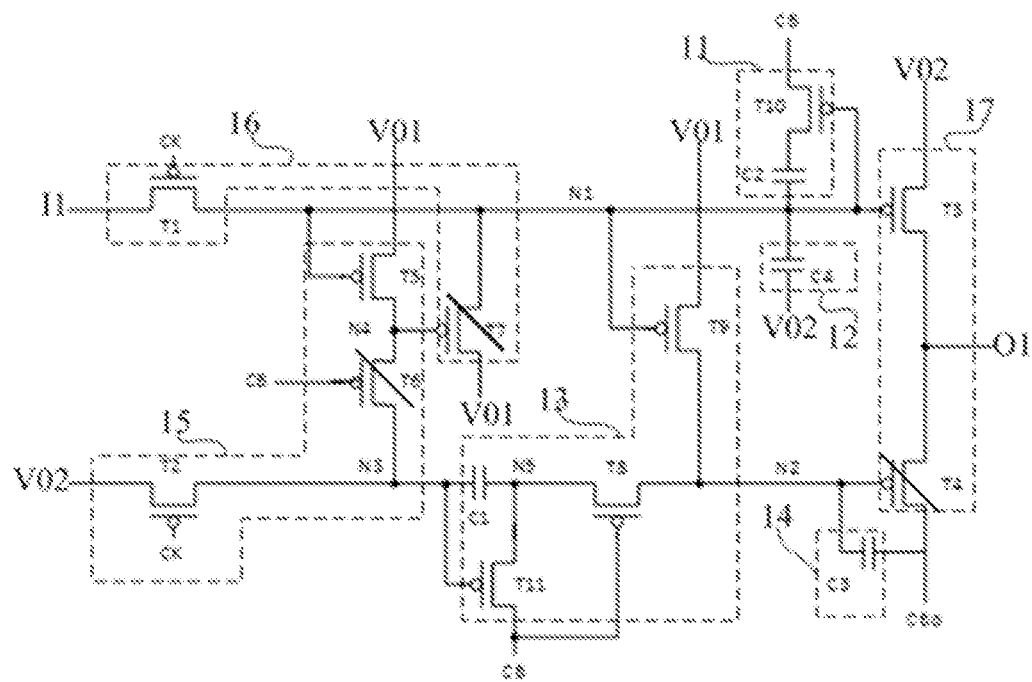
FIG. 27A is a schematic diagram of the circuit state in the first time period t1 of the shift register unit according to the tenth embodiment of the present disclosure.
Figure 27B:
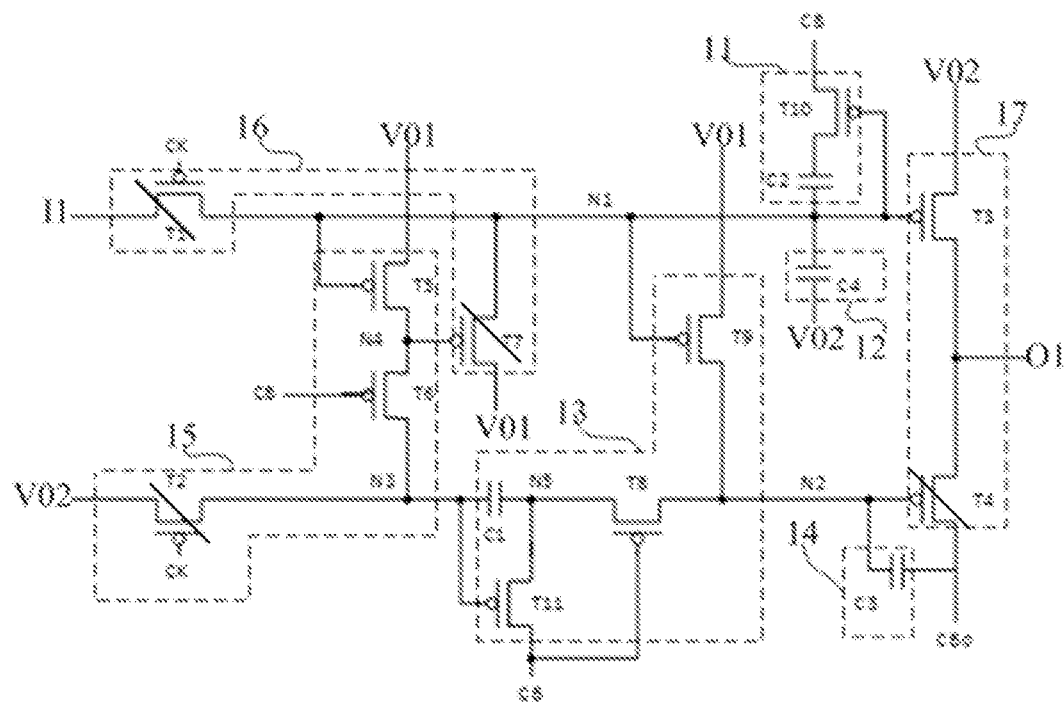
FIG. 27B is a schematic diagram of the circuit state in the second time period t2 of the shift register unit according to the tenth embodiment of the present disclosure.
Figures 27C, 27D:
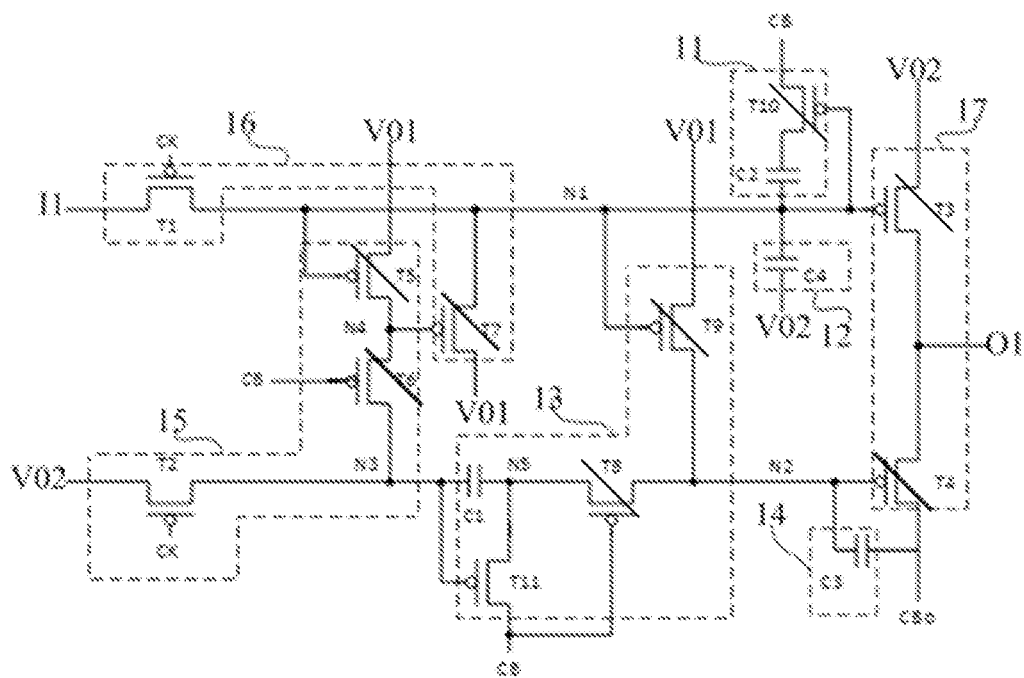
FIG. 27C is a schematic diagram of the circuit state in the third time period t3 of the shift register unit according to the tenth embodiment of the present disclosure.
FIG. 27D is a schematic diagram of the circuit state in the fourth time period t4 of the shift register unit according to the tenth embodiment of the present disclosure.
Figure 27E:
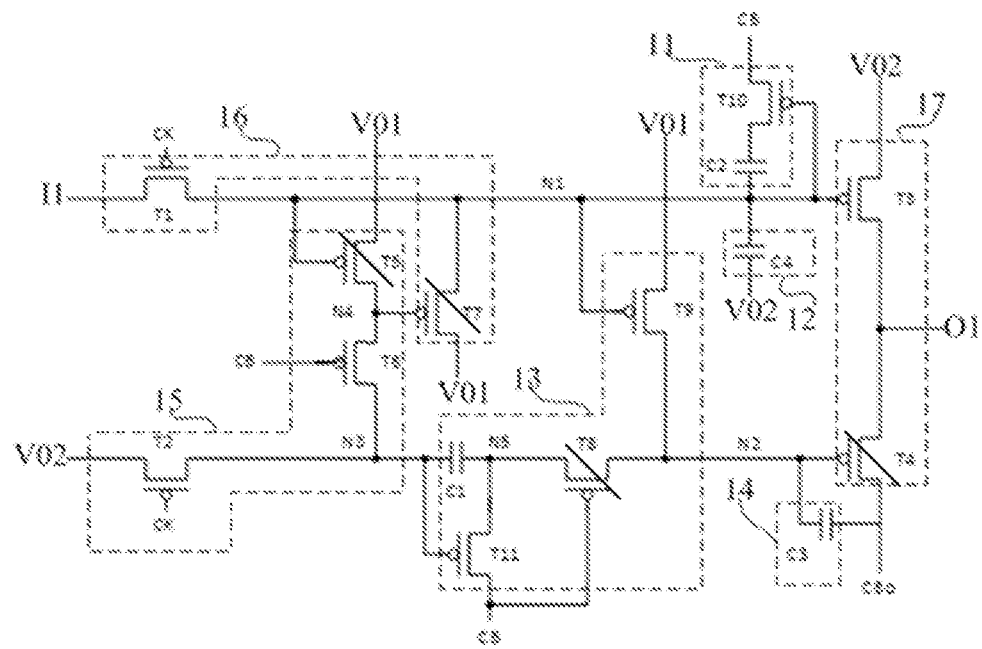
FIG. 27E is a schematic diagram of the circuit state in the fifth time period t5 of the shift register unit according to the tenth embodiment of the present disclosure.

As shown in FIG. 26, when the tenth embodiment of the shift register unit of the present disclosure is in operation, the display period includes a first time period t1, a second time period t2, a third time period t3, a fourth time period t4 and a fifth time period t5;

In the first time period t1, CK provides a low voltage signal, CB provides a high voltage signal, CBo provides a low voltage signal, and I1 provides a low voltage signal. As shown in FIG. 27A, T1 and T2 are turned on, and the potential of N1 is a low voltage, and T9 is turned on, T10 is turned on, the potential of N3 is a low voltage, T8 is turned off, the potential of N2 is a high voltage, T3 is turned on, T4 is turned off, O1 outputs VL-Vth, where Vth is the threshold voltage of T3, and VL is a voltage value of the voltage signal provided by the low voltage terminal;

In the first time period t1, the potential of N1 is VL, the potential of N2 is VH, the potential of N3 is VL, the potential of N4 is VH, and the potential of N5 is VH;

In the second time period t2, CK provides a high voltage signal, CB provides a low voltage signal, CBo provides a high voltage signal, and I1 provides a low voltage signal. As shown in FIG. 27B, T1 and T2 are turned off, and T10 is turned on. Since the second clock signal provided by CB changes from a high voltage signal in the previous time period to a low voltage signal, the potential of N1 is further pulled down, so that T3 can be fully turned on, T5 is turned on, T6 is turned on, and the potentials of N4 and N3 are both high voltages, T8 is turned on, the potential of N2 is a high voltage, T3 is turned on, T4 is turned off, and O1 outputs a low voltage. At this time, the voltage value of the voltage signal output by O1 is VL;

In the second time period t2, the potential of N1 is (VL−VH)C2$z$/(C2$z$+C4$z$)+VL, the potential of N2 is VH, the potential of N3 is VH, the potential of N4 is VH, and the potential of N5 is VH;

In the third time period t3, CK provides a low voltage signal, CB provides a high voltage signal, CBo provides a low voltage signal, and I1 provides a high voltage signal. As shown in FIG. 27C, T1 and T2 are turned on, and the potential of N1 is a high voltage, and T5, T9 and T10 are turned off, T6 is turned off, the potential of N3 is low voltage, T11 is turned on, T8 is turned off, the potential of N2 is maintained at a high voltage, T3 and T4 are both turned off, and the voltage signal output by O1 is maintained by the parasitic capacitor of the circuit to the voltage signal in the previous time period; at this time, since T5 and T6 are both turned off, N4 is floating, and the potential of N4 is unknown;

In the third time period t3, the potential of N1 is VH, the potential of N2 is VH, the potential of N3 is VL, the potential of N4 is unknown, and the potential of N5 is VH;

In the fourth time period t4, CK provides a high voltage signal, CB provides a low voltage signal, CBo provides a high voltage signal, and I1 provides a low voltage signal. As shown in FIG. 27D, T1 and T2 are turned off, and the potential of N1 remains at a high voltage, T11 is turned on, because the second clock signal provided by CB changes from a high voltage signal in the previous period to a low voltage signal, and T8 is turned on, then the potentials of N3 and N2 are further pulled down, T3 is turned off, and T4 is turned on. At this time, CBo provides a high voltage signal, O1 outputs a high voltage;

In the fourth time period t4, the potential of N1 is VH, the potential of N2 is VL, the potential of N3 is 2VL−VH, the potential of N4 is VL, and the potential of N4 is VL;

In the fifth time period t5, CK provides a low voltage signal, CB provides a high voltage signal, and CBo provides a low voltage signal. As shown in FIG. 27E, T1 and T2 are turned on, the potential of N1 is VL, the potential of N3 is VL, and T6 is turned off, T5 is turned on, and the potential of N4 is VH. At this time, a low voltage signal output by O1 is determined by the state in the previous time period, and the voltage value of the low-voltage signal output by O1 is VL. At this time, due to the potentials of gate electrode of T3, the source electrode of T3 and the drain electrode of T3 are all VL, then the gate-source voltage of T3 is equal to 0, and the gate-source voltage of T3 is greater than the threshold voltage of T3. Therefore, T3 is not turned on at this time, and the voltage signal output by O1 is kept at a low voltage signal by the parasitic capacitor of the circuit.

In the fifth time period t5 and several time periods thereafter, the potential of N2 is maintained at a high voltage, and T4 is always in the off state, which can improve the stable state of the low voltage signal output by O1.

Figure 28:
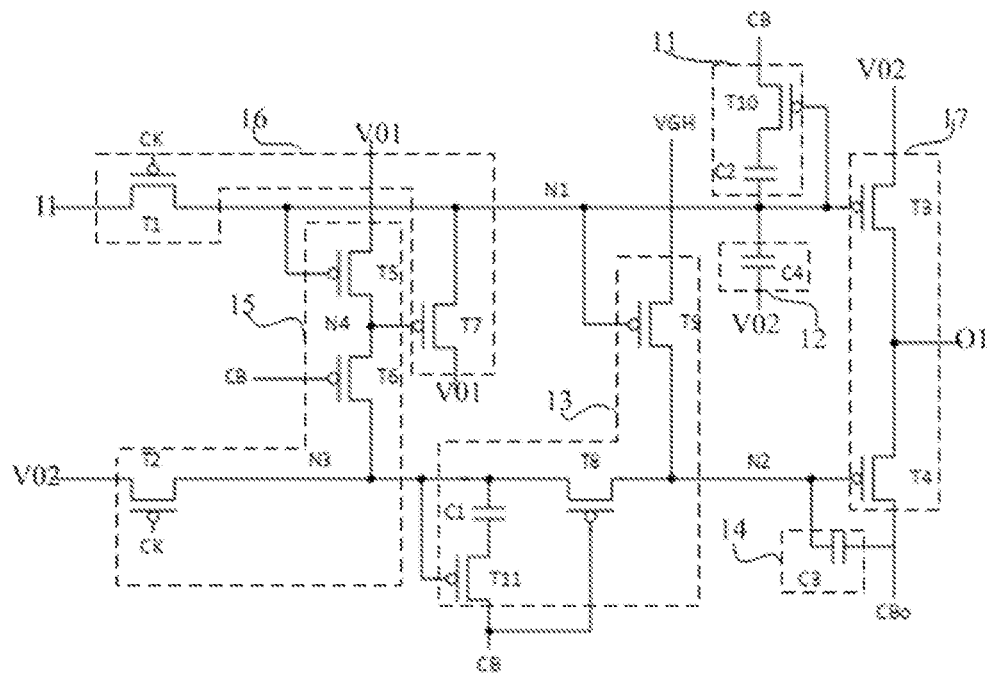
FIG. 28 is a circuit diagram of the shift register unit according to the eleventh embodiment of the present disclosure.

As shown in FIG. 28, the difference between the eleventh embodiment of the shift register unit described in the present disclosure and the tenth embodiment of the shift register unit described in the present disclosure is as follows: the position of C1;

In the eleventh embodiment of the shift register unit, the first end of C1 is electrically connected to the third node N3, the second end of C1 is electrically connected to the drain electrode of T11, and N3 is directly electrically connected to the drain electrode of T8.

The working timing diagram of the eleventh embodiment shown in FIG. 28 of the shift register unit may also be as shown in FIG. 26, but is not limited thereto.

The working process of the eleventh embodiment of the shift register unit of the present disclosure as shown in FIG. 28 is substantially the same as the working process of the tenth embodiment of the shift register unit.

When T11 is turned on, according to the second clock signal provided by CB, to control the potential of N3, and there is no process of charging C3 through the second clock signal;

Specifically, when the shift register unit shown in FIG. 28 of the eleventh embodiment of the present disclosure is in operation, in the fourth time period t4, when T11 is turned on, the potential of N3 is jumped according to the second clock signal provided by the CB, the jumped value is (VL−VH+VL), since in the previous time period (that is, the third time period t3), the potential of N2 is VH, with the potential of the second clock signal provided by CB is jumped from a high level to a low level, the voltage value is distributed in proportion to the capacitance value;

In the fourth time period t4, T8 is turned on, the potential of N3 is equal to the potential of N2, and the potential of N2 is equal to [(2VL−VH)×C1$z$+VH×C3$z$]/(C1$z$+C3$z$), where C1$z$ is the capacitance value of C1, C3$z$ is the capacitance value of C3.

Figure 29:
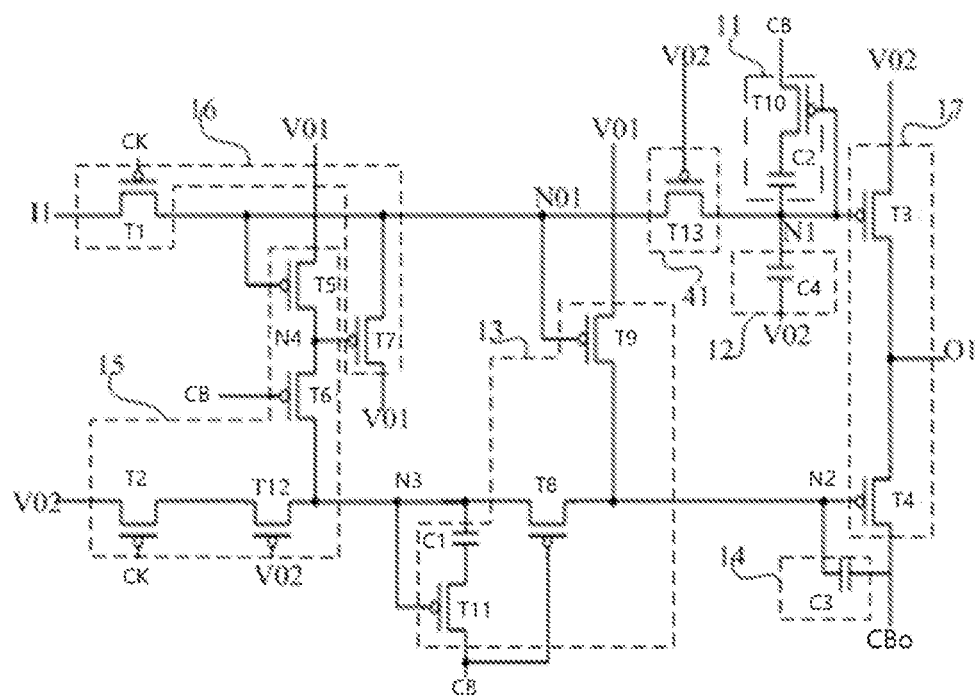
FIG. 29 is a circuit diagram of the shift register unit according to the twelfth embodiment of the present disclosure.

As shown in FIG. 29, on the basis of the embodiment of the shift register unit described in FIG. 8, in the twelfth embodiment of the shift register unit described in the present disclosure, the first isolation circuit 41 includes a first isolation transistor T13.

The gate electrode of T13 is connected to the low voltage terminal V02, the source electrode of T13 is electrically connected to N0L and the drain electrode of T13 is electrically connected to N1;

The first node potential adjustment circuit 11 includes an adjustment transistor T10 and an adjustment capacitor C2, wherein, The gate electrode of the adjustment transistor T10 is electrically connected to the first node N1, the source electrode of the adjustment transistor T10 is electrically connected to the second clock signal terminal CB, and the drain electrode of the adjustment transistor T10 is electrically connected to the first end of the adjustment capacitor C1.

The second end of the adjustment capacitor C1 is electrically connected to the first node N1;

The second node control circuit 13 includes a first control transistor T11, a control capacitor C1, a second control transistor T8, and a third control transistor T9, wherein, The first end of the control capacitor C1 is electrically connected to the third node N3, and the second end of the control capacitor C1 is electrically connected to the drain electrode of the first control transistor T11;

The gate electrode of the first control transistor T11 is electrically connected to the third node N3, and the source electrode of the first control transistor T11 is electrically connected to the second clock signal terminal CB;

The gate electrode of the second control transistor T8 is electrically connected to the second clock signal terminal CB, the source electrode of the second control transistor T8 is electrically connected to the third node N3, and the drain electrode of the second control transistor T8 is electrically connected to the second node N2;

The gate electrode of the third control transistor T9 is electrically connected to the first isolation node N01, the source electrode of the third control transistor T9 is electrically connected to the high voltage terminal V01, and the drain electrode of the third control transistor T9 is electrically connected to the second node N2;

The third node control circuit 15 includes a fourth control transistor T2, a third isolation transistor T12, a fifth control transistor T5, and a sixth control transistor T6, wherein, The gate electrode of the fourth control transistor T2 is electrically connected to the first clock signal terminal CK, and the source electrode of the fourth control transistor T2 is electrically connected to the low voltage terminal V02;

The gate electrode of the third isolation transistor T12 is electrically connected to the low voltage terminal V02, the source electrode of the third isolation transistor T12 is electrically connected to the drain electrode of the fourth control transistor T2, and the drain electrode of the third isolation transistor T12 is electrically connected to the third node N3;

The gate electrode of the fifth control transistor T5 is electrically connected to the first isolation node N01, the source electrode of the fifth control transistor T5 is electrically connected to the high voltage terminal V01, and the drain electrode of the fifth control transistor T5 is electrically connected to the fourth node N4;

The gate electrode of the sixth control transistor T6 is electrically connected to the second clock signal terminal CB, the source electrode of the sixth control transistor T6 is electrically connected to the fourth node N4, and the drain electrode of the sixth control transistor T6 is electrically connected to the third node N3;

The first node control circuit 16 includes a seventh control transistor T1 and an eighth control transistor T7, wherein, The gate electrode of the seventh control transistor T1 is electrically connected to the first clock signal terminal CK, the source electrode of the seventh control transistor T1 is electrically connected to the input terminal I1, and the drain electrode of the seventh control transistor T1 is electrically connected to the first isolation node N01;

The gate electrode of the eighth control transistor T7 is electrically connected to the fourth node N4, the drain electrode of the eighth control transistor T7 is electrically connected to the first isolation node N01, and the source electrode of the eighth control transistor T7 is electrically connected to the high voltage terminal V01;

The output circuit 17 includes a first output transistor T3 and a second output transistor T4;

The gate electrode of the first output transistor T3 is electrically connected to the first node N1, the source electrode of the first output transistor T3 is electrically connected to the low voltage terminal V02, and the drain electrode of the first output transistor T3 is electrically connected to the driving voltage signal terminal O1;

The gate electrode of the second output transistor T4 is electrically connected to the second node N2, the drain electrode of the second output transistor T4 is electrically connected to the driving voltage signal terminal O1, and the source electrode of the second output transistor T4 is electrically connected to the output clock signal terminal CBo;

The first tank circuit 12 includes a first storage capacitor C4, and the second tank circuit 14 includes a second storage capacitor C3;

The first end of the first storage capacitor C4 is electrically connected to the first node N1, and the second end of the first storage capacitor C4 is electrically connected to the low voltage terminal V02;

The first end of the second storage capacitor C3 is electrically connected to the second node N2, and the second end of the second storage capacitor C3 is electrically connected to the high voltage terminal V01.

In at least one embodiment of the present disclosure, the high voltage terminal may provide a high voltage signal, and the low voltage terminal may provide a low voltage signal.

In at least one embodiment of the present disclosure, the control voltage terminal is a low voltage terminal, but it is not limited to this.

The twelfth embodiment of the shift register unit described in the present disclosure is a shift register unit in a gate driving circuit, which is used to generate a gate driving signal.

In the twelfth embodiment of the shift register unit described in the present disclosure, all the transistors are p-type thin film transistors, but it is not limited thereto.

The difference between the twelfth embodiment of the shift register unit described in this disclosure and the eleventh embodiment of the shift register unit described in this disclosure is that T13 and T12 are added.

Figure 30:
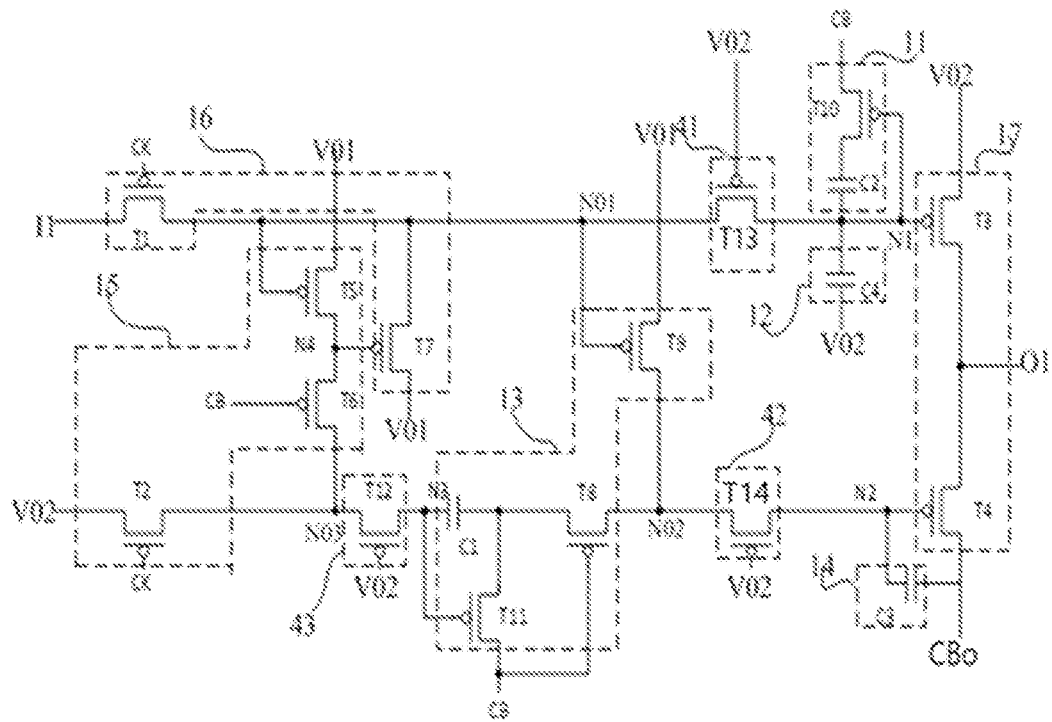
FIG. 30 is a circuit diagram of the shift register unit according to the thirteenth embodiment of the present disclosure.

In the sixth embodiment of the shift register unit described in the present disclosure, the purpose of adding T11 is to prevent, when the potential of N1 is further pulled down by the T10 which is turned on through CB, the threshold voltage of T1 from drifting due to the potential of N1 being too low, and prevent the situation that T1 cannot be fully turned on when T1 needs to be turned on;

The purpose of adding T12 is to prevent, when the potential of N3 is further pulled down by the T11 which is turned on through CB, the threshold voltage of T2 from drifting due to the potential of N3 being too low, and prevent the situation that T2 cannot be fully turned on when T2 needs to be turned on;

As shown in FIG. 30, on the basis of the embodiment of the shift register unit described in FIG. 8, in the thirteenth embodiment of the shift register unit described in the present disclosure, the first isolation circuit 41 includes a first isolation transistor T13;

The gate electrode of T13 is connected to the low voltage terminal V02, the source electrode of T13 is electrically connected to N01, and the drain electrode of T13 is electrically connected to N1;

The first node potential adjustment circuit 11 includes an adjustment transistor T10 and an adjustment capacitor C2, wherein, The gate electrode of the adjustment transistor T10 is electrically connected to the first node N1, the source electrode of the adjustment transistor T10 is electrically connected to the second clock signal terminal CB, and the drain electrode of the adjustment transistor T10 is electrically connected to the first end of the adjustment capacitor C1.

The second end of the adjustment capacitor C1 is electrically connected to the first node N1;

The second node control circuit 13 includes a first control transistor T11, a control capacitor C1, a second control transistor T8, and a third control transistor T9, wherein, The first end of the control capacitor C1 is electrically connected to the third node N3, and the second end of the control capacitor C1 is electrically connected to the fifth node N5;

The gate electrode of the first control transistor T11 is electrically connected to the third node N3, the drain electrode of the first control transistor T11 is electrically connected to the fifth node N5, and the source electrode of the first control transistor T11 is electrically connected to the second clock signal terminal CB;

The gate electrode of the second control transistor T8 is electrically connected to the second clock signal terminal CB, the source electrode of the second control transistor T8 is electrically connected to the fifth node N5, and the drain electrode of the second control transistor T8 is electrically connected to the second node N2;

The gate electrode of the third control transistor T9 is electrically connected to the first isolation node N01, the source electrode of the third control transistor T9 is electrically connected to the high voltage terminal V01, and the drain electrode of the third control transistor T9 is electrically connected to the second node N2;

The third node control circuit 15 includes a fourth control transistor T2, a third isolation transistor T12, a fifth control transistor T5, and a sixth control transistor T6, wherein, The gate electrode of the fourth control transistor T2 is electrically connected to the first clock signal terminal CK, and the source electrode of the fourth control transistor T2 is electrically connected to the low voltage terminal V02;

The gate electrode of the third isolation transistor T12 is electrically connected to the low voltage terminal V02, the source electrode of the third isolation transistor T12 is electrically connected to the drain electrode of the fourth control transistor T2, and the drain electrode of the third isolation transistor T12 is electrically connected to the third node N3;

The gate electrode of the fifth control transistor T5 is electrically connected to the first isolation node N01, the source electrode of the fifth control transistor T5 is electrically connected to the high voltage terminal V01, and the drain electrode of the fifth control transistor T5 is electrically connected to the fourth node N4;

The gate electrode of the sixth control transistor T6 is electrically connected to the second clock signal terminal CB, the source electrode of the sixth control transistor T6 is electrically connected to the fourth node N4, and the drain electrode of the sixth control transistor T6 is electrically connected to the third node N3;

The first node control circuit 16 includes a seventh control transistor T1 and an eighth control transistor T7, wherein, The gate electrode of the seventh control transistor T1 is electrically connected to the first clock signal terminal CK, the source electrode of the seventh control transistor T1 is electrically connected to the input terminal I1, and the drain electrode of the seventh control transistor T1 is electrically connected to the first isolation node N01;

The gate electrode of the eighth control transistor T7 is electrically connected to the fourth node N4, the drain electrode of the eighth control transistor T7 is electrically connected to the first isolation node N01, and the source electrode of the eighth control transistor T7 is electrically connected to the high voltage terminal V01;

The output circuit 17 includes a first output transistor T3 and a second output transistor T4;

The gate electrode of the first output transistor T3 is electrically connected to the first node N1, the source electrode of the first output transistor T3 is electrically connected to the low voltage terminal V02, and the drain electrode of the first output transistor T3 is electrically connected to the driving voltage signal terminal O1;

The gate electrode of the second output transistor T4 is electrically connected to the second node N2, the drain electrode of the second output transistor T4 is electrically connected to the driving voltage signal terminal O1, and the source electrode of the second output transistor T4 is electrically connected to the high voltage terminal V01;

The first tank circuit 12 includes a first storage capacitor C4, and the second tank circuit 14 includes a second storage capacitor C3;

The first end of the first storage capacitor C4 is electrically connected to the first node N1, and the second end of the first storage capacitor C4 is electrically connected to the low voltage terminal V02;

The first end of the second storage capacitor C3 is electrically connected to the second node N2, and the second end of the second storage capacitor C3 is electrically connected to the output clock signal terminal CBo.

In at least one embodiment of the present disclosure, the high voltage terminal may provide a high voltage signal, and the low voltage terminal may provide a low voltage signal.

In at least one embodiment of the present disclosure, the control voltage terminal is a low voltage terminal, but it is not limited to this.

The thirteenth embodiment of the shift register unit described in the present disclosure is a shift register unit in a gate driving circuit, which is used to generate a gate driving signal.

In the thirteenth embodiment of the shift register unit described in the present disclosure, all the transistors are p-type thin film transistors, but it is not limited thereto.

The difference between the thirteenth embodiment of the shift register unit described in this disclosure and the tenth embodiment of the shift register unit described in this disclosure is that T13 and T12 are added.

In the thirteenth embodiment of the shift register unit described in the present disclosure, the purpose of adding T13 is to prevent DIBL (Drain Induced Barrier Lowering) in the transistor electrically connected to N1 when the potential of N1 is too low, so that the threshold voltage of the transistor electrically connected to N1 is drifted, resulting in the situation that the transistor electrically connected to N1 cannot be normally turned on or off during other working stages;

The purpose of adding T12 is to prevent the threshold voltage of the transistor electrically connected to the potential of N3 from drifting, resulting in the situation that the transistor electrically connected to N3 cannot be normally turned on or off during other working stages.

Figure 31:
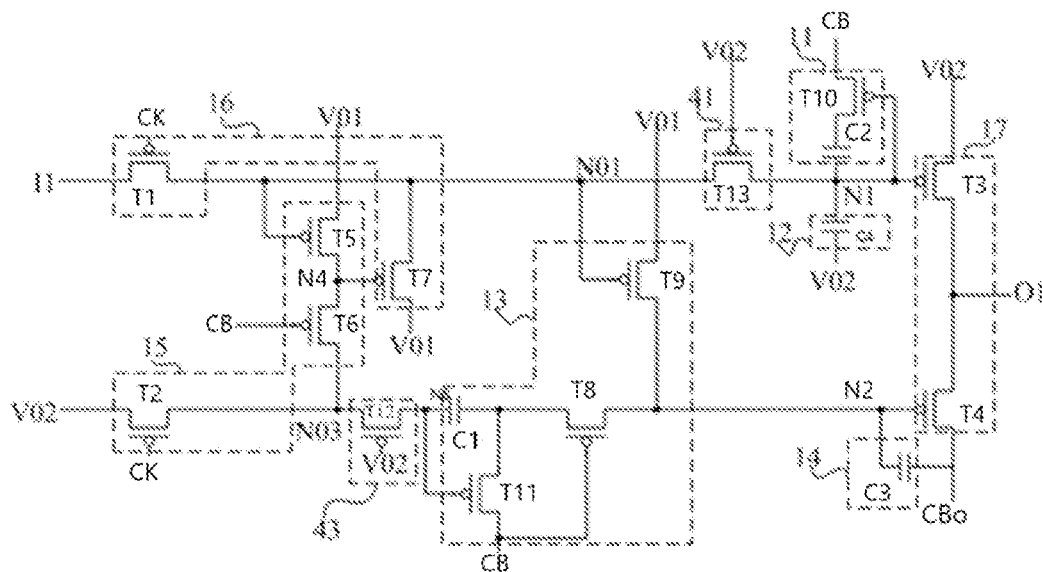
FIG. 31 is a circuit diagram of the shift register unit according to the fourteenth embodiment of the present disclosure.

As shown in FIG. 31, on the basis of the embodiment of the shift register unit described in FIG. 9, in the fourteenth embodiment of the shift register unit described in the present disclosure, The first isolation circuit 41 includes a first isolation transistor T13, and the third isolation circuit 43 includes a third isolation transistor T12;

The gate electrode of T13 is electrically connected to the low voltage terminal V02, the source electrode of T13 is electrically connected to N01, and the drain electrode of T13 is electrically connected to N1;

The gate electrode of T12 is electrically connected to the low voltage terminal V02, the source electrode of T12 is electrically connected to N03, and the drain electrode of T12 is electrically connected to N3;

The first node potential adjustment circuit 11 includes an adjustment transistor T10 and an adjustment capacitor C2, wherein, The gate electrode of the adjustment transistor T10 is electrically connected to the first node N1, the source electrode of the adjustment transistor T10 is electrically connected to the second clock signal terminal CB, and the drain electrode of the adjustment transistor T10 is electrically connected to the first end of the adjustment capacitor C1.

The second end of the adjustment capacitor C1 is electrically connected to the first node N1;

The second node control circuit 13 includes a first control transistor T11, a control capacitor C1, a second control transistor T8, and a third control transistor T9, wherein, The first end of the control capacitor C1 is electrically connected to the third node N3, and the second end of the control capacitor C1 is electrically connected to the fifth node N5;

The gate electrode of the first control transistor T11 is electrically connected to the third node N3, the drain electrode of the first control transistor T11 is electrically connected to the fifth node N5, and the source electrode of the first control transistor T11 is electrically connected to the second clock signal terminal CB;

The gate electrode of the second control transistor T8 is electrically connected to the second clock signal terminal CB, the source electrode of the second control transistor T8 is electrically connected to the fifth node N5, and the drain electrode of the second control transistor T8 is electrically connected to the second node N2;

The gate electrode of the third control transistor T9 is electrically connected to the first isolation node N01, the source electrode of the third control transistor T9 is electrically connected to the high voltage terminal V01, and the drain electrode of the third control transistor T9 is electrically connected to the second node N2;

The third node control circuit 15 includes a fourth control transistor T2, a fifth control transistor T5, and a sixth control transistor T6, wherein, The gate electrode of the fourth control transistor T2 is electrically connected to the first clock signal terminal CK, the source electrode of the fourth control transistor T2 is electrically connected to the low voltage terminal V02, and the drain electrode of the fourth control transistor T2 is electrically connected to the third node N3;

The gate electrode of the fifth control transistor T5 is electrically connected to the first isolation node N01, the source electrode of the fifth control transistor T5 is electrically connected to the high voltage terminal V01, and the drain electrode of the fifth control transistor T5 is electrically connected to the fourth node N4;

The gate electrode of the sixth control transistor T6 is electrically connected to the second clock signal terminal CB, the source electrode of the sixth control transistor T6 is electrically connected to the fourth node N4, and the drain electrode of the sixth control transistor T6 is electrically connected to the third isolation node N03;

The first node control circuit 16 includes a seventh control transistor T1 and an eighth control transistor T7, wherein, The gate electrode of the seventh control transistor T1 is electrically connected to the first clock signal terminal CK, the source electrode of the seventh control transistor T1 is electrically connected to the input terminal I1, and the drain electrode of the seventh control transistor T1 is electrically connected to the first isolation node N01;

The gate electrode of the eighth control transistor T7 is electrically connected to the fourth node N4, the drain electrode of the eighth control transistor T7 is electrically connected to the first isolation node N1, and the source electrode of the eighth control transistor T7 is electrically connected to the high voltage terminal V01;

The output circuit 17 includes a first output transistor T3 and a second output transistor T4;

The gate electrode of the first output transistor T3 is electrically connected to the first node N1, the source electrode of the first output transistor T3 is electrically connected to the low voltage terminal V02, and the drain electrode of the first output transistor T3 is electrically connected to the driving voltage signal terminal O1;

The gate electrode of the second output transistor T4 is electrically connected to the second node N2, the drain electrode of the second output transistor T4 is electrically connected to the driving voltage signal terminal O1, and the source electrode of the second output transistor T4 is electrically connected to the high voltage terminal V01;

The first tank circuit 12 includes a first storage capacitor C4, and the second tank circuit 14 includes a second storage capacitor C3;

The first end of the first storage capacitor C4 is electrically connected to the first node N1, and the second end of the first storage capacitor C4 is electrically connected to the low voltage terminal V02;

The first end of the second storage capacitor C3 is electrically connected to the second node N2, and the second end of the second storage capacitor C3 is electrically connected to the output clock signal terminal CBo.

In at least one embodiment of the present disclosure, the high voltage terminal may provide a high voltage signal, and the low voltage terminal may provide a low voltage signal.

The fourteenth embodiment of the shift register unit described in the present disclosure is a shift register unit in a gate driving circuit, which is used to generate a gate driving signal.

In the fourteenth embodiment of the shift register unit described in the present disclosure, all the transistors are p-type thin film transistors, but it is not limited thereto.

The difference between the fourteenth embodiment of the shift register unit described in this disclosure and the tenth embodiment of the shift register unit described in this disclosure is that T13 and T12 are added.

In the fourteenth embodiment of the shift register unit described in the present disclosure, the purpose of adding T13 is to prevent DIBL (Drain Induced Barrier Lowering) in the transistor electrically connected to N1 when the potential of N1 is too low, so that the threshold voltage of the transistor electrically connected to N1 is drifting, resulting in the situation that the transistor electrically connected to N1 cannot be normally turned on or off during other working stages;

The purpose of adding T12 is to prevent the threshold voltage of the transistor electrically connected to the potential of N3 from drifting, resulting in the situation that the transistor electrically connected to N3 cannot be normally turned on or off during other working stages.

Figure 32:
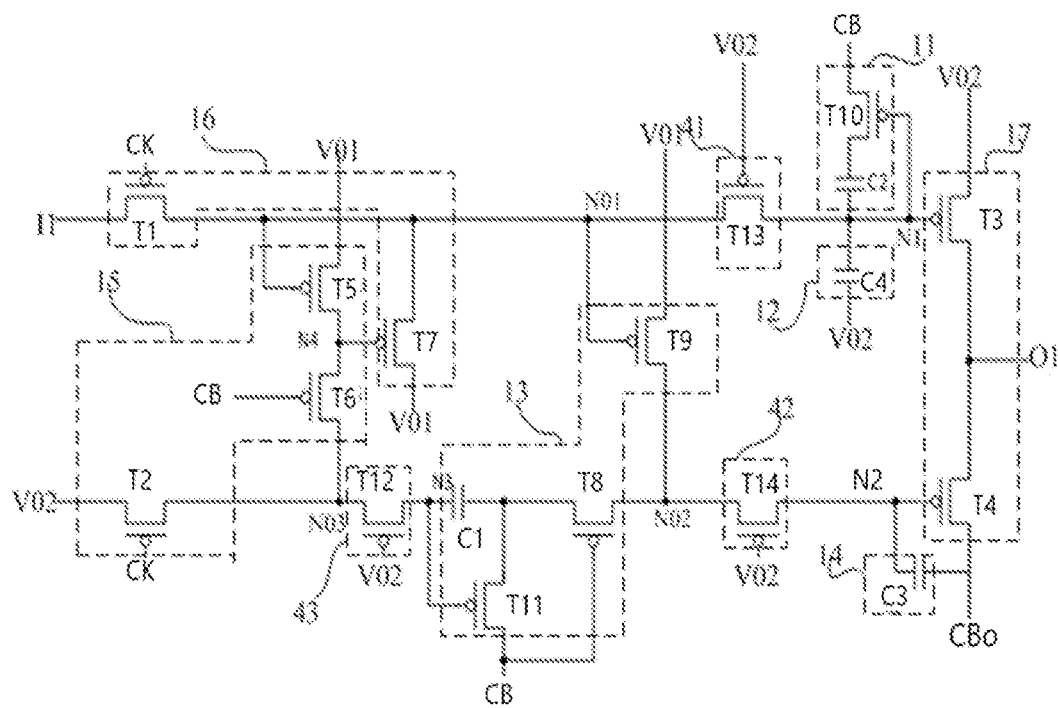
FIG. 32 is a circuit diagram of the shift register unit according to the fifteenth embodiment of the present disclosure.

As shown in FIG. 32, on the basis of the embodiment of the shift register unit described in FIG. 10, in the fifteenth embodiment of the shift register unit described in the present disclosure, The first isolation circuit 41 includes a first isolation transistor T13, the third isolation circuit 43 includes a third isolation transistor T12; the second isolation circuit 42 includes a second isolation transistor T14;

The gate electrode of T13 is electrically connected to the low voltage terminal V02, the source electrode of T13 is electrically connected to N01, and the drain electrode of T13 is electrically connected to N1;

The gate electrode of T12 is electrically connected to the low voltage terminal V02, the source electrode of T12 is electrically connected to N03, and the drain electrode of T12 is electrically connected to N3;

The gate electrode of T14 is electrically connected to the low voltage terminal V02, the source electrode of T14 is electrically connected to N02, and the drain electrode of T14 is electrically connected to N2;

The first node potential adjustment circuit 11 includes an adjustment transistor T10 and an adjustment capacitor C2, wherein, The gate electrode of the adjustment transistor T10 is electrically connected to the first node N1, the source electrode of the adjustment transistor T10 is electrically connected to the second clock signal terminal CB, and the drain electrode of the adjustment transistor T10 is electrically connected to the first end of the adjustment capacitor C1.

The second end of the adjustment capacitor C1 is electrically connected to the first node N1;

The second node control circuit 13 includes a first control transistor T11, a control capacitor C1, a second control transistor T8, and a third control transistor T9, wherein, The first end of the control capacitor C1 is electrically connected to the third node N3, and the second end of the control capacitor C1 is electrically connected to the fifth node N5;

The gate electrode of the first control transistor T11 is electrically connected to the third node N3, the drain electrode of the first control transistor T11 is electrically connected to the fifth node N5, and the source electrode of the first control transistor T11 is electrically connected to the second clock signal terminal CB;

The gate electrode of the second control transistor T8 is electrically connected to the second clock signal terminal CB, the source electrode of the second control transistor T8 is electrically connected to the fifth node N5, and the drain electrode of the second control transistor T8 is electrically connected to the second isolation node N02;

The gate electrode of the third control transistor T9 is electrically connected to the first isolation node N01, the source electrode of the third control transistor T9 is electrically connected to the high voltage terminal V01, and the drain electrode of the third control transistor T9 is electrically connected to the second isolation node N02;

The third node control circuit 15 includes a fourth control transistor T2, a fifth control transistor T5, and a sixth control transistor T6, wherein, The gate electrode of the fourth control transistor T2 is electrically connected to the first clock signal terminal CK, the source electrode of the fourth control transistor T2 is electrically connected to the low voltage terminal V02, and the drain electrode of the fourth control transistor T2 is electrically connected to the third node N3;

The gate electrode of the fifth control transistor T5 is electrically connected to the first isolation node N01, the source electrode of the fifth control transistor T5 is electrically connected to the high voltage terminal V01, and the drain electrode of the fifth control transistor T5 is electrically connected to the fourth node N4;

The gate electrode of the sixth control transistor T6 is electrically connected to the second clock signal terminal CB, the source electrode of the sixth control transistor T6 is electrically connected to the fourth node N4, and the drain electrode of the sixth control transistor T6 is electrically connected to the third isolation node N03;

The first node control circuit 16 includes a seventh control transistor T1 and an eighth control transistor T7, wherein, The gate electrode of the seventh control transistor T1 is electrically connected to the first clock signal terminal CK, the source electrode of the seventh control transistor T1 is electrically connected to the input terminal I1, and the drain electrode of the seventh control transistor T1 is electrically connected to the first isolation node N01;

The gate electrode of the eighth control transistor T7 is electrically connected to the fourth node N4, the drain electrode of the eighth control transistor T7 is electrically connected to the first isolation node N1, and the source electrode of the eighth control transistor T7 is electrically connected to the high voltage terminal V01;

The output circuit 17 includes a first output transistor T3 and a second output transistor T4;

The gate electrode of the first output transistor T3 is electrically connected to the first node N1, the source electrode of the first output transistor T3 is electrically connected to the low voltage terminal V02, and the drain electrode of the first output transistor T3 is electrically connected to the driving voltage signal terminal O1;

The gate electrode of the second output transistor T4 is electrically connected to the second node N2, the drain electrode of the second output transistor T4 is electrically connected to the driving voltage signal terminal O1, and the source electrode of the second output transistor T4 is electrically connected to the high voltage terminal V01;

The first tank circuit 12 includes a first storage capacitor C4, and the second tank circuit 14 includes a second storage capacitor C3;

The first end of the first storage capacitor C4 is electrically connected to the first node N1, and the second end of the first storage capacitor C4 is electrically connected to the low voltage terminal V02;

The first end of the second storage capacitor C3 is electrically connected to the second node N2, and the second end of the second storage capacitor C3 is electrically connected to the output clock signal terminal CBo.

In at least one embodiment of the present disclosure, the high voltage terminal may provide a high voltage signal, and the low voltage terminal may provide a low voltage signal.

The fifteenth embodiment of the shift register unit described in the present disclosure is a shift register unit in a gate driving circuit, which is used to generate a gate driving signal.

In the fifteenth embodiment of the shift register unit described in the present disclosure, all the transistors are p-type thin film transistors, but it is not limited thereto.

The difference between the fifteenth embodiment of the shift register unit described in this disclosure and the tenth embodiment of the shift register unit described in this disclosure is that T13, T12, and T14 are added.

In the fifteenth embodiment of the shift register unit described in the present disclosure, the purpose of adding T13 is to prevent DIBL (Drain Induced Barrier Lowering) in the transistor electrically connected to N1 when the potential of N1 is too low, so that the threshold voltage of the transistor electrically connected to N1 is drifting, resulting in the situation that the transistor electrically connected to N1 cannot be normally turned on or off during other working stages;

The purpose of adding T12 is to prevent the threshold voltage of the transistor electrically connected to the potential of N3 from drifting, resulting in the situation that the transistor electrically connected to N3 cannot be normally turned on or off during other working stages.

The purpose of adding T14 is to prevent DIBL (Drain Induced Barrier Lowering) of the transistor electrically connected to N2 when the potential of N2 is too low, so that the threshold voltage of the transistor electrically connected to N2 is drifting, resulting in the situation that the transistor electrically connected to N2 cannot be normally turned on or off during other working stages.

Figure 33:
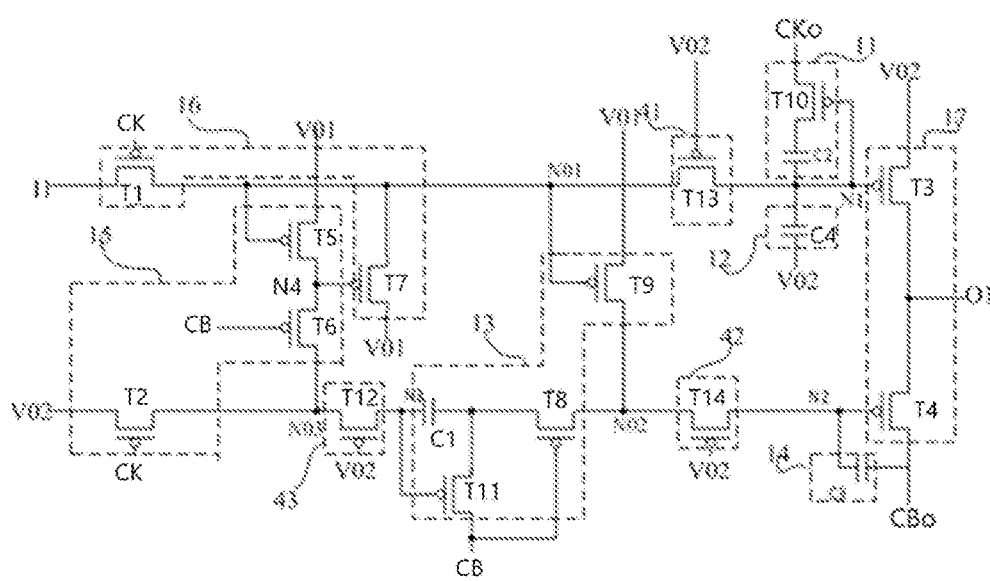
FIG. 33 is a circuit diagram of the shift register unit according to the sixteenth embodiment of the present disclosure.

As shown in FIG. 33, the difference between the sixteenth embodiment of the shift register unit described in the present disclosure and the fifteenth embodiment of the shift register unit described in the present disclosure is: the source electrode of T10 is electrically connected to the third clock signal terminal CKo.

In at least one embodiment of the present disclosure, the third clock signal provided by CKo may be inverted in phase from the first clock signal provided by CK.

The first to sixteenth embodiments of the shift register unit described in the above disclosure are at least one embodiment of the shift register unit described in the disclosure.

The driving method described in at least one embodiment of the present disclosure is applied to the above-mentioned shift register unit, and the driving method includes:

controlling to writing an input signal to a first isolation node under the control of a first clock signal of a first node control circuit, write a first voltage signal to the first isolation node under the control of a potential of a fourth node;

changing, by the first node potential adjustment circuit, a potential of a first node according to an adjustment clock signal under the control of the potential of the first node;

maintaining, by a the first tank circuit, the potential of the first node;

controlling, by a third node control circuit, a potential of the third isolation node and the potential of the fourth node under the control of the first clock signal, the second clock signal, and a potential of the first isolation node;

controlling, by a second node control circuit, a potential of the second isolation node under the control of the potential of the third node and the control clock signal, and controlling to write the first voltage signal to the second isolation node under the control of the potential of the first isolation node;

maintaining, by a second tank circuit, a potential of the second node;

writing, by an output circuit, a second voltage signal to a driving voltage signal output terminal under the control of the potential of the first node, and writing a third voltage signal to the driving voltage signal terminal under the control of the potential of the second node.

By using the driving method described in at least one embodiment of the present disclosure, the shift register unit described in at least one embodiment of the present disclosure can provide both a gate driving signal and a light-emitting control signal to provide waveforms of a specific pixel operating. When the shift register unit provides a light emitting control signal, the third voltage terminal may be a first voltage terminal; when the shift register unit provides a gate driving signal, the third voltage terminal may be an output clock signal terminal; the output clock signal provided by the output clock signal terminal is a clock signal that is inverted in phase from the second clock signal. Moreover, in the driving method according to at least one embodiment of the present disclosure, the first node potential adjustment circuit is electrically connected to the adjustment clock signal terminal and the first node, and under the control of the potential of the first node, is configured to change the potential of the first node according to the adjustment clock signal provided by the adjustment clock signal terminal, so that when the first output transistor in the output circuit is to be turned on, the potential of the first node can drop to a voltage low enough to make the first output transistor is fully turned on to avoid the problem of the output waveform of the driving voltage signal terminal from being adversely affected by the threshold voltage loss of the first output transistor.

In specific implementation, the driving voltage signal terminal is a gate driving signal output terminal, the third voltage terminal is an output clock signal terminal; the output clock signal provided by the output clock signal terminal is a clock signal which is inverted in phase from the second clock signal; or, The driving voltage signal terminal is a light emitting control signal terminal, and the third voltage terminal is a first voltage terminal.

The driving circuit described in at least one embodiment of the present disclosure includes a plurality of stages of the above-mentioned shift register units.

In at least one embodiment of the present disclosure, the input end of the shift register unit of the driving circuit is electrically connected to the driving voltage signal output end of the adjacent previous stage of shift register unit;

Moreover, in the driving circuit described in at least one embodiment of the present disclosure, a first clock signal connected to an odd-numbered stage of shift register unit is a second clock signal connected to an even-numbered stage of shift register unit, and a second clock signal connected to an odd-numbered stage of shift register unit is a first clock signal connected to an even-numbered stage of shift register unit, but it is not limited to this;

In the driving circuit described in at least one embodiment of the present disclosure, the output clock signal connected to the odd-numbered stage of shift register unit is the third clock signal connected to the even-numbered stage of shift register unit, and the third clock signal connected to the odd-numbered stage of shift register unit is the output clock signal connected to the even-numbered stage of shift register unit, but is not limited to this.

Optionally, the driving circuit is a gate driving circuit, the driving voltage signal terminal is a gate driving signal output terminal, and the third voltage terminal is the output clock signal terminal; the output clock signal provided by the output clock signal terminal is a clock signal which is inversed in phase from the second clock signal.

Optionally, the driving circuit is a light emitting control signal generating circuit; the driving voltage signal terminal is a light emitting control signal terminal, and the third voltage terminal is a first voltage terminal.

The display device described in at least one embodiment of the present disclosure includes the above-mentioned driving circuit.

The display device provided in at least one embodiment of the present disclosure may be any product or component with a display function, such as a mobile phone, a tablet computer, a television, a monitor, a notebook computer, a digital photo frame, and a navigator.

The above are optional embodiments of the present disclosure. It should be pointed out that for those of ordinary skill in the art, several improvements and modifications can be made without departing from the principles described in the present disclosure, and these improvements and modifications shall fall in the protection scope of the present disclosure.

What is claimed is:

1. A shift register unit, comprising a first node potential adjustment circuit, a first tank circuit, a second node control circuit, a second tank circuit, a third node control circuit, a first node control circuit and an output circuit, wherein the first node control circuit is directly connected to an input terminal, a first clock signal terminal, a first isolation node, a fourth node, and a first voltage terminal, respectively;

the first node potential adjustment circuit is respectively directly connected to an adjustment clock signal terminal and a first node;

the first tank circuit is directly connected to the first node;

the third node control circuit is directly connected to the first clock signal terminal, a second clock signal terminal, the first isolation node, a third isolation node, the fourth node, the first voltage terminal, and a second voltage terminal, respectively;

the second node control circuit is directly connected to the first isolation node, the first voltage terminal, a second isolation node, a control clock signal terminal, and a third node, respectively;

the second tank circuit is configured to maintain a potential of the second node;

the output circuit is directly connected to the first node, the second voltage terminal, a driving voltage signal terminal, and a third voltage terminal, respectively; and the first isolation node and the first node are the same node; or, the first isolation node and the first node are different nodes.

2. The shift register unit according to claim 1, wherein when the first isolation node and the first node are different nodes, the first isolation node and the first node are electrically connected through a first isolation circuit;

a control terminal of the first isolation circuit is electrically connected to the control voltage terminal.

3. The shift register unit according to claim 2, wherein the first isolation circuit may include a first isolation transistor; a control electrode of the first isolation transistor is electrically connected to the control voltage terminal, a first electrode of the first isolation transistor is electrically connected to the first isolation node, and a second electrode of the first isolation transistor is electrically connected to the first node.

4. The shift register unit according to claim 1, wherein the second isolation node and the second node are the same node.

5. The shift register unit according to claim 1, wherein the third isolation node and the third node are the same node.

6. The shift register unit according to claim 1, wherein
the driving voltage signal terminal is a light emitting control signal terminal, and the third voltage terminal is the first voltage terminal.

7. The shift register unit according to claim 1, wherein the first node potential adjustment circuit includes an adjustment transistor and an adjustment capacitor, wherein a control electrode of the adjustment transistor is electrically connected to the first isolation node, a first electrode of the adjustment transistor is electrically connected to the adjustment clock signal terminal, and a second electrode of the adjustment transistor is electrically connected to a first end of the adjustment capacitor, a second end of the adjustment capacitor is electrically connected to the first isolation node.

8. The shift register unit according to claim 1, wherein the second node control circuit is further electrically connected to the first clock signal terminal, and is configured to control the potential of the second isolation node under the control of the first clock signal.

9. The shift register unit according to claim 1, wherein the second node control circuit includes a first control transistor, a control capacitor, a second control transistor, and a third control transistor, wherein, a first end of the control capacitor is electrically connected to the third node, and a second end of the control capacitor is electrically connected to a fifth node, a control electrode of the first control transistor is electrically connected to the third node, a first electrode of the first control transistor is electrically connected to the fifth node, and a second electrode of the first control transistor is electrically connected to the control clock signal terminal;

a control electrode of the second control transistor is electrically connected to the second clock signal terminal, a first electrode of the second control transistor is electrically connected to the fifth node, and a second electrode of the second control transistor is electrically connected to the second isolation node;

a control electrode of the third control transistor is electrically connected to the first node, a first electrode of the third control transistor is electrically connected to the first voltage terminal, and a second electrode of the third control transistor is electrically connected to the second isolation node.

10. The shift register unit according to claim 8, wherein the second node control circuit includes a first control transistor, a control capacitor, a second control transistor, a third control transistor, and a node control transistor, a first end of the control capacitor is electrically connected to the third node, and a second end of the control capacitor is electrically connected to a fifth node;

a control electrode of the first control transistor is electrically connected to the third node, a first electrode of the first control transistor is electrically connected to the fifth node, and a second electrode of the first control transistor is electrically connected to the control clock signal terminal;

a control electrode of the second control transistor is electrically connected to the second clock signal terminal, a first electrode of the second control transistor is electrically connected to the fifth node, and a second electrode of the second control transistor is electrically connected to the second isolation node;

a control electrode of the third control transistor is electrically connected to the first node, and a first electrode of the third control transistor is electrically connected to the first voltage terminal;

a control electrode of the node control transistor is electrically connected to the first clock signal terminal, a first electrode of the node control transistor is electrically connected to the second electrode of the third control transistor, and a second electrode of the node control transistor is electrically connected to the second node.

11. The shift register unit according to claim 1, wherein the second node control circuit may include a first control transistor, a control capacitor, a second control transistor, and a third control transistor, a first end of the control capacitor is electrically connected to the third node;

a control electrode of the first control transistor is electrically connected to the third node, a first electrode of the first control transistor is electrically connected to a second end of the control capacitor, and a second electrode of the first control transistor is electrically connected to the second clock signal terminal;

a control electrode of the second control transistor is electrically connected to the second clock signal terminal, a first electrode of the second control transistor is electrically connected to the second isolation node;

a control electrode of the third control transistor is electrically connected to the first isolation node, a first electrode of the third control transistor is electrically connected to the first voltage terminal, and a second electrode of the third control transistor is electrically connected to the second isolation node.

12. The shift register unit according to claim 1, wherein the third node control circuit includes a fourth control transistor, a fifth control transistor, and a sixth control transistor, a control electrode of the fourth control transistor is electrically connected to the first clock signal terminal, a first electrode of the fourth control transistor is electrically connected to the second voltage terminal, and a second electrode of the fourth control transistor is electrically connected to the third isolation node;

a control electrode of the fifth control transistor is electrically connected to the first isolation node, a first electrode of the fifth control transistor is electrically connected to the first voltage terminal, and a second electrode of the fifth control transistor is electrically connected to the fourth node;

a control electrode of the sixth control transistor is electrically connected to the second clock signal terminal, a first electrode of the sixth control transistor is electrically connected to the fourth node, and a second electrode of the sixth control transistor is electrically connected to the third isolation node.

13. The shift register unit according to claim 12, further comprising a third isolation transistor; the third isolation node is the third node;

the second electrode of the fourth control transistor is electrically connected to the third node through the third isolation transistor;

a control electrode of the third isolation transistor is electrically connected to the control voltage terminal, a first electrode of the third isolation transistor is electrically connected to the second electrode of the fourth control transistor, and a second electrode of the third isolation transistor is electrically connected to the third node.

14. The shift register unit according to claim 1, wherein the driving voltage signal terminal is a light emitting control signal terminal, and the third voltage terminal is the first voltage terminal;

the third node control circuit includes a fourth control transistor, a fifth control transistor, and a sixth control transistor, a control electrode of the fourth control transistor is electrically connected to the second clock signal terminal, a first electrode of the fourth control transistor is electrically connected to the second voltage terminal, and a second electrode of the fourth control transistor is electrically connected to the third isolation node;

a control electrode of the fifth control transistor is electrically connected to the first isolation node, a first electrode of the fifth control transistor is electrically connected to the first voltage terminal, and a second electrode of the fifth control transistor is electrically connected to the fourth node;

a control electrode of the sixth control transistor is electrically connected to the first clock signal terminal, a first electrode of the sixth control transistor is electrically connected to the fourth node, and a second electrode of the sixth control transistor is electrically connected to the third isolation node.

15. The shift register unit according to claim 14, further comprising a third isolation transistor; wherein the third isolation node is the third node;

the second electrode of the fourth control transistor is electrically connected to the third node through the third isolation transistor;

a control electrode of the third isolation transistor is electrically connected to the control voltage terminal, a first electrode of the third isolation transistor is electrically connected to the second electrode of the fourth control transistor, and a second electrode of the third isolation transistor is electrically connected to the third node.

16. The shift register unit according to claim 1, wherein the first node control circuit includes a seventh control transistor and an eighth control transistor, a control electrode of the seventh control transistor is electrically connected to the first clock signal terminal, a first electrode of the seventh control transistor is electrically connected to the input terminal, and a second electrode of the seventh control transistor is electrically connected to the first isolation node;

a control electrode of the eighth control transistor is electrically connected to the fourth node, a first electrode of the eighth control transistor is electrically connected to the first isolation node, and a second electrode of the eighth control transistor is electrically connected to the first voltage terminal.

17. The shift register unit according to claim 1, wherein the output circuit includes a first output transistor and a second output transistor;

a control electrode of the first output transistor is electrically connected to the first node, a first electrode of the first output transistor is electrically connected to the second voltage terminal, and a second electrode of the first output transistor is electrically connected to the driving voltage signal terminal;

a control electrode of the second output transistor is electrically connected to the second node, a first electrode of the second output transistor is electrically connected to the driving voltage signal terminal, and a second electrode of the second output transistor is electrically connected to the third voltage terminal.

18. The shift register unit according to claim 1, wherein the first tank circuit includes a first storage capacitor, and the second tank circuit includes a second storage capacitor;

a first end of the first storage capacitor is electrically connected to the first node, and a second end of the first storage capacitor is electrically connected to the second voltage end;

a first end of the second storage capacitor is electrically connected to the second node, and a second end of the second storage capacitor is electrically connected to the third voltage end, the driving voltage signal terminal is a gate driving signal output terminal, and the third voltage terminal is an output clock signal terminal; an output clock signal provided by the output clock signal terminal is a clock signal that is inverted from the second clock signal; or the driving voltage signal terminal is a light emitting control signal terminal, and the third voltage terminal is the first voltage terminal.

19. The shift register unit according to claim 1, wherein the control clock signal terminal is the second clock signal terminal; or the driving voltage signal terminal is a light emitting control signal terminal, and the control clock signal terminal is the first clock signal terminal.

* * * * *